(12) United States Patent
Manning

(10) Patent No.: US 6,279,090 B1
(45) Date of Patent: Aug. 21, 2001

(54) METHOD AND APPARATUS FOR RESYNCHRONIZING A PLURALITY OF CLOCK SIGNALS USED IN LATCHING RESPECTIVE DIGITAL SIGNALS APPLIED TO A PACKETIZED MEMORY DEVICE

(75) Inventor: Troy A. Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/146,716

(22) Filed: Sep. 3, 1998

(51) Int. Cl.$^7$ ............................................. G06F 12/00

(52) U.S. Cl. ..................... 711/167; 711/105; 711/109; 713/400

(58) Field of Search .................... 711/167, 105, 711/109, 114, 150; 713/400; 326/93, 96, 99; 375/354

(56) References Cited

U.S. PATENT DOCUMENTS

| | | |
|---|---|---|
| 3,633,174 | 1/1972 | Griffin . |
| 4,077,016 | 2/1978 | Sanders et al. . |

(List continued on next page.)

FOREIGN PATENT DOCUMENTS

| | | |
|---|---|---|
| 0 295 515 A1 | 12/1988 | (EP) . |
| 0 406 786 A1 | 1/1991 | (EP) . |
| 0 450 871 A2 | 10/1991 | (EP) . |
| 0 476 585 A3 | 3/1992 | (EP) . |
| 0 655 741 A2 | 5/1995 | (EP) . |
| 0 655 834 A1 | 5/1995 | (EP) . |
| 0 680 049 A2 | 11/1995 | (EP) . |
| 0 703 663 A1 | 3/1996 | (EP) . |

(List continued on next page.)

OTHER PUBLICATIONS

Alvarez, J. et al. "A Wide–Bandwidth Low Voltage PLL for PowerPC™ Microprocessors" IEEE IEICE Trans. Electron., vol. E–78. No. 6, Jun. 1995, pp. 631–639.

(List continued on next page.)

Primary Examiner—Matthew Kim
Assistant Examiner—Matt Anderson
(74) Attorney, Agent, or Firm—Dorsey & Whitney LLP

(57) ABSTRACT

A system adaptively adjusts the phases of a plurality of internal clock signals, each respective internal clock signal causing a corresponding latch to store a digital signal responsive to the respective internal clock signal. The system includes a plurality of clock control circuits, each clock control circuit controlling the phase of a respective internal clock signal relative to a corresponding external clock signal responsive to a respective phase command signal. A plurality of evaluation circuits are coupled to the respective latches, each comparing the plurality of digital signals stored in the corresponding latch to expected values and generating a result signal indicating the results of this comparison. A phase selector circuit operates in a storage mode to sequentially develop a plurality of phase command signals on an output and store a corresponding result signal sequentially received on an input. The phase selector operates in an analysis mode to develop on the output a final phase command signal from the stored result signals. A plurality of storage circuits are coupled to respective clock control circuits and to the output of a selector circuit. Each storage circuit stores the final phase command signal responsive to a corresponding clock domain signal. A clock-domain control circuit develops a plurality of clock domain signals to control the evaluation, storage, and phase selector circuits to sequentially synchronize each internal clock signal. The clock-domain control circuit operates to perform partial synchronization of the clock signals after all clock signals have once been synchronized during a power-up submode of operation.

55 Claims, 23 Drawing Sheets

U.S. PATENT DOCUMENTS

| | | |
|---|---|---|
| 4,096,402 | 6/1978 | Schroeder et al. . |
| 4,404,474 | 9/1983 | Dingwall . |
| 4,481,625 | 11/1984 | Roberts et al. . |
| 4,508,983 | 4/1985 | Allgood et al. . |
| 4,511,846 | 4/1985 | Nagy et al. . |
| 4,514,647 | 4/1985 | Shoji . |
| 4,524,448 | 6/1985 | Hullwegen . |
| 4,573,017 | 2/1986 | Levine . |
| 4,600,895 | 7/1986 | Landsman . |
| 4,603,320 | 7/1986 | Farago . |
| 4,638,187 | 1/1987 | Boler et al. . |
| 4,638,451 | 1/1987 | Hester et al. . |
| 4,687,951 | 8/1987 | McElroy . |
| 4,773,085 | 9/1988 | Cordell . |
| 4,789,796 | 12/1988 | Foss . |
| 4,818,995 | 4/1989 | Takahashi et al. . |
| 4,893,087 | 1/1990 | Davis . |
| 4,902,986 | 2/1990 | Lesmeister . |
| 4,958,088 | 9/1990 | Farah-Bakhsh et al. . |
| 4,972,470 | 11/1990 | Farago . |
| 4,984,204 | 1/1991 | Sato et al. . |
| 5,020,023 | 5/1991 | Smith . |
| 5,038,115 | 8/1991 | Myers et al. . |
| 5,075,569 | 12/1991 | Branson . |
| 5,086,500 | 2/1992 | Greub . |
| 5,087,828 | 2/1992 | Sato et al. . |
| 5,122,690 | 6/1992 | Bianchi . |
| 5,125,560 | 6/1992 | Chern et al. . |
| 5,128,563 | 7/1992 | Hush et al. . |
| 5,134,311 | 7/1992 | Biber et al. . |
| 5,150,186 | 9/1992 | Pinney et al. . |
| 5,165,046 | 11/1992 | Hesson . |
| 5,179,298 | 1/1993 | Hirano et al. . |
| 5,194,765 | 3/1993 | Dunlop et al. . |
| 5,212,601 | 5/1993 | Wilson . |
| 5,220,208 | 6/1993 | Schenck . |
| 5,233,314 | 8/1993 | McDermott et al. . |
| 5,233,564 | 8/1993 | Ohshima et al. . |
| 5,239,206 | 8/1993 | Yanai . |
| 5,243,703 | 9/1993 | Farmwald et al. . |
| 5,254,883 | 10/1993 | Horowitz et al. . |
| 5,256,989 | 10/1993 | Parker et al. . |
| 5,257,294 | 10/1993 | Pinto et al. . |
| 5,268,639 | 12/1993 | Gasbarro et al. . |
| 5,272,729 | 12/1993 | Bechade et al. . |
| 5,274,276 | 12/1993 | Casper et al. . |
| 5,276,642 | 1/1994 | Lee . |
| 5,278,460 | 1/1994 | Casper . |
| 5,281,865 | 1/1994 | Yamashita et al. . |
| 5,283,631 | 2/1994 | Koerner et al. . |
| 5,289,580 | 2/1994 | Latif et al. . |
| 5,295,164 | 3/1994 | Yamamura . |
| 5,304,952 | 4/1994 | Quiet et al. . |
| 5,311,481 | 5/1994 | Casper et al. . |
| 5,311,483 | 5/1994 | Takasugi . |
| 5,313,431 | 5/1994 | Uruma et al. . |
| 5,315,388 | 5/1994 | Shen et al. . |
| 5,321,368 | 6/1994 | Hoelzle . |
| 5,337,285 | 8/1994 | Ware et al. . |
| 5,341,405 | 8/1994 | Mallard, Jr. . |
| 5,347,177 | 9/1994 | Lipp . |
| 5,347,179 | 9/1994 | Casper et al. . |
| 5,355,391 | 10/1994 | Horowitz et al. . |
| 5,361,002 | 11/1994 | Casper . |
| 5,367,649 | 11/1994 | Cedar . |
| 5,379,299 | 1/1995 | Schwartz . |
| 5,390,308 | 2/1995 | Ware et al. . |
| 5,400,283 | 3/1995 | Raad . |
| 5,408,640 | 4/1995 | MacIntyre et al. . |
| 5,410,263 | 4/1995 | Waizman . |
| 5,416,436 | 5/1995 | Rainard . |
| 5,416,909 | 5/1995 | Long et al. . |
| 5,420,544 | 5/1995 | Ishibashi . |
| 5,428,311 | 6/1995 | McClure . |
| 5,428,317 | 6/1995 | Sanchez et al. . |
| 5,430,408 | 7/1995 | Ovens et al. . |
| 5,430,676 | 7/1995 | Ware et al. . |
| 5,432,823 | 7/1995 | Gasbarro et al. . |
| 5,438,545 | 8/1995 | Sim . |
| 5,440,260 | 8/1995 | Hayashi et al. . |
| 5,440,514 | 8/1995 | Flannagan et al. . |
| 5,444,667 | 8/1995 | Obara . |
| 5,446,696 | 8/1995 | Ware et al. . |
| 5,448,193 | 9/1995 | Baumert et al. . |
| 5,451,898 | 9/1995 | Johnson . |
| 5,457,407 | 10/1995 | Shu et al. . |
| 5,465,076 | 11/1995 | Yamauchi et al. . |
| 5,473,274 | 12/1995 | Reilly et al. . |
| 5,473,575 | 12/1995 | Farmwald et al. . |
| 5,473,639 | 12/1995 | Lee et al. . |
| 5,485,490 | 1/1996 | Leung et al. . |
| 5,488,321 | 1/1996 | Johnson . |
| 5,489,864 | 2/1996 | Ashuri . |
| 5,497,127 | 3/1996 | Sauer . |
| 5,498,990 | 3/1996 | Leung et al. . |
| 5,500,808 | 3/1996 | Wang . |
| 5,506,814 | 4/1996 | Hush et al. . |
| 5,508,638 | 4/1996 | Cowles et al. . |
| 5,513,327 | 4/1996 | Farmwald et al. . |
| 5,532,714 | 7/1996 | Knapp et al. . |
| 5,539,345 | 7/1996 | Hawkins . |
| 5,544,124 | 8/1996 | Zagar et al. . |
| 5,544,203 | 8/1996 | Casasanta et al. . |
| 5,552,727 | 9/1996 | Nakao . |
| 5,555,429 | 9/1996 | Parkinson et al. . |
| 5,557,224 | 9/1996 | Wright et al. . |
| 5,557,781 | 9/1996 | Stones et al. . |
| 5,563,546 | 10/1996 | Tsukada . |
| 5,568,075 | 10/1996 | Curran et al. . |
| 5,568,077 | 10/1996 | Sato et al. . |
| 5,572,557 | 11/1996 | Aoki . |
| 5,572,722 | 11/1996 | Vogley . |
| 5,574,698 | 11/1996 | Raad . |
| 5,576,645 | 11/1996 | Farwell . |
| 5,577,236 | 11/1996 | Johnson et al. . |
| 5,578,940 | 11/1996 | Dillon et al. . |
| 5,578,941 | 11/1996 | Sher et al. . |
| 5,579,326 | 11/1996 | McClure . |
| 5,581,197 | 12/1996 | Motley et al. . |
| 5,589,788 | 12/1996 | Goto . |
| 5,590,073 | 12/1996 | Arakawa et al. . |
| 5,594,690 | 1/1997 | Rothenberger et al. . |
| 5,614,855 | 3/1997 | Lee et al. . |
| 5,619,473 | 4/1997 | Hotta . |
| 5,621,340 | 4/1997 | Lee et al. . |
| 5,621,690 | 4/1997 | Jungroth et al. . |
| 5,621,739 | 4/1997 | Sine et al. . |
| 5,627,780 | 5/1997 | Malhi . |
| 5,627,791 | 5/1997 | Wright et al. . |
| 5,631,872 | 5/1997 | Naritake et al. . |
| 5,636,163 | 6/1997 | Furutani et al. . |
| 5,636,173 | 6/1997 | Schaefer . |
| 5,636,174 | 6/1997 | Rao . |
| 5,638,335 | 6/1997 | Akiyama et al. . |
| 5,646,904 | 7/1997 | Ohno et al. . |
| 5,657,289 | 8/1997 | Hush et al. . |
| 5,657,481 | 8/1997 | Farmwald et al. . |
| 5,663,921 | 9/1997 | Pascucci et al. . |
| 5,666,322 | 9/1997 | Conkle . |
| 5,668,763 | 9/1997 | Fujioka et al. . |
| 5,668,774 | 9/1997 | Furutani . |

| | | |
|---|---|---|
| 5,675,274 | 10/1997 | Kobayashi et al. . |
| 5,692,165 | 11/1997 | Jeddeloh et al. . |
| 5,694,065 | 12/1997 | Hamasaki et al. . |
| 5,708,611 | 1/1998 | Iwamoto . |
| 5,712,580 | 1/1998 | Baumgartner et al. . |
| 5,719,508 | 2/1998 | Daly . |
| 5,740,123 | 4/1998 | Uchida . |
| 5,751,665 | 5/1998 | Tanoi . |
| 5,767,715 | 6/1998 | Marquis et al. . |
| 5,768,177 | 6/1998 | Sakuragi . |
| 5,778,214 | 7/1998 | Taya et al. . |
| 5,781,499 | 7/1998 | Koshikawa . |
| 5,789,947 | 8/1998 | Sato . |
| 5,805,931 | 9/1998 | Morzano et al. . |
| 5,812,619 | 9/1998 | Runaldue . |
| 5,822,314 | 10/1998 | Chater-Lea . |
| 5,831,929 | 11/1998 | Manning . |
| 5,841,707 | 11/1998 | Cline et al. . |
| 5,852,378 | 12/1998 | Keeth . |
| 5,872,959 | 2/1999 | Nguyen . |
| 5,889,829 | 3/1999 | Chiao et al. . |
| 5,917,760 | 6/1999 | Millar . |
| 5,920,518 | 7/1999 | Harrison et al. . |
| 5,926,047 | 7/1999 | Harrison . |
| 5,926,436 | 7/1999 | Toda et al. . |
| 5,940,608 | 8/1999 | Manning . |
| 5,940,609 | 8/1999 | Harrison . |
| 5,946,244 | 8/1999 | Manning . |
| 5,953,284 | 9/1999 | Baker et al. . |
| 5,964,884 | 10/1999 | Partovi et al. . |
| 5,990,719 | 11/1999 | Dai et al. . |
| 6,005,823 | 12/1999 | Martin et al. . |
| 6,011,732 | 1/2000 | Harrison et al. . |
| 6,016,282 | 1/2000 | Keeth . |
| 6,026,050 | 2/2000 | Baker et al. . |
| 6,029,250 | 2/2000 | Keeth . |
| 6,101,197 | 8/1999 | Keeth et al. . |

FOREIGN PATENT DOCUMENTS

| | | |
|---|---|---|
| 0 704 848 A3 | 4/1996 | (EP) . |
| 0 704 975 A1 | 4/1996 | (EP) . |
| 0 767 538 A1 | 4/1997 | (EP) . |
| 6-1237512 | 10/1986 | (JP) . |
| 2-112317 | 4/1990 | (JP) . |
| 4-135311 | 5/1992 | (JP) . |
| 5-136664 | 6/1993 | (JP) . |
| 5-282868 | 10/1993 | (JP) . |
| 0-7319577 | 12/1995 | (JP) . |
| WO 94/29871 | 12/1994 | (WO) . |
| WO 95/22200 | 8/1995 | (WO) . |
| WO 95/22206 | 8/1995 | (WO) . |
| WO 96/10866 | 4/1996 | (WO) . |
| WO 97/14289 | 4/1997 | (WO) . |
| WO 97/42557 | 11/1997 | (WO) . |

OTHER PUBLICATIONS

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x 1K Time Memory LSI with 1–ns/b Resolution", IEEE Journal of Solid–State Circuits, vol. 27, No. 3, M, 8107 Mar., 1992, No. 3, New York, US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Aviram, A. et al., "Obtaining High Speed Printing on Thermal Sensitive Special Paper with a Resistive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Perfomance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Descriptive literature entitled, "400MHz SLDRAM, 4M X 16 SLDRAM Pipelined, Eight Bank, 2.5 V Operation," SLDRAM Consortium Advance Sheet, published throughout the United States, pp. 1–22, Jul. 1998.

Donnelly, K. et al., "A 660 MB/s Interface Megacell Portable Circuit in 0.3 βm–0.7 CMOS ASIC", IEEE Journal of Solid–State Circuits, vol. 31, No. 12, Dec. 1996, pp. 1995–2001.

"Draft Standard for a High–Speed Memory Interface (SyncLink)", Microprocessors and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50– to 350–MHz Oscillating Range for Video Signal Processors", IEICE Trans. Electron., vol. E77–C, No. 12, Dec. 1994, pp. 1951–1956.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6βm CMOS SOG", IEEE Custom Integrated Circuits Conference, 1992, pp. 27.6.1–27.6.4.

Kim, B. et al., "A 30MHz High–Speed Analog/Digital PLL in 2βm CMOS", ISSCC, Feb. 1990.

Kikuchi, S. et al., "A Gate–Array–Based 666MHz VLSI Test System", IEEE International Test Conference, Paper 21.1., 1995, pp. 451–458.

Ko, U. et al., "A 30–ps Jitter, 3.6–βs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densley Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 615–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffering Using a Frequency– and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron. vol.E–79–C. No. 7, Jul. 1996, pp.898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

Gustavson, David B., et al., IEEE Standard for Scalable Coherent Interface (SCI), IEEE Computer Society, IEEE Std. 1596–1992, Aug 2, 1993.

METHOD AND APPARATUS FOR RESYNCHRONIZING A PLURALITY OF CLOCK SIGNALS USED IN LATCHING RESPECTIVE DIGITAL SIGNALS APPLIED TO A PACKETIZED MEMORY DEVICE

TECHNICAL FIELD

The present invention relates generally to integrated circuit devices, and more particularly to a system and process for detecting an initialization mode of a packetized memory device and thereafter controlling the packetized memory device to synchronize a plurality of external clock signals applied to the device.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium II® microprocessors are currently available that operate at clock speeds of at least 400 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 300 MHz clock frequency may be mounted on a mother board having a 66 MHz clock frequency for controlling the system memory devices and other components.

Access to system memory is a frequent operation for the processor. The time required for the processor, operating, for example, at 300 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access.

More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as a synchronous link architecture. In the synchronous link architecture, the system memory may be coupled to the processor either directly through the processor bus or through a memory controller. Rather than requiring that separate address and control signals be provided to the system memory, synchronous link memory devices receive command packets that include both control and address information. The synchronous link memory device then outputs or receives data on a data bus that may be coupled directly to the data bus portion of the processor bus.

An example of a computer system 10 using the synchronous link architecture is shown in FIG. 1. The computer system 10 includes a processor 12 having a processor bus 14 coupled through a memory controller 18 and system memory bus 23 to three packetized or synchronous link dynamic random access memory ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 sends a data transfer command via the processor bus 14 to the memory controller 18, which, in turn, communicates with the memory devices 16a–c via the system memory bus 23 by sending the memory devices 16a–c command packets that contain both control and address information. Data is coupled between the memory controller 18 and the memory devices 16a–c through a data bus portion of the system memory bus 23. During a read operation, data is transferred from the SLDRAMs 16a–c over the memory bus 23 to the memory controller 18 which, in turn, transfers the data over the processor 14 to the processor 12. The processor 12 transfers write data over the processor bus 14 to the memory controller 18 which, in turn, transfers the write data over the system memory bus 23 to the SLDRAMs 16a–c. Although all the memory devices 16a–c are coupled to the same conductors of the system memory bus 23, only one memory device 16a–c at a time reads or writes data, thus avoiding bus contention on the memory bus 23. Bus contention is avoided by each of the memory devices 16a–c on the system memory 22 having a unique identifier, and the command packet contains an identifying code that selects only one of these components.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

A typical command packet CA<0:39> for an SLDRAM is shown in FIG. 2 and is formed by 4 packet words CA<0:9>, each of which contains 10 bits of data. As will be explained in more detail below, each packet word CA<0:9> is applied on a command address bus CA including 10 lines CA0–CA9. In FIG. 2, the four packet words CA<0:9> comprising a command packet CA<0:39> are designated PW1–PW4. The first packet word $PW_1$ contains 7 bits of data identifying the packetized DRAM 16a–c that is the intended recipient of the command packet. As explained below, each of the packetized DRAMs is provided with a unique ID code that is compared to the 7 ID bits in the first packet word $PW_1$. Thus, although all of the packetized DRAMs 16a–c will receive the command packet, only the packetized DRAM 16a–c having an ID code that matches the 7 ID bits of the first packet word $PW_1$ will respond to the command packet.

The remaining 3 bits of the first packet word $PW_1$ as well as 3 bits of the second packet word $PW_2$ comprise a 6 bit command. Typical commands are read and write in a variety of modes, such as accesses to pages or banks of memory cells. The remaining 7 bits of the second packet word $PW_2$ and portions of the third and fourth packet words $PW_3$ and $PW_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address. Although the command packet shown in FIG. 2 is composed of 4 packet words PW1–PW4 each containing up to 10 bits, it will be understood that a command packet may contain a lesser or greater number of packet words, and each packet word may contain a lesser or greater number of bits.

The memory device 16a is shown in block diagram form in FIG. 3. Each of the memory devices 16a–c includes a clock generator circuit 40 that receives a command clock signal CCLK and generates a large number of other clock and timing signals to control the timing of various operations in the memory device 16a. The memory device 16a also includes a command buffer 46 and an address capture circuit 48 which receive an internal clock signal ICLK, a command packet CA<0:9> on a 10 bit command-address bus CA, and a terminal 52 receiving a FLAG signal. A memory controller (not shown) or other device normally transmits the command packet CA<0:9> to the memory device 16a in synchronism with the command clock signal CCLK. As explained above, the command packet, which generally includes four 10-bit packet words PW1–PW4, contains control and address information for each memory transfer. The FLAG signal identifies the start of a command packet, and also signals the start of an initialization sequence. The command buffer 46 receives the command packet from the command-address bus CA, and compares at least a portion of the command packet to identifying data from an ID register 56 to determine if the command packet is directed to the memory device 16a or some other memory device 16b, c. If the command buffer 46 determines that the command is directed to the memory device 16a, it then provides the command to a command decoder and sequencer 60. The command decoder and sequencer 60 generates a large number of internal control signals to control the operation of the memory device 16a during a memory transfer.

The address capture circuit 48 also receives the command packet from the command-address bus CA and outputs a 20-bit address corresponding to the address information in the command packet. The address is provided to an address sequencer 64, which generates a corresponding 3-bit bank address on bus 66, a 10-bit row address on bus 68, and a 7-bit column address on bus 70. The row and column addresses are processed by row and column address paths, as will be described in more detail below.

One of the problems of conventional DRAMs is their relatively low speed resulting from the time required to precharge and equilibrate circuitry in the DRAM array. The SLDRAM 16a shown in FIG. 3 largely avoids this problem by using a plurality of memory banks 80, in this case eight memory banks 80a–h. After a read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied to a column latch/decoder 100, which supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 that stores data from the I/O gating circuit 102.

In the memory device 16a shown in FIG. 3, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked into the read FIFO buffer 124 by a clock signal RCLK generated from the internal clock signal ICLK. The 16-bit data words are then clocked out of the read FIFO buffer 124 by a clock signal obtained by coupling the RCLK signal through a programmable delay circuit 126. The programmable delay circuit 126 is programmed during initialization of the memory device 16a so that the data from the memory device is received by a memory controller, processor, or other device (not shown in FIG. 3) at the proper time. The FIFO buffer 124 sequentially applies the 16-bit data words to a driver circuit 128 which, in turn, applies the 16-bit data words to a data bus DQ forming part of the processor bus 14 (see FIG. 1). The driver circuit 128 also applies one of two data clock signals DCLK0 and DCLK1 to respective data clock lines 132 and 133. The data clocks DCLK0 and DCLK1 enable a device, such as the processor 12, reading the data on the data bus DQ to be synchronized with the data. Particular bits in the command portion of the command packet CA0–CA9 determine which of the two data clocks DCLK0 and DCLK1 is applied by the driver circuit 128. It should be noted that the data clocks DCLK0 and DCLK1 are differential clock signals, each including true and complementary signals, but for ease of explanation, only one signal for each clock is illustrated and described.

The write data path 112 includes a receiver buffer 140 coupled to the data bus 130. The receiver buffer 140 sequentially applies 16-bit data words from the data bus DQ to four input registers 142, each of which is selectively enabled by a signal from a clock generator circuit 144. The clock generator circuit 144 generates these enable signals responsive to the selected one of the data clock signals DCLK0 and DCLK1. The memory controller or processor determines which data clock DCLK0 or DCLK1 will be utilized during a write operation using the command portion of a command packet applied to the memory device 16a. As with the command clock signal CCLK and command packet, the memory controller or other device (not shown) normally transmits the data to the memory device 16a in synchronism with the selected one of the data clock signals DCLK0 and DCLK1. The clock generator 144 is programmed during initialization to adjust the timing of the clock signal applied to the input registers 142 relative to the selected one of the data clock signals DCLK0 and DCLK1 so that the input registers 142 can capture the write data at the proper times. In response to the selected data clock DCLK0 or DCLK1, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

As mentioned above, an important goal of the synchronous link architecture is to allow data transfer between a processor and a memory device to occur at a significantly faster rate. However, as the rate of data transfer increases, it becomes more difficult to maintain synchronization between signals transmitted to the memory device 16a. For example, as mentioned above, the command packet CA<0:39> is normally transmitted to the memory device 16a in synchronism with the command clock signal CCLK, and the data is normally transmitted to the memory device 16a in synchronism with the selected one of the data clock signals DCLK0 and DCLK1. However, because of unequal signal delays and other factors, the command packet CA<0:39> may not arrive at the memory device 16a in synchronism with the command clock signal CCLK, and the data may not arrive at the memory device 16a in synchronism with the selected data clock signal DCLK0 or DCLK1. Moreover, even if these signals are actually coupled to the memory device 16a in synchronism with each other, they may loose synchronism once they are coupled to circuits within the memory device. For example, internal signals require time to propagate to various circuitry in the memory device 16a, differences in the lengths of signal routes can cause differences in the times at which signals reach the circuitry, and differences in capacitive loading of signal lines can also cause differences in the times at which signals reach the circuitry. These differences in arrival times can become significant at high speeds of operation and eventually limit the operating speed of memory devices.

The problems associated with varying arrival times are exacerbated as timing tolerances become more restricted with higher data transfer rates. For example, if the internal clock ICLK derived from the command clock CCLK does not latch each of the packet words CA<0:9> comprising a command packet CA<0:39> at the proper time, errors in the operation of the memory device may result. Similarly, data errors may result if internal signals developed responsive to the data clocks DCLK0 and DCLK1 do not latch data applied on the data bus DQ at the proper time. Moreover, even if these respective clocks are initially synchronized, this synchronism may be lost over time during normal operation of the SLDRAM 16a. Loss in synchronism may result from a variety of factors, including temperature variations in the environment in which the SLDRAM 16a is operating, variations in the supply voltage applied to the SLDRAM, or drift in operating parameters of components within the SLDRAM. Thus, the command clock CCLK and data clocks DCLK0 and DCLK1 must occasionally be resynchronized to ensure synchronism is maintained.

One skilled in the art will understand that when synchronization of the clock signals CCLK, DCLK0, and DCLK1 is discussed, this means the adjusting of the timing of respective internal clock signals derived from these respective external clock signals so the internal clock signals can be used to latch corresponding digital signals at optimum times. For example, the command clock signal CCLK is synchronized when the timing of the internal clock signal ICLK relative to the command clock signal CCLK causes packet words CA<0:9> to be latched at the optimum time.

To synchronize the clock signals CCLK, DCLK0, and DCLK1, the memory controller 18 (FIG. 1) places the memory device 16 in a synchronization mode by applying a 15 bit repeating pseudo-random bit pattern on each line of the command-address bus CA, data bus DQ, and on the FLAG line 52. One 15-bit pseudo-random bit pattern that may be utilized is "111101011001000." As understood by one skilled in the art, such a pseudo-random bit pattern functions as a data pattern and also simulates unwanted noise on the lines of busses CA and DQ and on the FLAG line. The SLDRAM 16a must be synchronized to correctly capture this data pattern notwithstanding the presence of such simulated noise. Synchronization circuitry within the memory device 16a (not shown in FIG. 3) must detect this applied pseudo-random bit pattern, place the device in the synchronization mode, and thereafter generate the necessary control signals to control components within the memory device to synchronize the clock signals CCLK, DCLK0, and DCLK1.

There is a need for maintaining synchronism between clock signals and the associated digital signals being latched responsive to such clock signals during normal operation of an SLDRAM. Moreover, although the foregoing discussion is directed to synchronizing clock signals in packetized memory devices like SLDRAMs, similar problems exist in other types of integrated circuits as well, including other types of memory devices.

SUMMARY OF THE INVENTION

According to one aspect of the present invention a packet of digital signals are stored in a packetized memory device or other integrated circuit. The packet corresponds to a plurality of digital signals applied sequentially as a plurality of packet words to the packetized memory device during a normal and a synchronization mode of operation of the memory device. A plurality of packet words sequentially applied to the memory device are stored responsive to an internal clock signal. A plurality of digital control signals sequentially applied coincident with each packet word in response to the internal clock signal are stored by serially shifting the stored digital control signals through a plurality of storage locations. The applied digital control signal is shifted into a first storage location while shifting each previously stored digital control signal to the next higher storage location.

A first predetermined condition of the stored values of the digital control signal is detected, and the packetized memory device is placed in the normal mode of operation upon detection of the first predetermined condition. The stored packet words are shifted to a new storage location responsive to the values of the digital control signal stored in predetermined ones of the storage locations to thereby store a packet in the new storage location. A second predetermined condition of the stored values of the digital control signal is also detected. The packetized memory device is placed in a synchronization mode of operation upon detection of the second predetermined condition. A synchronization clocking signal is generated in response to the internal clock signal during the synchronization mode of operation, and the stored packet words are shifted to the new storage location responsive the synchronized clocking signal to thereby store a packet in the new storage location during the synchronization mode of operation.

According to another aspect of the present invention a synchronization mode of a packetized memory device is detected and packets of digital signals applied to the memory device stored as described above to synchronize a plurality of internal clock signals developed in response to respective external clock signals applied to the memory device. A computer system as well as other types of systems may include such packetized memory devices.

BRIEF DESCRIPTION OF THE DRAWINGS

FIGS. 8, 8A, and 8B are a schematic of the initialization detector of FIG. 5.

DETAILED DESCRIPTION OF THE INVENTION

Figure 3:
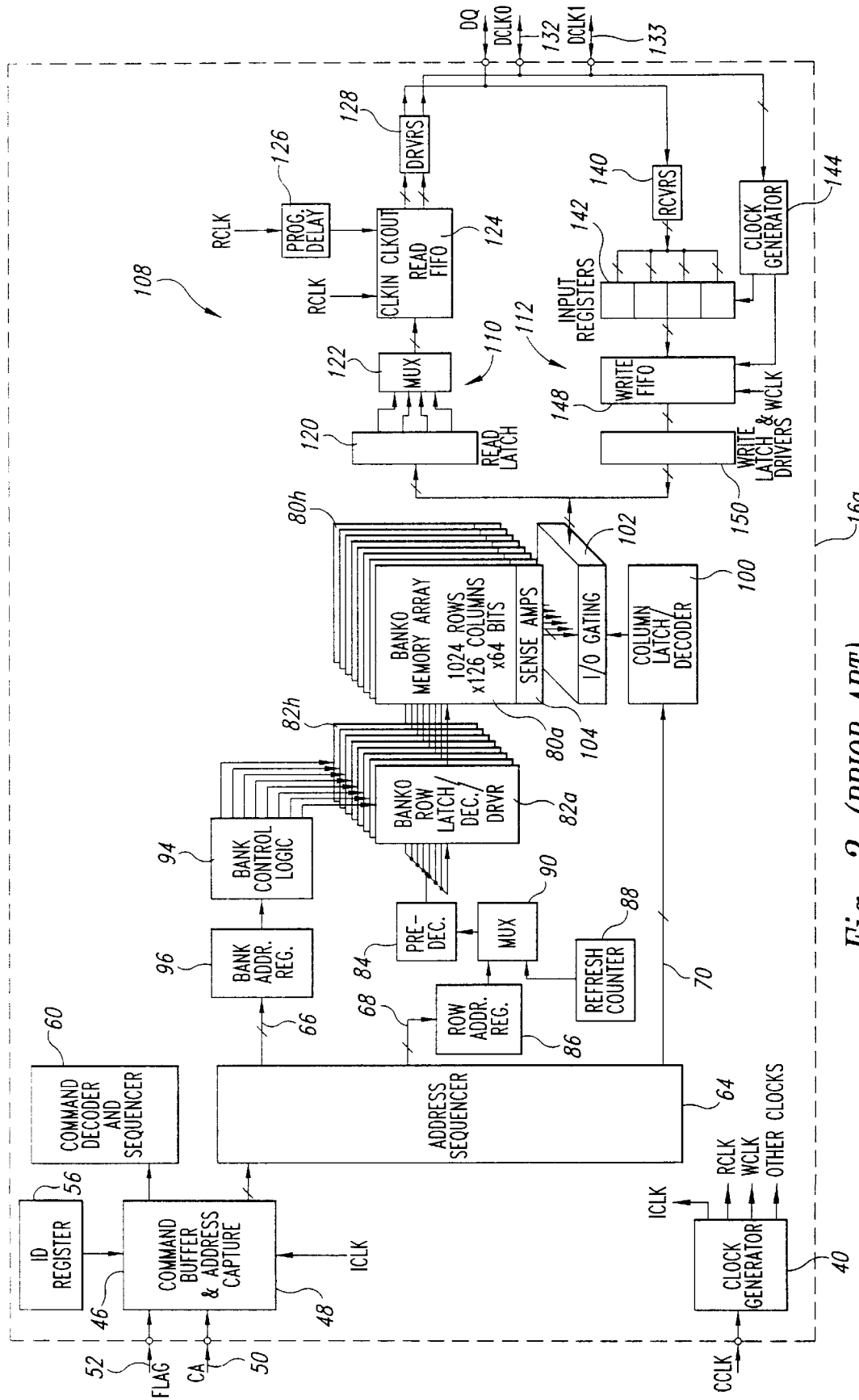
FIG. 3 is a block diagram of a conventional packetized DRAM used in the computer system of FIG. 1.
Figure 4:
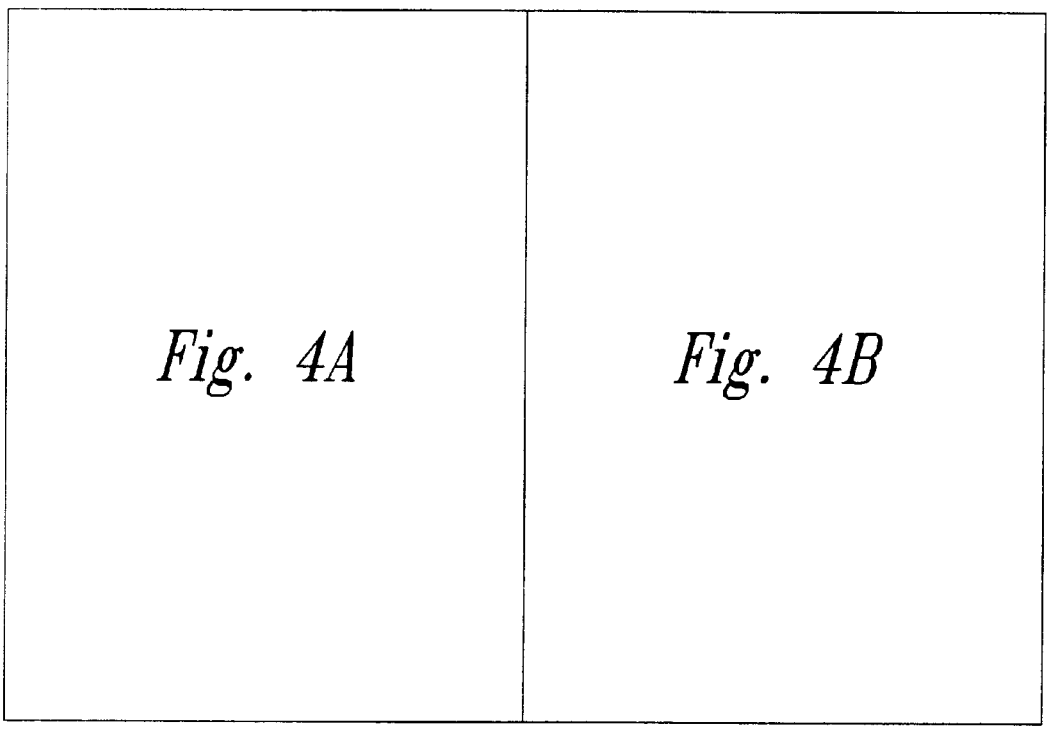
FIGS. 4, 4A, and 4B are block diagram of a partial resynchronization circuit usable in each of the SLDRAMs of FIG. 3 according to one embodiment of the present invention.

FIG. 4 is a schematic block diagram of a partial resynchronization circuit 410 according to one embodiment of the present invention. Typically, the partial resynchronization circuit 410 is contained in the command buffer 46 and the clock generation circuit 40 of the SLDRAM 16a and synchronizes external clock signals CCLK, DCLK0, and DCLK1 during an initialization mode of the SLDRAM 16a, as will be explained in more detail below. Components and signals that were previously described with reference to FIG. 3 have been given the same designations in FIG. 4, and will not be described in further detail.

The partial resynchronization circuit 410 includes three variable-phase clock generation circuits 418, 419, and 423, (FIG. 4B) that generate internal clock signals ICLK, IDCLK0, and IDCLK1, respectively. The clock generation circuit 418, which is part of the clock generation circuit 40 of FIG. 3, generates the internal command clock signal ICLK in response to the command clock signal CCLK. The phase of the internal command clock signal ICLK relative to the command clock signal CCLK is controlled by a phase command CCMDPH<0:3> applied to the clock generation circuit 418. Similarly, the clock generation circuit 419 generates the internal data clock signal IDCLK0 having a phase relative to the data clock signal DCLK0 that is determined by a phase command D0CMDPH<0:3>, and the clock generation circuit 423 generates the clock signal IDCLK1 having a phase relative to the clock signal DCLK1 that is determined by a phase command D1CMDPH<0:3>. During the initialization procedure, the resynchronization circuit 410 determines the optimum values for the phase commands CCMDPH<0:3>, D0CMDPH<0:3>, and D1CMDPH<0:3>, as will be explained in more detail below.

The partial resynchronization circuit 410 further includes command packet circuitry 411 (FIG. 4A) comprising a shift register 412 receiving command packets CA<0:39> applied on the command-address bus CA. The width of the command-address bus CA corresponds to the width of the shift register 412, and the number of packet words CA<0:9> in the command packet CA<0:39> is an integer multiple of the number of stages of the shift register 412. In the embodiment of FIG. 4, the shift register 412 has two stages, each of which is 10 bits wide. Thus, the shift register 412 sequentially receives two 10-bit packet words CA<0:9> and outputs these two words as a 20-bit partial command word C<0:19>. Each packet word CA<0:9> applied on the command-address bus CA is shifted into the shift register 412, and from the first to second stage responsive to each transition of the internal clock signal ICLK. In this way, the shift register 412 sequentially latches and outputs the partial command word C<0:19> corresponding to the first two packet words CA<0:9> of a command packet CA<0:39>, and thereafter sequentially latches and outputs the partial command word C<0:19> corresponding to the third and fourth packet words of the command packet.

A synchronization control circuit 416 latches the FLAG signal applied on the flag line 52 coincident with each packet word CA<0:9>. Coincident with the start of each command packet CA<0:39> during normal operation of the memory device 16a, the FLAG signal transitions high for one-half of the period of the internal clock signal ICLK. The control circuit 416 includes an eight-stage shift register (not shown in FIG. 4A) that shifts the high FLAG signal through each of these eight stages responsive to each transition of the ICLK signal. The control circuit 416 outputs the latched FLAG bits as two four-bit FLAG words, F<0:3> and F<4:7>. During normal operation, the control circuit 416 utilizes the latched high FLAG signal to generate a plurality of control signals as it is shifted through the stages of its shift register. The control circuit 416 also detects a synchronization mode of the SLDRAM 16a and outputs an active calibration signal CAL when such a mode is detected, as will be described in more detail below.

A storage register 414 sequentially receives the partial 20-bit command words C<0:19> output from the shift register 412, and receives the 4-bit FLAG word F<0:3> from the control circuit 416, and latches these words in response to corresponding transitions of the ICLK signal. The storage register 414 combines the two latched partial command words C<0:19>, which correspond to a command packet CA<0:39>, and outputs these combined words as a 40-bit command word C<0:39>. The storage register 414 also outputs the latched FLAG word F<0:3> as the 4-bit flag-latched word FLAT<0:3>. A calibration trigger signal CTRIGGER is also generated by the storage register 414 when the CAL signal from the control circuit 416 is active during the synchronization mode of operation, as will be described in more detail below.

In the embodiment shown in FIG. 4, the shift register 412 includes two stages, each stage being 10 bits wide, and the storage register 414 stores and outputs the 40-bit command word C<0:39> and 4 bit flag-latched word FLAT<0:3>. However, in the more general case, the shift register 412 has N stages, each of which has a width of M bits, and the storage register 414 stores and outputs an M*N bit command word. Furthermore, one skilled in the art will realize the shift register 412, control circuit 416, and storage register 414 must be capable of latching their respective data signals at very high rates during operation of the resynchronization circuit 410, and during normal operation of the memory device 16a containing the circuit 410. For example, in one embodiment the command clock CCLK has a frequency of 200 MHz, requiring the shift register circuit 412 to store one packet word CA<0:9> every 2.5 ns (i.e., one packet word in response to each falling and rising edge of the CCLK signal).

The initialization mode of the SLDRAM 16a is signaled by a FLAG signal that is twice the width of the normal FLAG signal, i.e., a FLAG signal having a duration equal to the period of the ICLK signal. Thus, there will be at least two transitions of the ICLK signal during the initialization FLAG signal. In response to the double-width FLAG signal, the control circuit 416 activates the calibration signal CAL, causing the resynchronization circuit 410 to execute an initialization procedure to synchronize the CCLK, DCLK0, and DCLK1 clock signals, as will be explained in more detail below. When the CAL signal goes active, the storage register 414 pulses the CTRIGGER signal active after two partial command words CA<0:19> and the FLAG word F<0:3> are loaded into the storage register 414. Thus, after a command packet CA<0:39> corresponding to the two partial command words C<0:19> has been loaded into the storage register 414, along with the four FLAG bits F<0:3> applied coincident with this command packet, the storage register 414 generates the CTRIGGER pulse. In response to the CTRIGGER pulse, an initialization sequencer 430 (FIG. 4B) generates a plurality of control signals to control operation of the resynchronization circuit 410 during the synchronization mode, as will be described in more detail below.

The partial resynchronization circuit 410 further includes an evaluation circuit 420 which compares the command word C<0:39> and the flag-latched word FLAT<0:3> from the storage register 414 to an expected data or synchronization sequence word SYNCSEQ<0:3> output by the initialization sequencer 430, and develops a command initialization results signal CINITRES in response to this comparison. The SYNCSEQ<0:3> word corresponds to the expected values for the bits in the applied command word C<0:39> and flag-latched word FLAT<0:3> output by the storage register 414, as will be described in more detail below. The evaluation circuit 420 is enabled in response to an active command initialization signal CINIT output by a clock-domain control circuit 422 (FIG. 4B). As will be discussed in more detail below, the clock-domain control circuit 422 activates the CINIT signal when the CCLK signal is being synchronized, and initialization sequencer 430 further applies a plurality of control signals 421 to control operation of the evaluation circuit 420. When the bits of the command word C<0:39> and flag-latched word FLAT<0:3> have their expected values determined by the SYNCSEQ<0:3> word, the evaluation circuit 20 drives the CINITRES signal high, indicating the command packet CA<0:39> and latched FLAG bits were successfully captured. In contrast, when at least one of the bits in the command word C<0:39> or flag-latched word FLAT<0:3> does not have its expected value, the evaluation circuit 420 drives the CINITRES signal inactive low, indicating the command packet CA<0:39> and latched FLAG bits were not successfully captured.

The partial resynchronization circuit 410 further includes data packet circuitry 424 (FIG. 4A) that operates in a manner analogous to the command packet circuitry 411 in capturing and evaluating data packet words D<0:15> applied on the data bus DQ. An input buffer 426 transfers data packet words D<0:15> received on the data bus DQ to the input registers 142 (FIG. 3), which latch the sequentially applied data packet words D<0:15> in response to a clock signal applied by a multiplexer 421. The multiplexer 421 applies either an internal data clock signal IDCLK0 or an internal data clock signal IDCLK1 to the input registers 142 in response to a select clock signal SELCLK generated by circuitry (not shown in FIG. 4) in the memory device 16a (FIG. 3) containing the resynchronization circuit 410. The IDCLK0 and IDCLK1 clock signals are internal data clock signals generated by the variable-phase clock generation circuits 419 and 423, respectively, in response to the respective data clocks DCLK0 and DCLK1, as will be explained in more detail below. After four data packet words D<0:15> have been latched in the input registers 142, the write buffer 148 (FIG. 3) latches the four data packet words D<0:15> comprising the data packet in response to a load signal LDCD generated by the clock generator 144 (FIG. 3). In the embodiment of FIG. 4, each data word D<0:15> includes 16 bits, which is the width of the data bus DQ. Thus, the write buffer 148 stores and outputs 64 bits of data as a data word D<1:60> and a data word D0L<3:0>. The data word D0L<3:0> corresponds to the four bits of data sequentially latched on the DQ0 line of the data bus DQ and the data word D<1:60> corresponds to the other 60 bits of data latched on the lines DQ1–DQ15 of the data bus DQ during the latching of the data packets. The data word D0L<3:0> is analogous to the flag-latched word FLAT<0:3>, and the function of both of these words will be described in more detail below.

An evaluation circuit 428 receives the D<1:60> and D0L<3:0> data words from the write buffer 148 and operates in a manner analogous to that previously described for the evaluation circuit 420 to compare these captured bits to expected data determined by the SYNCSEQ<0:3> word generated by the initialization sequencer 30. The evaluation circuit 428 develops a data clock initialization results signal DINITRES indicating whether each of the bits in the D<1:60> and D0L<3:0> words have their expected values. When the bits in the captured data words D<1:60> and D0L<3:0> all have their expected values, the evaluation circuit 428 activates the DINITRES signal, and deactivates this signal when any of these bits does not have its expected value. The evaluation circuit 428 receives a number of control signals 429 from the initialization sequencer 430, as will be described in more detail below. The evaluation circuit 428 also receives a data clock initialization enable signal DINIT generated by an OR gate 432 in response to a DCLK0 initialization signal D0INIT and a DCLK1 initialization signal D1INIT output by the clock-domain control circuit 422. As will be described in more detail below, the clock-domain control circuit 422 activates the D0INIT and D1INIT signals when the data clock signals DCLK0 and DCLK1 are being synchronized, respectively. When either of the D0INIT or D1INIT signals is active high, the NOR gate 432 drives the DINIT signal active high, which, in turn, activates the evaluation circuit 428.

A multiplexer 446 receives the CINITRES or DINITRES signals output by the evaluation circuits 420 and 428, respectively, and also receives the CTRIGGER and LDCD signals. In response to the CINIT signal, the multiplexer 446 applies one of the CINITRES and DINITRES signals on a first output and one of the CTRIGGER or LDCD signals on a second output. When the CINIT signal is active high, which occurs when the command clock signal CCLK is being synchronized, the multiplexer 446 applies the CINITRES and CTRIGGER signals on its first and second outputs, respectively. In response to the CINIT signal being inactive low, which occurs when either of the clock signals DCLK0 or DCLK1 is being synchronized, the multiplexer 446 applies the DINITRES and LDCD signals on its respective first and second outputs.

An initialization phase selector 436 (FIG. 4B) receives either the CINITRES or DINITRES signal output by the multiplexer 446 and the CAL signal generated by the control circuit 416. The initialization phase selector 436 further receives a latch results signal LATRES and a phase signal PHASEOK generated by the initialization sequencer 30. A multiplexer 438 applies either the ICLK signal generated by the variable-phase clock generation circuit 418 or the WCLK signal generated by the clock generator 40 (see FIG. 3) to clock the initialization phase selector 436. The multiplexer 438 applies the ICLK signal to clock the initialization phase selector 436 when the CINIT signal is active high during synchronization of the CCLK signal, and applies the WCLK signal when the CINIT signal is inactive low during synchronization of the DCLK0 and DCLK1 signals.

In response to these various signals, the initialization phase selector 436 develops an initialization phase word INITPH<0:3>, a phase select done signal PHSELDONE, and a phase ready signal PHREADY, which are applied to a number of components in the partial resynchronization circuit 410 as shown. This initialization phase word INITPH<0:3> is applied to the inputs of three phase select latches 440, 442, and 444 receiving the CINIT, D0INIT, and D1INIT signals, respectively. Each of the phase select latches 440–444 operates in either a transfer mode or a storage mode in response to the corresponding one of the CINIT, D0INIT, and D1INIT signals output by the clock-domain control circuit 422. The phase select latches 440–444 each operate in the same way in response to the corresponding signals, and thus, for the sake of brevity, only the operation of the phase select latch 440 will now be described in more detail. The phase select latch 440 operates in the transfer mode when the CINIT signal is active high. In the transfer mode, the phase select latch 440 outputs the current value of the INITPH<0:3> word as the phase command CCMDPH<0:3> to the variable-phase clock generation circuit 418, and latches the INITPH<0:3> word present on its input in response to the PHSELDONE signal going active high. When the CINIT signal goes inactive low, the phase select register 440 operates in the storage mode, outputting the latched value of INITPH<0:3> word as the phase command CCMDPH<0:3> to the clock generation circuit 418.

The operation of the initialization phase selector 436 in determining the optimum phase command CCMDPH<0:3>, D0CMDPH<0:3>, or D1CMDPH<0:3> for the one of the clock signals CCLK, DCLK0, and DCLK1 being synchronized by the resynchronization circuit 410 will now be described in more detail before describing the overall operation of the resynchronization circuit 410. One procedure that may be executed by the initialization phase selector 436 in determining each of these optimum phase commands is described in U.S. patent application Ser. No. 08/994,461 to Manning, which is incorporated herein by reference.

Briefly, according to this procedure, the initialization phase selector 436 operates in two modes in determining each optimum phase command, namely a load mode and an analysis mode. In the load mode, the initialization phase selector 436 sequentially increments the initialization phase word INITPH<0:3> to sequentially increment the phase of the one of the clock signals ICLK, D0CLK, or D1CLK being synchronized. For example, assume the CINIT signal is active high indicating the CCLK clock signal is being synchronized. When the CINIT signal is high, the phase select register 440 applies INITPH<0:3> word as the phase command CCMDPH<0:3> to the clock generator 418. In this situation, as the initialization phase selector 436 sequentially increments the INITPH<0:3> word, the clock generation circuit 418 sequentially increments the phase of the ICLK signal. The shift register 412 and control circuit 416 attempt to accurately capture each initialization command packet responsive to the respective internal clock signals ICLK that sequentially vary in their timing relationship to the initialization command packets. The term initialization command packet is used in this description to denote a command packet CA<0:39> and the associated flag-latched word FLAT<0:3>, and also corresponds to four data packet words captured on the data bus DQ. These captured initialization command packets are then loaded into the storage register 414 which, in turn, applies the corresponding command word C<0:39> and flag-latched word FLAT<0:3> to the evaluation circuit 420. During the load mode, the initialization phase selector 436 stores or loads values for the CINITRES signal developed by the evaluation circuit 420 at corresponding phases of the ICLK signal. Recall, when a command packet is successfully captured the CINITRES signal has a binary "1" value, and otherwise is a binary "0." The initialization phase selector 436 stores a value for the CINITRES signal at each value of the phase command CCMDPH<0:3>, and identifies which phase commands CMDPH<0:3> caused ICLK to clock the shift register 412 and control circuit 416 at the proper time to successfully capture the applied initialization command packets (i.e., which phase commands resulted in a binary 1 for the CINITRES signal).

In the analysis mode, the initialization phase selector 436 evaluates the stored values for the CINITRES signals at each value of the phase command CCMDPH<0:3>. More specifically, a single phase command CMDPH<0:3> that is most likely to successfully capture packet words CA<0:9> and FLAG bits in an initialization command packet is selected from all the phase commands CCMDPH<0:3> that successfully captured the initialization command packets. This selected phase command CMDPH<0:3> is the command that is thereafter latched by the phase select register 440 and applied to the clock generation circuit 418 to generate the ICLK signal during normal operation.

Figure 1:
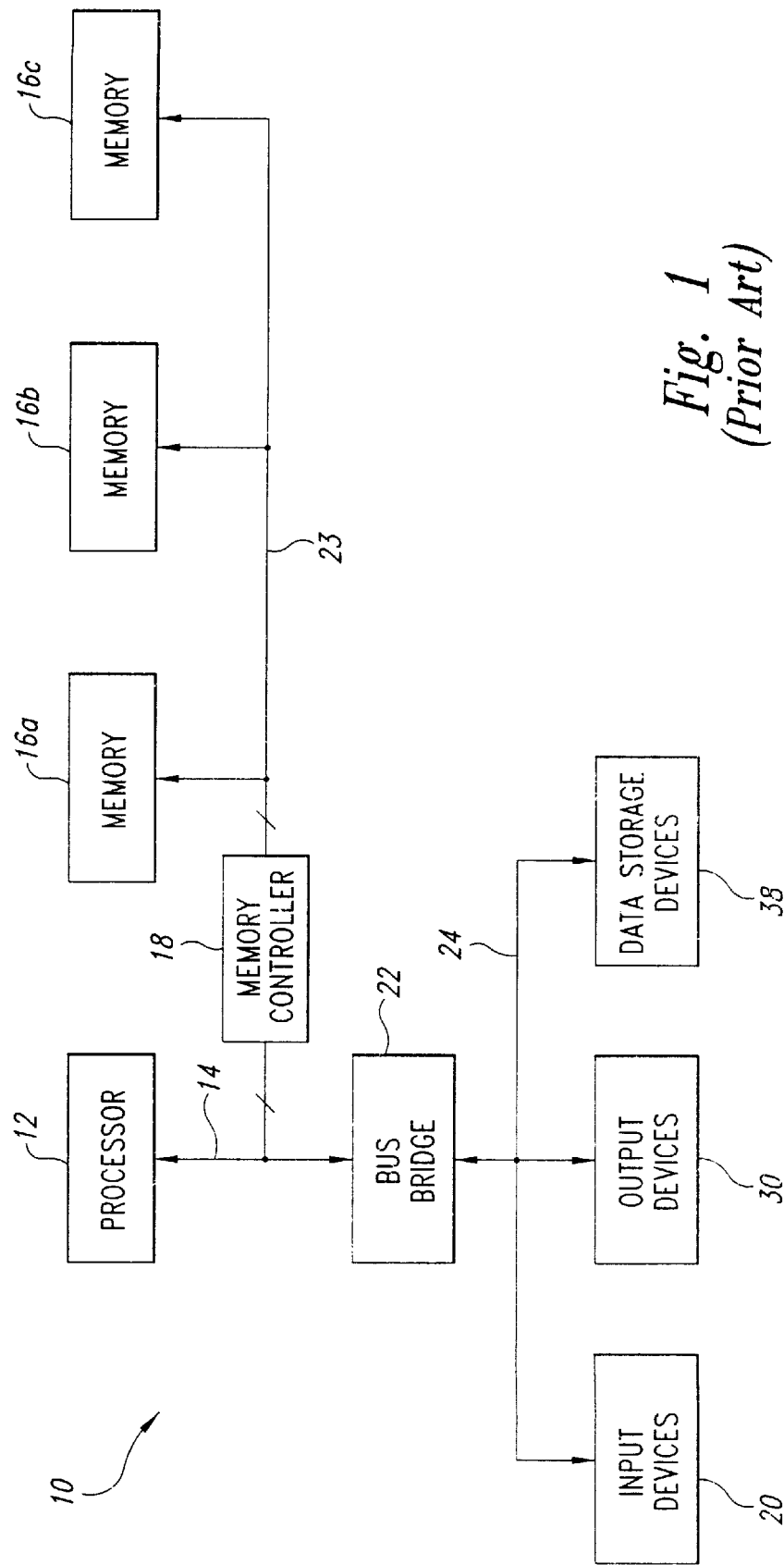
FIG. 1 is a block diagram of a conventional computer system using a plurality of SLDRAM packetized memory devices.
Figure 2:
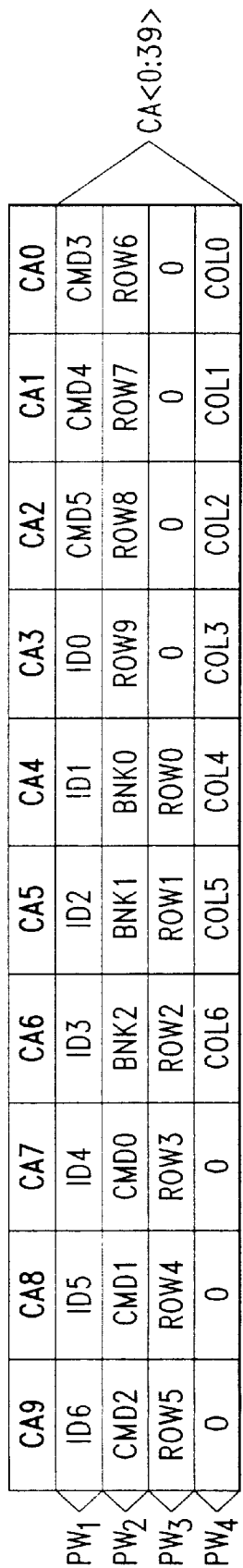
FIG. 2 is diagram showing a typical command packet received by the SLDRAMs of FIG. 1.

The overall operation of the partial resynchronization circuit 410 will now be described in more detail with reference to FIGS. 4A and 4B. In operation, when the SLDRAM 16a containing the partial resynchronization circuit 410 operates in the initialization mode, which is initiated by the FLAG signal going active high for one cycle of the ICLK signal, the partial resynchronization circuit 410 synchronizes the CCLK, DCLK0, and DCLK1 clock signals, as will now be explained in more detail. In synchronizing these clock signals, the partial resynchronization circuit 410 operates in two submodes, a power-up synchronization submode and a partial synchronization submode. The power-up synchronization submode is initiated by a reset signal $\overline{\text{RESET}}$ going active low, which typically occurs, for example, upon power-up of the computer system 10 (see FIG. 1) including the SLDRAM 16a. In response to the low $\overline{\text{RESET}}$ signal, the clock-domain control circuit 422 drives the CINIT, D0INIT, D1INIT, and SO signals inactive low, and the memory controller (FIG. 1) applies a 15-bit repeating pseudo-random bit sequence on each line of the command-address bus CA, data bus DQ, and on line 52 receiving the FLAG signal. The 15-bit repeating pseudo-random synchronization bit sequence applied on these lines is shown in Table 1 below.

on CA<8>, 0000 on CA<7>, and so on such that the sequence applied on each line is the complement of the sequence applied on adjacent lines. The repeating pseudo-random bit sequence is sampled or captured in groups or streams of 4 bits (e.g., one bit on each CA line for each of four applied packet words) as during normal operation, and such a bit sequence ensures that no four consecutive bits can be mistaken for any four other consecutive bits, as will be understood by one skilled in the art.

In response to the 15-bit pseudo-random bit sequence, the partial resynchronization circuit 410 places the SLDRAM 16a in the synchronization mode of operation. More specifically, as shown in Table 1, the pseudo-random bit sequence begins with consecutive 1's for the FLAG signal. As previously described, in response to two consecutive 1's latched for the FLAG signal, the control circuit 416 activates the CAL signal to place the partial resynchronization circuit 410 in the initialization mode of operation.

When the CAL signal goes active high, the clock-domain control circuit 422 initially activates the CINIT signal and maintains the SO, D0INIT, and D1INIT signals inactive low. In response to the CINIT signal going active high, the multiplexer 446 applies the CINITRES signal to the initialization phase selector 436 and the CTRIGGER signal to the initialization sequencer 430. In addition, in response to the active high CINIT signal, the phase select latch 440 applies the initialization phase word INITPH<0:3> output by the initialization phase selector 436 as the phase command CCMDPH<0:3> to the variable-phase clock generation circuit 418. The multiplexer 438 applies the ICLK signal to clock the initialization phase selector 436 in response to the active CINIT signal.

When the CINIT signal is active, the partial resynchronization circuit 410 synchronizes the ICLK signal. To begin synchronizing the ICLK signal, the initialization phase selector 436 outputs an initialization phase word INITPH<0:3> through the phase select register 440 as the phase command CCMDPH<0:3> to the variable-phase clock generation circuit 418. In response to the phase command CCMDPH<0:3>, the clock generation circuit 418 generates the ICLK signal having an initial phase relative to the CCLK signal that corresponds to the phase command CCMDPH<0:3>. In response to the ICLK signal, the shift register 412 latches initialization packet words CA<0:9> applied on the command-address bus CA and the control circuit 416 latches the coincident initialization FLAG bits. As previously described, the first two packet words CA<0:9> of an initialization command packet CA<0:39> are then loaded into the storage register 414 as the first

TABLE 1

| FLAG | 1 | 1 | 1 | 1 | 0 | 1 | 0 | 1 | 1 | 0 | 0 | 1 | 0 | 0 | 0 |
|------|---|---|---|---|---|---|---|---|---|---|---|---|---|---|---|
| CA<9> | 0 | 0 | 0 | 0 | 1 | 0 | 1 | 0 | 0 | 1 | 1 | 0 | 1 | 1 | 1 |
| CA<8> | 1 | 1 | 1 | 1 | 0 | 1 | 0 | 1 | 1 | 0 | 0 | 1 | 0 | 0 | 0 |
| CA<7> | 0 | 0 | 0 | 0 | 1 | 0 | 1 | 0 | 0 | 1 | 1 | 0 | 1 | 1 | 1 |
| M | M | M | M | M | M | M | M | M | M | M | M | M | M | M | M |
| CA<0> | 1 | 1 | 1 | 1 | 0 | 1 | 0 | 1 | 1 | 0 | 0 | 1 | 0 | 0 | 0 |
| DQ<15> | 0 | 0 | 0 | 0 | 1 | 0 | 1 | 0 | 0 | 1 | 1 | 0 | 1 | 1 | 1 |
| DQ<14> | 1 | 1 | 1 | 1 | 0 | 1 | 0 | 1 | 1 | 0 | 0 | 1 | 0 | 0 | 0 |
| M | M | M | M | M | M | M | M | M | M | M | M | M | M | M | M |
| DQ<0> | 1 | 1 | 1 | 1 | 0 | 1 | 0 | 1 | 1 | 0 | 0 | 1 | 0 | 0 | 0 |

As seen from Table 1, the 15-bit pseudo-random bit sequence is complemented on adjacent lines of the command-address bus CA and data bus DQ. Thus, for example, the sequence starts with 0000 on line CA<9>, 1111 partial command word C<0:19>, and the third and fourth packet words CA<0:9> are thereafter loaded as the second partial command word C<0:19> along with the associated four FLAG bits F<0:3>. The storage register 414 outputs the latched command word C<0:39> along with the flag-latched word FLAT<0:3> to the evaluation circuit 420 and generates the CTRIGGER pulse just after the second partial command word C<0:19> and four flag bits F<0:3> are loaded into the storage register 414. In response to the CTRIGGER pulse and the FLAT<0:3> word, the initialization sequencer 430 generates the SYNCSEQ<0:3> word, as will be described in more detail below. The evaluation circuit 420 compares the latched command word C<0:39> and flag-latched word FLAT<0:3> output by the storage register 414 to their expected values determined by the SYNCSEQ<0:3> word and activates the CINITRES signal when these words have their expected values, thereby indicating these words were successfully captured at the current phase of the ICLK signal. If any of the bits in the C<0:39> and FLAT<0:3> words does not have its expected value, the evaluation circuit 420 drives the CINITRES signal inactive, indicating the capture of these words at the current phase of the ICLK signal was unsuccessful.

The CINITRES signal is applied through the multiplexer 446 to the input of the initialization phase selector 436, which latches the value of the CINITRES signal in response to the LATRES signal developed by the initialization sequencer 430. In the embodiment of FIG. 4, the initialization sequencer 430 pulses the LATRES signal once for every eight comparisons made by the evaluation circuit 420 as long as the CINITRES signal is active high. In this way, for a given phase of the ICLK signal, eight initialization command packets CA<0:39> may be latched and subsequently compared by the evaluation circuit 420 to their corresponding expected values as long as the CINITRES signal remains active high. After the eighth comparison, the initialization sequencer 430 pulses the LATRES signal causing the initialization phase selector 436 to latch the CINITRES signal.

If any command packet CA<0:39> or flag-latched word FLAT<0:3> is latched unsuccessfully, however, the evaluation circuit 420 detects the error and drives the CINITRES signal inactive low. As soon as the CINITRES signal goes inactive low, the initialization sequencer 430 pulses the LATRES signal causing the initialization phase selector 436 to latch the low CINITRES signal. Thus, if all command packets are captured successfllly, eight command packets will be captured at a given phase of the ICLK signal and a high CINITRES signal, indicating successful capture of the command packets, will be stored by the initialization phase selector 436. In contrast, if any one of the comparisons by the evaluation circuit 420 indicates the command packet was captured unsuccessfully, which is indicated by the CINITRES signal going low, comparisons at that phase of the ICLK signal are immediately terminated and the initialization phase selector 436 stores a low value for the CINITRES signal, indicating command packets were unsuccessfully captured at that particular phase of the ICLK signal.

As previously described, the initialization phase selector 436 latches the value of the CINITRES signal in response to the LATRES pulse. In addition, the initialization phase selector 436 also increments the value of the initialization phase word INITPH<0:3> in response to the pulsed LATRES signal. This new value of the INITPH<0:3> word is once again applied through the phase select latch 440 to the clock generation circuit 418 and corresponds to the new phase of the ICLK signal that is applied to the shift register 412 and control circuit 416, and used in latching subsequent packet words CA<0:9> applied on the command-address bus CA. Once again, the latched initialization command packet CA<0:39> is applied to the evaluation circuit 420, which compares each bit of the latched command packet to an expected value determined by the SYNCSEQ<0:3> word. In response to this comparison, the evaluation circuit 420 once again develops the CINITRES signal having a value indicating whether the initialization command packet CA<0:39> was successfully captured. The initialization phase selector 436 operates as previously described in latching a value for the CINITRES signal indicating whether command packets were successfully captured at the new phase of the ICLK signal. After latching a value for the CINITRES signal, the initialization phase selector 436 again increments the value of the INITPH<0:3> word which, once again, is applied through the phase select latch 440 as the phase command CCMDPH<0:3> to the clock generation circuit 418 which, in turn, generates the ICLK signal having a new phase relative to the ICLK signal. This process is repeated until the initialization phase selector 436 has stored a predetermined number of values for the CINITRES signal, each value corresponding to a different phase of the ICLK signal that was utilized in latching initialization command packets CA<0:39> supplied on the command-address bus CA and FLAG line. In one embodiment, the initialization phase selector 436 latches 16 values of the CINITRES signal. In other words, 16 different phases of the ICLK signal are utilized to capture initialization command packets CA<0:39> applied on the command-address bus CA.

After the initialization phase selector 436 has stored 16 values for the CINITRES signal, the phase selector operates in the analysis mode to determine which of the 16 phases for the ICLK signal will be utilized to capture command packets CA<0:39> and FLAG bits applied to the SLDRAM 16a during normal operation. Recall, for each phase of the ICLK signal that successfully captured command packets CA<0:39>, the initialization phase selector 436 stored a binary 1 for the CINITRES signal. A binary 0 was stored for the CINITRES signal for all phases of the ICLK signal where the command packets were not successfully captured. Thus, the initialization phase selector 436 selects one of the phases for the ICLK signal that resulted in a binary 1 for the CINITRES signal. One process that may be utilized by the initialization phase selector 436 in determining the optimum phase for the ICLK signal is described in more detail in U.S. patent application Ser. No. 08/890,055 to Baker et al., which is incorporated herein by reference. After having determined the optimum phase for the ICLK signal, the initialization phase selector 436 outputs the initialization phase word INITPH<0:3> corresponding to this phase, and activates the PHSELDONE signal. In response to the active PHSELDONE signal, the phase select latch 440 latches the initialization phase word INITPH<0:3> corresponding to the optimum phase for the ICLK signal. The phase select register 440 thereafter continuously outputs this value as the phase command word CCMDPH<0:3> to the clock generation circuit 418, which generates the ICLK signal having the corresponding phase. The phase select register 440 actually does not output the latched initialization phase word INITPH<0:3> until the clock-domain control circuit 422 deactivates the CINIT signal, which occurs shortly after the phase selector 436 activates the PHSELDONE signal, as will be described in more detail below.

In response to the active PHSELDONE signal output by the initialization phase selector 36, the clock-domain control circuit 422 deactivates the CINIT signal, indicating an optimum phase for the ICLK signal has been determined and the synchronization of the CCLK signal is therefore completed. Coincident with deactivating the CINIT signal, the clock-domain control circuit 422 activates the D0INIT signal indicating the DCLK0 signal will now be synchronized.

In response to the active D0INIT signal, the phase select latch 442 places the initialization phase word INITPH<0:3> output by the initialization phase selector 436 on its output as the phase command D0CMDPH<0:3> applied to the variable-phase clock generation circuit 419. In addition, when the CINIT signal goes inactive low, the multiplexer 446 applies the DINITRES signal to the initialization phase selector 436 and the LDCD signal to clock the initialization sequencer 430. In addition, the multiplexer 438 applies the clock signal WCLK to clock the phase selector 436 in response to the low CINIT signal. When the D0INIT signal goes active, the SELCLK signal goes active causing the multiplexer 421 to apply the clock signal IDCLK0 to clock the input registers 142, and in this way the IDCLK0 signal is utilized to capture data packets placed on the data bus DQ. The OR gate 432 also activates the DINIT signal in response to the active D0INIT signal to thereby enable the evaluation circuit 428.

The initialization phase selector 436 thereafter operates as previously described to latch 16 values for the DINITRES signal developed in response to corresponding phases of the IDCLK0 signal, and then determines the optimum value for the phase command D0CMDPH<0:3> to be applied to the variable-phase clock generation circuit 419. Once again, after the initialization phase selector 436 has determined the optimum value for the D0CMDPH<0:3> word, the phase selector again generates the PHSELDONE pulse. In response to the PHSELDONE pulse, clock-domain control circuit 422 deactivates the D0INIT signal and activates the D1INIT signal, indicating synchronization of the IDCLK0 signal has been completed and synchronization of the IDCLK1 signal will now begin. The SELCLK signal is also deactivated in response to the active D1INIT signal causing the multiplexer 421 to apply the IDCLK1 to clock the input registers 142. It should be noted that in response to the active high D1INIT signal, the OR gate 432 maintains the DINIT signal active, thereby enabling the evaluation circuit 428. The evaluation circuit 428 and initialization phase selector 436 thereafter operate identically to the manner previously described for synchronization of the IDCLK0 signal in determining the optimum phase command D1CMDPH<0:3> to be applied to the variable phase clock generation circuit 423, and thus, for the sake of brevity, will not be described in further detail.

Once the initialization phase selector 436 has determined the optimum phase command D1CMDPH<0:3> to synchronize the IDCLK1 signal, the phase selector once again generates the PHSELDONE pulse. In response to the PHSELDONE pulse, the clock-domain control circuit 422 deactivates the D1INIT signal and activates the SO signal, indicating all three clock signals, ICLK, IDCLK0, and IDCLK1, have now been synchronized. The active high SO signal is typically applied as the SI signal to another SLDRAM and enables initialization and synchronization of the next SLDRAM to begin.

During the power-up submode of operation, the resynchronization circuit 410 synchronizes all three of the clock signals ICLK, IDCLK0, and IDCLK1. After this has been done, the clock-domain control circuit 422 operates in the partial synchronization submode. In the partial synchronization submode, the resynchronization circuit 410 synchronizes only those clock signals not synchronized during the previous active cycle of the CAL signal. The resynchronization circuit 410 enters the partial synchronization submode when the control circuit 416 activates the CAL signal in response to the FLAG signal going high for one period of the ICLK signal. During the partial synchronization submode, the clock-domain control circuit 422 develops the CINIT, D0INIT, and D1INIT signals so that the clock signals ICLK, DCLK0, and DCLK1 may be partially synchronized during a single active cycle of the CAL signal. Partial synchronization means that less than all the clock signals may be synchronized during a given active CAL cycle, and only those clock signals not synchronized during the previous active cycle of the CAL signal are then synchronized during a subsequent active cycle or cycles of the CAL signal.

For example, assume the CAL signal goes active and the resynchronization circuit 410 begins synchronizing the clock signals ICLK, IDCLK0, and IDCLK1. Now assume that the CAL signal goes inactive low after the circuit 410 has synchronized the ICLK signal (i.e., after new phase command CCMDPH<0:3> for the ICLK signal has been determined), but before the DCLK0 signal has been synchronized (i.e., before the phase command D0CMDPH<0:3> has been determined). The next time the CAL signal goes active placing the circuit 410 in the partial synchronization submode, the clock-domain control circuit 422 activates the D0INIT signal so that synchronization begins with the IDCLK0 signal. In other words, the ICLK signal is not again synchronized since it was successfully synchronized during the previous cycle. This process continues during active cycles of the CAL signal until all three clock signals ICLK, IDCLK0, and IDCLK1 have been synchronized. At this point, during the next active cycle of the CAL signal, the ICLK signal is again synchronized. The operation of the resynchronization circuit 410 in both the power-up and partial synchronization submodes will be discussed further below when the clock-domain control circuit 422 is described in more detail.

The overall operation of the partial resynchronization circuit 410 and general operation of several components within that circuit have now been described with reference to FIG. 4. At this point, several components of the partial resynchronization circuit 410 will now be described in more detail, along with exemplary embodiments of these components. FIG. 5 is a more detailed schematic and block diagram of the command packet circuitry 411 of FIG. 4A including the shift register 412, storage register 414, and control circuit 416. The control circuit 416 includes a conventional quadrature circuit 200 that generates a clock signal CLK and quadrature clock signal CLK90 in response to the ICLK signal.

A clock circuit 235 receives the clock signal CLK and its quadrature CLK90 and generates complementary pairs of clock signals CLK0, $\overline{\text{CLK0}}$ and CLK1, $\overline{\text{CLK1}}$. More specifically, the CLK and CLK90 signals are applied to a NOR gate 236 which outputs a high whenever CLK and CLK90 are both low, as illustrated in the timing diagram of FIG. 6. The output of the NOR gate 236 is applied through a first inverter 237 to generate the CLK1 signal and then through a second inverter 238 to generate the $\overline{\text{CLK1}}$ signal. The CLK90 and CLK signals are also applied to a NAND gate 240 that outputs a low whenever both CLK and CLK90 are high, as also illustrated in FIG. 6. The output of the NAND gate 240 is coupled through an inverter 242 to generate the CLK0 signal and then through a second inverter 244 to generate the $\overline{\text{CLK0}}$ signal. The clock signals CLK and CLK90, along with CLK0, $\overline{\text{CLK0}}$ and CLK1, $\overline{\text{CLK1}}$ are utilized by a number of components in the partial resynchronization circuit 410, and may be utilized by other components in the memory device 16a as well. It should be noted that although the shift register 412 and storage register 414 are shown in FIG. 4A as being clock directly by the ICLK signal, these components are actually clocked by the CLK and CLK90 signals as shown in FIG. 5. This was done merely to simplify the preceding description of FIG. 4.

The control circuit 416 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, $\overline{\text{CLK0}}$ and CLK1, $\overline{\text{CLK1}}$ signals. The FLAG signal is shifted through two stages of the shift register circuits 246, 248 each cycle of the CLK signals. Thus, when the FLAG signal goes high for one half the cycle of the ICLK signal during normal operation, two successive F<0:7> outputs of the shift register circuits 246, 248 sequentially go high each clock cycle as shown in the timing diagram of FIG. 6 for F<0> and F<1>. The FLAG bit goes high just before a time to, and this latched FLAG bit is shifted to bit F<0> at time $t_1$. The FLAG bit goes low just after time $t_1$, and at a time $t_2$ this low FLAG bit is shifted to bit F<0> coincident with the prior high F<0> bit being shifted to bit F<1> as shown. Thus, during normal operation, the bits F<0>–F<7> successively go high as the high FLAG bit is sequentially shifted from one bit to the next responsive to the CLK0 and CLK1 signals.

The F<0>–F<7> bits are used in controlling a number of components in the memory device 16a during normal operation. For example, as will be explained in more detail below, the storage register 414 utilizes the bits F<1> and F<3> in latching the first and second partial command words C<0:19>, respectively, from the shift register 412 during normal operation. During normal operation, the F<1> bit goes high after two packet words CA<0:9> corresponding to the first partial command word C<0:19> have been shifted into the shift register 412. Thus, when the F<1> bit goes high, the storage register latches the first partial command word C<0:19>. Similarly, when the F<3> bit goes high, the third and fourth packet words CA<0:9> corresponding to the second partial command word C<0:19> have been shifted into the shift register 412. The storage register 414 accordingly latches the second partial command word C<0:19> when the F<3> bit goes high.

An initialization detector 204 receives the bits F<0> and F<1> from the shift register circuit 246 and is clocked by the CLK and CLK90 signals. In response to the F<0> and F<1> bits, the initialization detector 204 detects the initialization mode of the memory device 16a which, as previously described, is signaled by consecutive high FLAG bits. The operation of the control circuit 416 during the initialization mode is also illustrated in the timing diagram of FIG. 6. After a time $t_3$, the FLAG bit goes high and this high FLAG bit is shifted to bit F<0> at a time $t_5$. During the initialization mode, the FLAG bit remains high until just before a time $t_6$, which corresponds to two cycles of the ICLK signal. As a result, when the high F<0> bit is shifted to the bit F<1> at time $t_6$, the bit F<0> remains high. Both the F<0> and F<1> bits are now high just after time $t_6$, causing the initialization detector 204 to activate the CAL signal just after time $t_6$, thereby indicating the initialization mode of operation.

Figure 7:
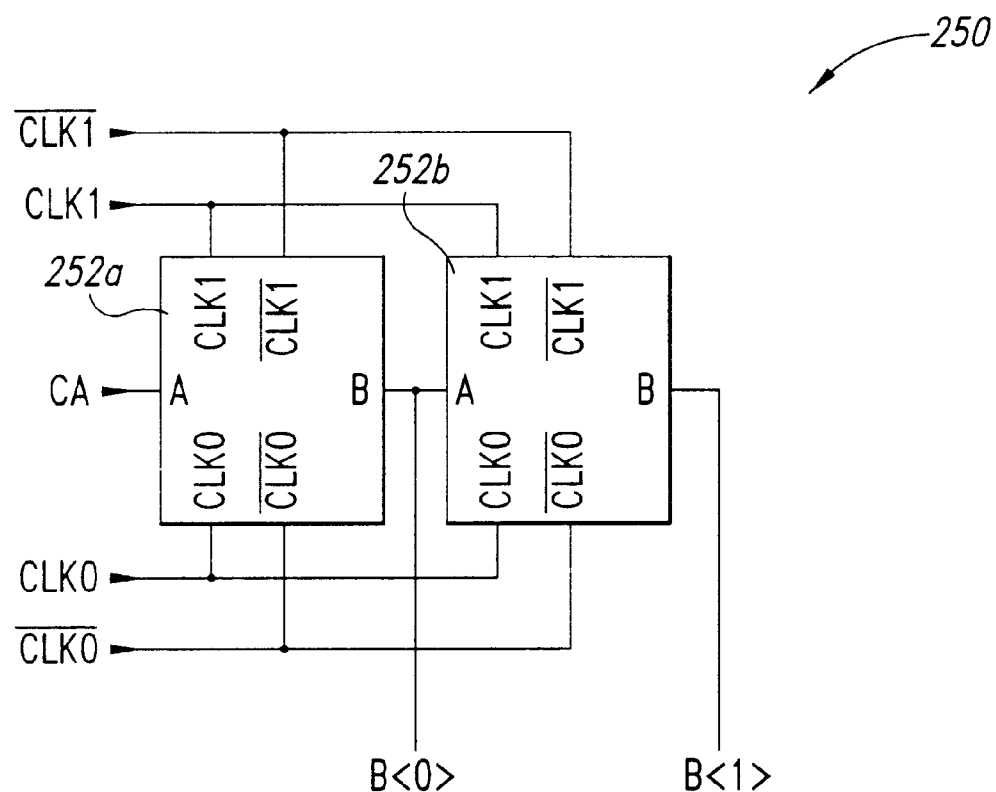
FIG. 7 is a logic diagram of one of the shift register circuits contained in the shift register of FIG. 5.

The shift register 412 shown in FIG. 5 includes ten separate shift register circuits 250a–j, each of which receive a respective bit CA0–CA9 of the incoming 10-bit packet word. Each of the shift register circuits 250a–j includes two shift register stages 252a and 252b as shown in FIG. 7. Thus, after each clock cycle, two command bits CA have been shifted into each shift register circuit 250, and these bits are available as a 2-bit word B<1:0>. The ten shift register circuits 250a–j collectively output the 20-bit partial command word C<0:19>. One embodiment of the shift register 412 that may be utilized in the resynchronization circuit 410 is described in more detail in U.S. patent application Ser. No. 08/994,461 to Manning, which is incorporated herein by reference. The detailed circuitry of the shift register 412 will not be discussed in further detail since such circuitry and operation is slightly tangential to the present invention. One skilled in the art will realize, however, the shift register 412 must be capable a latching packet words CA<0:9> received at very high rates during operation of the resynchronization circuit 410, and during normal operation of the memory device 16a containing the circuit 410. For example, in one embodiment the command clock CCLK has a frequency of 200 MHz, requiring the shift register circuit 412 to store one packet word CA<0:9> every 2.5 ns (i.e., one packet word in response to each falling and rising edge of the CCLK signal).

Figure 4A:
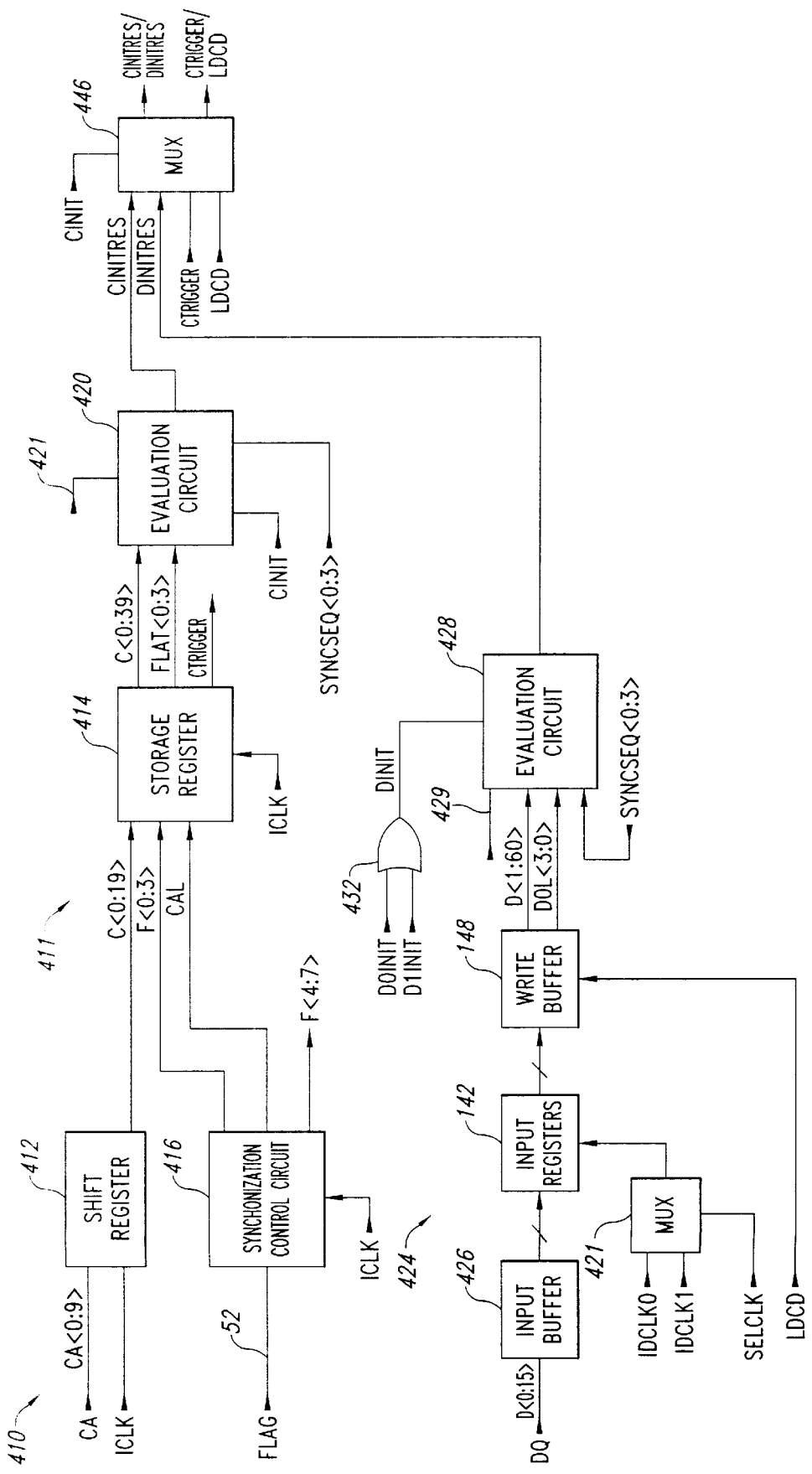
Figure 4B:
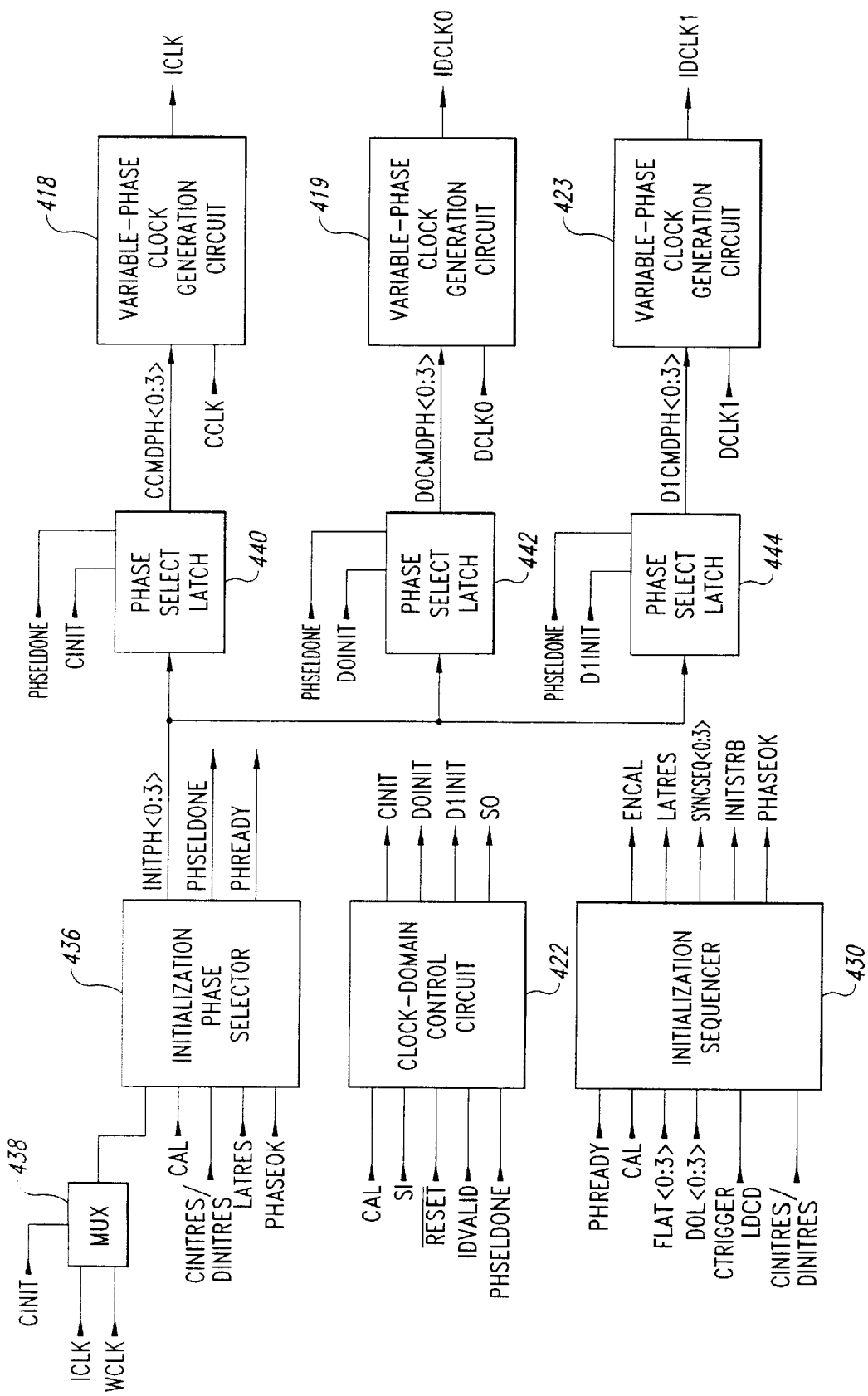
Figure 5:
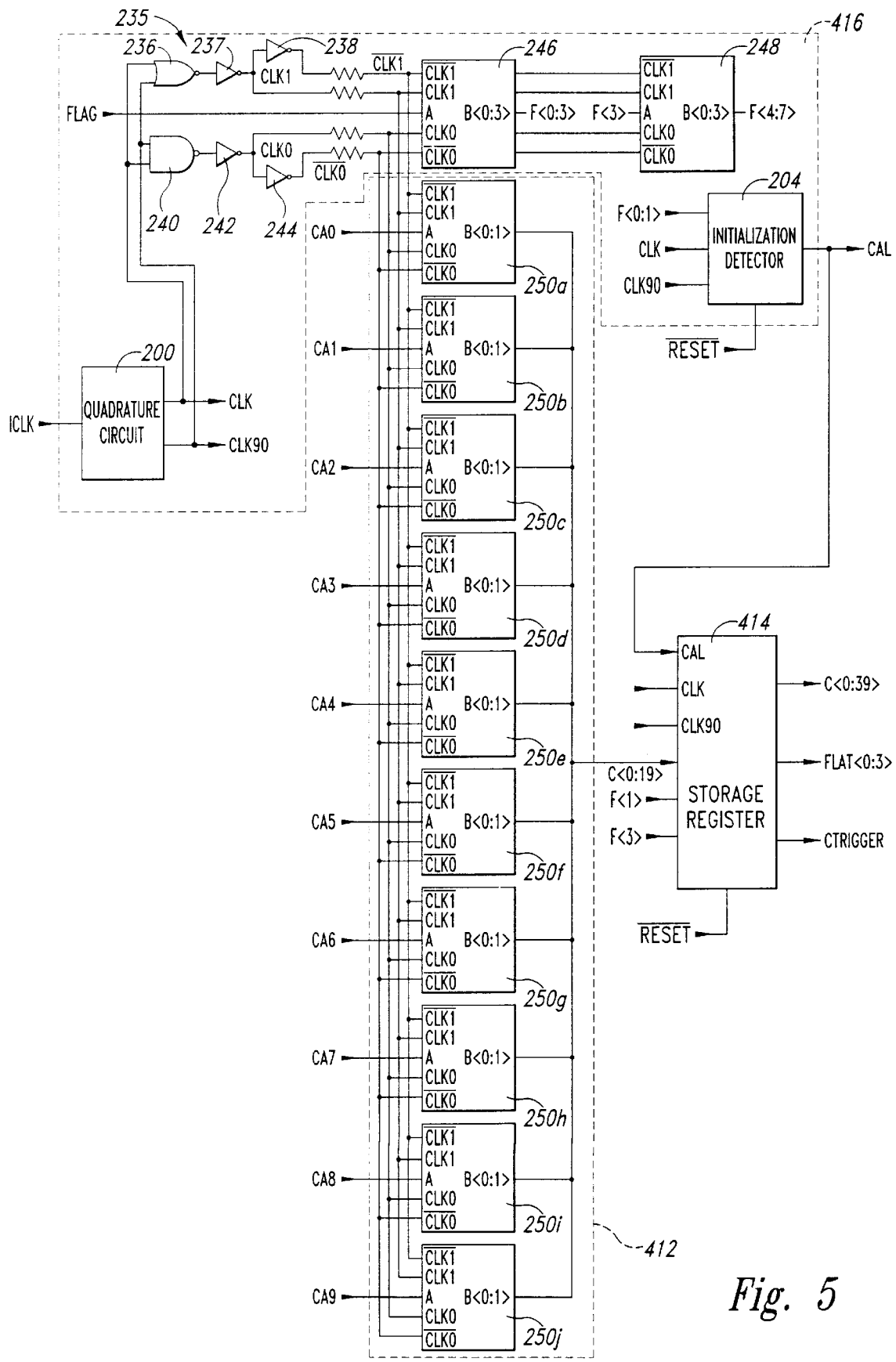
FIG. 5 is a more detailed block diagram of the command packet circuitry of FIG. 4.
Figure 6:
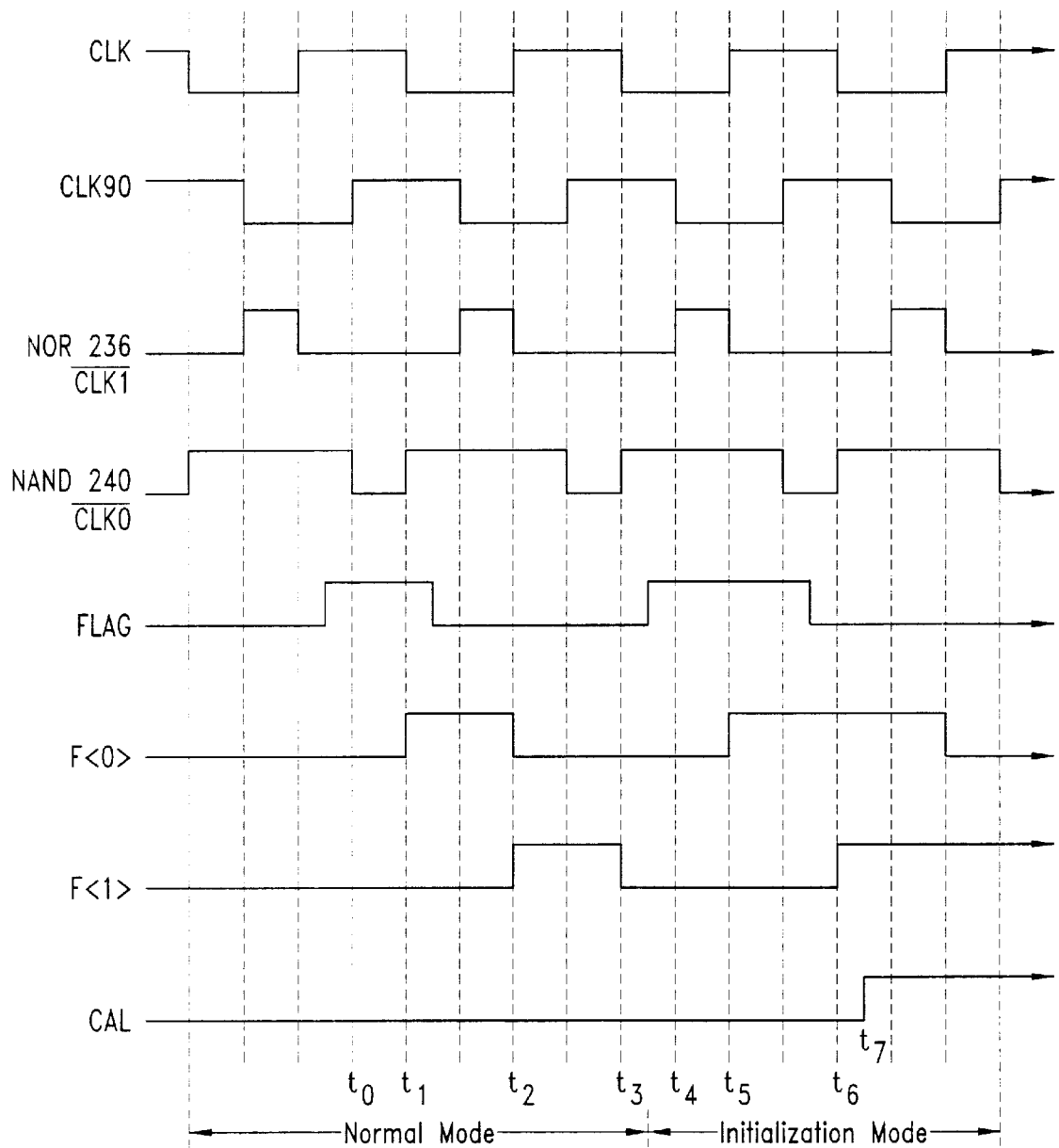
FIG. 6 is a timing diagram showing signals during operation of the control circuit of FIG. 5.
Figure 8A:
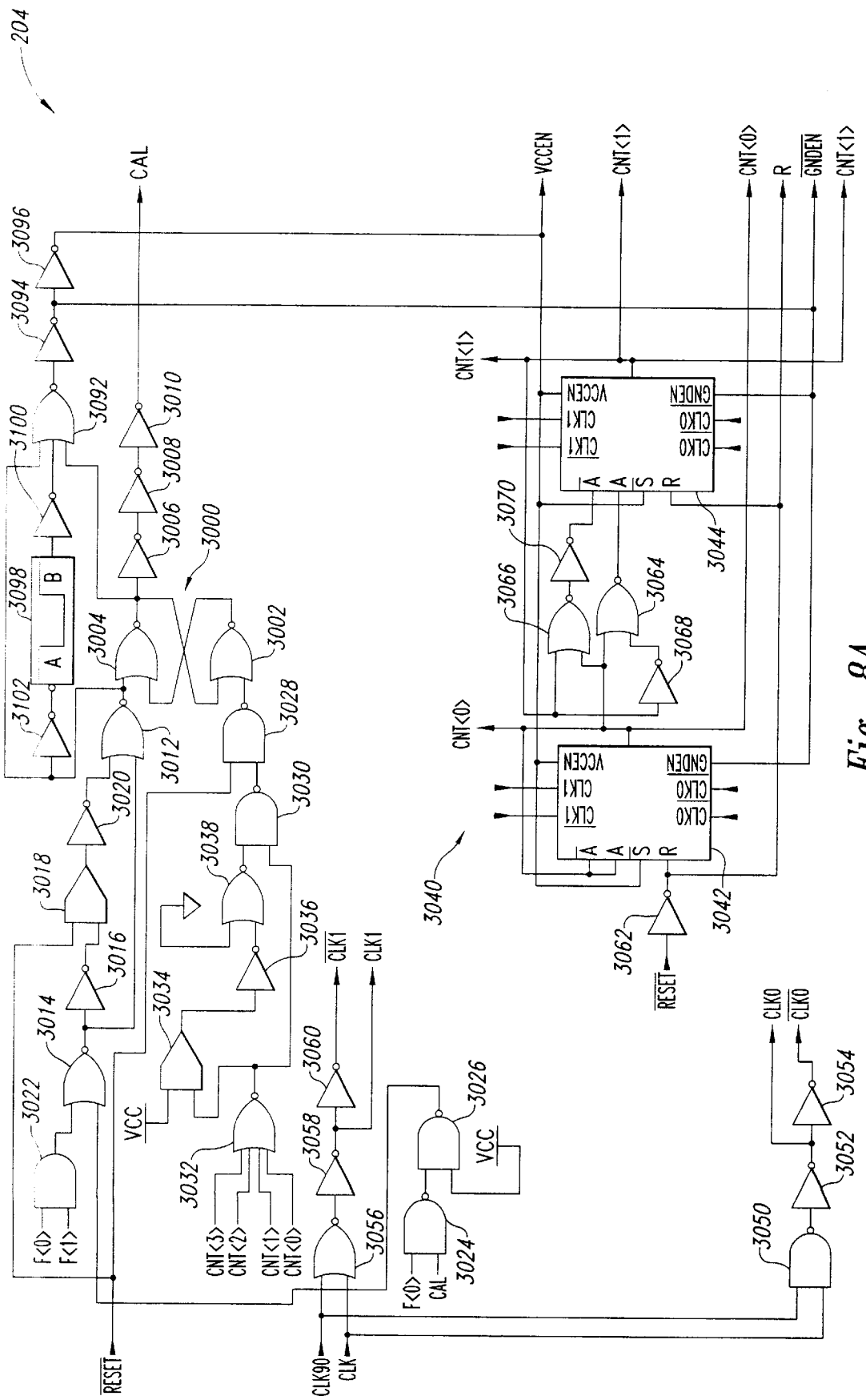
Figure 8B:
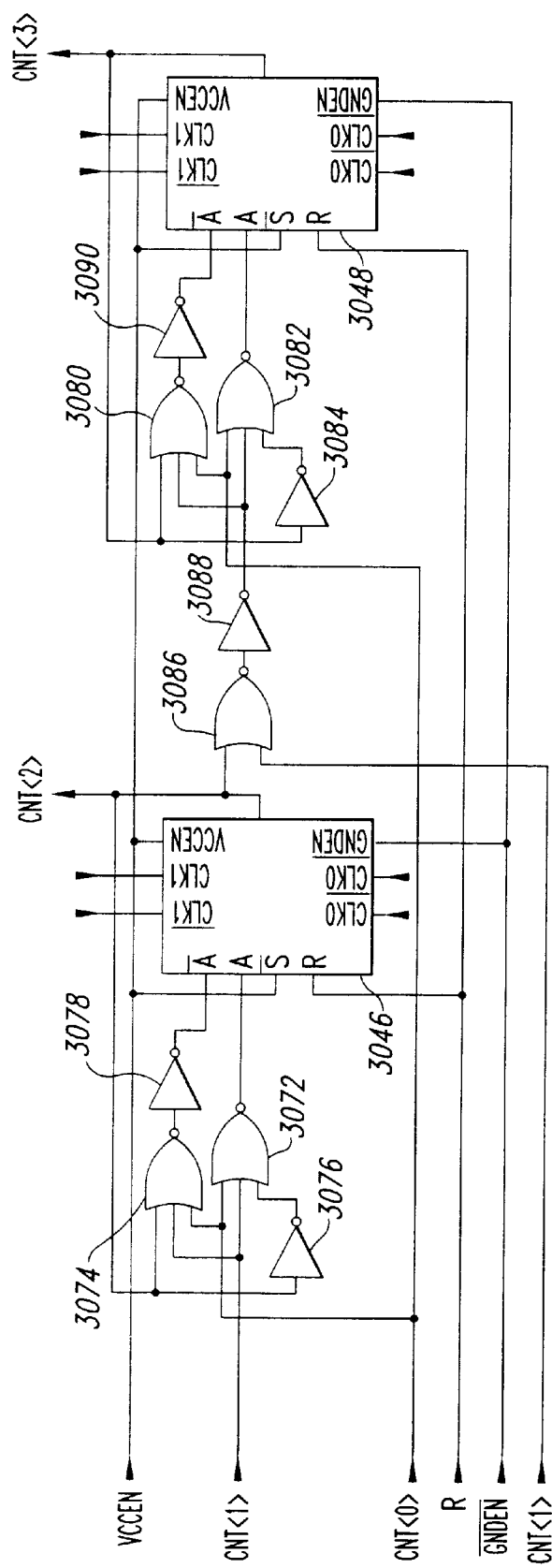

FIG. 8 is a schematic of one embodiment of the initialization detector 204 of FIG. 5, which is contained in the control circuit 416 of FIG. 4A. The initialization detector 204 monitors the FLAG bit and activates the calibration signal CAL upon detecting an initialization condition signal by the FLAG bit, and thereafter monitors the FLAG bit to detect termination of the initialization condition, as will now be explained in more detail. The initialization detector 204 includes an RS flip-flop 3000 including cross-coupled NOR gates 3002 and 3004. The output of the RS flip-flop 3000 is applied through three series connected inverters 3006–3010 to develop the calibration signal CAL. A NOR gate 3012 applies its output to the set input of the RS flip-flop 3000 and receives the output of a NOR gate 3014 directly on a first input and through a series connected inverter 3016, positive-edge delay circuit 3018, and inverter 3020 as shown. The positive-edge delay circuit 3018 drives its output high a predetermined time after receiving a positive-edge transition on its input, and drives its output low without such delay in response to a falling-edge transition on its input. The positive-edge delay circuit 3018 is enabled by the $\overline{\text{RESET}}$ signal applied on a second input, and operates as previously described when the $\overline{\text{RESET}}$ signal is inactive high. When the $\overline{\text{RESET}}$ signal goes active low, the positive-edge delay circuit 3018 drives its output low without any delay and independent of positive-edge transitions on its other input. When the output of the NOR gate 3014 goes low, the NOR gate 3012 receives this low output immediately on its first input and after the predetermined delay of the positive-edge delay circuit 3018 on its second input. In response to these two low inputs, the NOR gate 3012 activates the set input of the RS flip-flop 3000.

An AND gate 3022 receives the latched flag bits F<0> and F<1> on respective inputs and applies a high output to the NOR gate 3014 when both these bits are high. A NAND gate 3024 receives the F<0> and CAL signals on respective inputs and couples its output through an enabled NAND gate 3026 to apply a high input to the NOR gate 3014 when both the F<0> and CAL signals are high.

A NAND gate 3028 applies an active high reset signal to the RS flip-flop 3000 when either the $\overline{\text{RESET}}$ signal or the output of a NAND gate 3030 received on respective inputs is low. A NOR gate 3032 applies its output directly to a first input of the NAND gate 3030 and through a positive-edge delay circuit 3034, an inverter 3036, and an enabled NOR gate 3038 to the second input of the NAND gate 3030. A four bit synchronization count CNT<0:3> generated by a decrementing time-out counter 3040 is applied to the inputs of the NOR gate 3032. The decrementing time-out counter 3040 is clocked by clock signals derived from the clock signals CLK, CLK90 and sequentially decrements the count CNT<0:3> when enabled, as will be described in more detail below. When the synchronization count CNT<0:3> equals 0000, the NOR gate 32 drives its output high, and this high output is applied immediately to one input of the NAND gate 3030 and after the predetermined delay time of the positive-edge delay circuit 3034 to the second input of the NAND gate 3030, which, in turn, drives its output low. Assuming the $\overline{\text{RESET}}$ signal is inactive high, as it is during normal operation of the initialization detector 204, the NAND gate 3028 applies an active high reset signal to the RS flip-flop 3000 when the output of the NAND gate 3030 goes low in response to the NOR gate 3032 driving its output high when the synchronization count CNT<0:3> equals 0000.

The decrementing time-out counter 3040 includes four count circuits 3042–3048 that are clocked by a first pair of complementary clock signals CLK0, $\overline{\text{CLK0}}$ and a second pair of complementary clock signals CLK1, $\overline{\text{CLK1}}$. A NAND gate 3050 receives the clock signals CLK, CLK90 generated by the quadrature circuit 200 (FIG. 5) and applies its output through series connected inverters 3052 and 3054 to generate the clock signals CLK0, $\overline{\text{CLK0}}$. When both the clock signals CLK, CLK90 are high, the NAND gate 3050 drives its output low clocking the count circuits 3042–3048 with the clock signals CLK0, $\overline{\text{CLK0}}$. A NOR gate 3056 receives the CLK, CLK90 clock signals on respective inputs and applies its output through series connected inverters 3058 and 3060 to develop the clock signals CLK1, $\overline{\text{CLK1}}$. When both the CLK, CLK90 signals are low, the NOR gate 3056 drives its output high clocking the count circuits 3042–3048 with the CLK1, $\overline{\text{CLK1}}$ signals. The count circuits 3042–3048 receive the $\overline{\text{RESET}}$ signal applied through an inverter 3062 on respective reset terminals, and each count circuit resets its respective count bit low when the $\overline{\text{RESET}}$ signal goes active low.

The respective count bits CNT<0:3> are fed back to complementary inputs A, $\overline{\text{A}}$ of the respective count circuits 3042–3048 in order to cause the counter 3040 to decrement the count CNT<0:3> from 1111 to 0000 as it is clocked by the clock signals CLK0, $\overline{\text{CLK}}$ and CLK1, $\overline{\text{CLK1}}$. Accordingly, the count bit CNT<0> generated by the count circuit 3042 is fed back directly to the inputs A, $\overline{\text{A}}$ of this count circuit. A pair of NOR gates 3064 and 3066 feed the count bits CNT<0> and CNT<1> to the inputs A, $\overline{\text{A}}$ of the count circuit 3044. More specifically, the count bit CNT<0> is applied to respective first inputs of the NOR gates 3064 and 3066, and the count bit CNT<1> is applied directly to a second input of the NOR gate 3066 and through an inverter 3068 to the second input of the NOR gate 3064. When the count bit CNT<0> is a 0 and the count bit CNT <1> is a 1, both inputs of the NOR gate 3064 are low and the NOR gate applies a high A input to the count circuit 3044. When both the count bits CNT<0> and CNT<1> are zeros, the NOR gate 3066 drives its output high and this high output is applied through an inverter 3070 to apply a low $\overline{\text{A}}$ to the count circuit 3044.

Similarly, a pair of NOR gates 3072 and 3074 generate the A, $\overline{\text{A}}$ inputs of the count circuit 3046 in response to the count bits CNT<0:2>. More specifically, the CNT<0> and CNT<1> bits are applied directly to respective inputs of the NOR gates 3072 and 3074, and the CNT<2> is applied directly to an input of the NOR gate 3074 and through an inverter 3076 to an input of the NOR gate 3072. When the count bits CNT<0> and CNT<1> are both zeros, and the CNT<2> bit is a 1, the NOR gate 3072 receives three low inputs and accordingly applies a high A input to the count circuit 3046. When the count bits CNT<0:2> are all zeros, the NOR gate 3074 drives its output high and this high output is applied through an inverter 3078 to supply a low $\overline{\text{A}}$ input to the count circuit 3046.

A pair of NOR gates 3080 and 3082 generate the A, $\overline{\text{A}}$ inputs for the count circuit 3048 in response to all four count bits CNT<0:3>. More specifically, the CNT<0> bit is applied directly to respective inputs of the NOR gates 3080 and 3082, and the CNT<3> bit is applied directly and through an inverter 3084 to inputs of the NOR gates 3080 and 3082, respectively. The count bits CNT<1> and CNT<2> are applied through a NOR gate 3086 and inverter 3088 to respective inputs of the NOR gates 3080 and 3082. When the count bits CNT<0:3> are all zeros, the NOR gate 3080 receives three low inputs and accordingly drives its output high, and this high output is applied through an inverter 3090 to generate a low $\overline{\text{A}}$ input for the count circuit 3048. When the count bits CNT<0:2> are all zeros, and the count bit CNT<3> is a 1, the NOR gate 3082 receives three low inputs and accordingly applies a high A input to the count circuit 3048.

Each of the count circuits 3042–3048 further receives a pair of complementary enable signals generated by a NOR gate 3092. More specifically, the output of the NOR gate 3092 is applied through an inverter 3094 to respective ground enable inputs $\overline{\text{GNDEN}}$ of the count circuits 3042–3048. Similarly, the output of the NOR gate 3092 is applied through the inverter 3094 and an inverter 3096 to respective set inputs $\overline{\text{S}}$ and supply voltage enable inputs VCCEN of the count circuits 3042–3048. When the output of the NOR gate 3092 is high, the inverter 3094 drives the $\overline{\text{GNDEN}}$ inputs active low and the inverter 3096 drives the VCCEN inputs active high thereby enabling the count circuits 3042–3048 to generate the count CNT<0:3> in response to the CLK0 and CLK1 signals as previously described. Note that when the VCCEN input of the respective count circuits 3042–3048 is active high the respective $\overline{\text{S}}$ inputs are inactive low. When the output of the NOR gate 3092 is low, the inverters 3094 and 3096 drive the $\overline{\text{GNDEN}}$ and VCCEN inputs inactive high and low, respectively, thereby disabling the count circuits 3042–3048. In addition, when the VCCEN input is inactive low, the $\overline{\text{S}}$ input is active low, which sets the count circuits 3042–3048 causing each of the count circuits to set its count bit equal to 1, such that collectively the count CNT<0:3> is set to 1111. The NOR gate 3092 receives the set input and the output of the RS flip-flop 3000 on respective first and second inputs, and receives the output from a pulse generator 3098 through an inverter 3100 on a third input. The pulse generator 3098 generates a low pulse having a fixed duration on its output in response to a falling-edge transition on its input, which is generated by an inverter 3102 in response to the set input of the RS flip-flop 3000 going high.

In operation, the initialization detector 204 operates in one of three modes, a reset mode, detection mode, and a time-out mode. The reset mode of operation is characterized by the $\overline{\text{RESET}}$ signal going active low. When the $\overline{\text{RESET}}$ signal goes active low, the NAND gate 3028 drives the reset input of the RS flip-flop 3000 active high. At the same time, the low $\overline{\text{RESET}}$ signal is coupled through the positive-edge delay circuit 3018 and inverter 3020 to apply a high input to the NOR gate 3012 which, in turn, drives the set input of the RS flip-flop 3000 inactive low. Thus, the RS flip-flop 3000 is reset in response to the active reset input and inactive set input, and accordingly latches its output from the NOR gate 3004 high. The high output from the NOR gate 3004 drives the CAL signal inactive low, and is also applied to the NOR gate 3092 which, in turn, drives its output low deactivating the $\overline{\text{GNDEN}}$ and VCCEN inputs applied to the count circuits 3042–3048. In addition, as previously discussed, when the VCCEN input is inactive low, the $\overline{\text{S}}$ input is active low thereby setting the count circuits 3042–3048 which, in turn, set the count CNT<0:3> to 1111.

Upon termination of the reset mode of operation, which is signaled by the $\overline{\text{RESET}}$ signal going inactive high, the initialization detector 204 begins operation in the detection mode. At this point, it is initially assumed the FLAG bits F<0> and F<1> are not both high, and in this situation, the RS flip-flop 3000 remains in its reset state as it was at the end of the reset mode of operation, although the high $\overline{\text{RESET}}$ signal enables the positive-edge delay circuit 3018.

At this point, the initialization detector 204 monitors the FLAG bits F<0> and F<1> to detect when both these bits are high, which, as previously described, signals the initialization mode of operation of the memory device 16a (FIG. 3) containing the initialization detector 204. Notice that at this point, the CAL signal remains inactive low, causing the NAND gate 3024 to apply a high input to the NAND gate 3026 which, in turn, applies a low output to the NOR gate 3014. At this point, the NOR gate 3014 receives two low inputs and maintains its output high. When both the FLAG bits F<0> and F<1> go high, the AND gate 3022 applies a high output to the NOR gate 3014 which, in turn, drives its output low. In response to the output of the NOR gate 3014 going low, one input of the NOR gate 3012 goes low immediately, and the other input goes low the predetermined delay time of the positive-edge delay circuit 3018 later. Thus, the predetermined delay time of the positive-edge delay circuit 3018 after the output of the NOR gate 3014 goes low, both inputs of the NOR gate 3012 are low causing the NOR gate 3012 to drive the set input of the RS flip-flop 3000 active high. The active set input sets the RS flip-flop 3000 which latches its output from the NOR gate 3004 low. When the RS flip-flop 3000 is set, the low output from the NOR gate 3004 drives the CAL signal active high signaling the beginning of the initialization mode of operation. The active high CAL signal also enables the NAND gate 3024. It should be noted that when the NOR gate 3012 drives the set input active high, the inverter 3102 applies a falling-edge transition on its output to the pulse generator 3098 which, in turn, generates a low output pulse causing the inverter 3100 to apply a high pulse to the NOR gate 3092. The function of the inverter 3102, pulse generator 3098, and inverter 3100 are to ensure that the NOR gate 3092 maintains its output low for a predetermined time after the set input goes active high. By maintaining the output of the NOR gate 3092 low, the $\overline{\text{GNDEN}}$ and VCCEN inputs are held inactive for at least the duration of the pulse generated by the pulse generator 3098.

After the CAL signal goes active in response to the RS flip-flop 3000 being set, the initialization detector 204 commences operation in the time-out mode. During the time-out mode, the initialization detector 204 monitors the bit sequence on the FLAG line to detect whether any of the latched FLAG bits are binary ones. Recall, that during the initialization mode of operation, the memory controller 18 (FIG. 1) applies the 15-bit pseudo-random bit sequence on the FLAG bit as previously shown and described with reference to table 1. Referring back to table 1, it is seen that during the initialization mode of operation, no more than 3 consecutive latched FLAG bits may be binary zeros before a binary 1 is latched for the FLAG bit. The fact that during the initialization mode of operation a binary 1 is applied on the FLAG bit at least once for each group of four consecutive FLAG bits is utilized by the initialization detector 204 to deactivate the CAL signal and thereby take the memory device 16a out of the initialization mode of operation, as will now be described in more detail.

As previously described, when the RS flip-flop 3000 is set activating the CAL signal operation in the time-out mode commences. When the RS flip-flop 3000 is set, the NOR gate 3004 drives its output low and this low output is applied to one input of the NOR gate 3092. Furthermore, when the output of the NOR gate 3014 is high, the NOR gate 3012 drives its output low, and this low output causes both other inputs of the NOR gate 3092 to also go low. At this point, the NOR gate 3092 receives three low inputs and drives its output high, causing the inverters 3094 and 3096 to activate the $\overline{\text{GNDEN}}$ and VCCEN inputs, respectively, and thereby enable the count circuits 3042–3048 of the decrementing time-out counter 3040. As long as the RS flip-flop 3000 is set and the NOR gate 3012 maintains its output low, the counter 3040 is enabled and decrements the four bit count CNT<0:3> in response to the clock signals CLK0, $\overline{\text{CLK0}}$ and CLK1, $\overline{\text{CLK1}}$.

At this point, the decrementing time-out counter 3040 decrements the count CNT<0:3> starting from the count 1111 as it is clocked by the clock signals CLK0, $\overline{\text{CLK0}}$ and CLK1, $\overline{\text{CLK1}}$. Once the count CNT<0:3> has been decremented to a value of 0000, the NOR gate 3032 drives its output high which, after the predetermined delay of the positive-edge delay circuit 3034, results in the NAND gate 3030 receiving two high inputs. In response to both its inputs going high, the NAND gate 3030 applies a low output to the NAND gate 3028 which, in turn, drives its output high resetting the RS flip-flop 3000. As previously discussed, when the RS flip-flop 3000 is reset, the NOR gate 3004 drives its output high, deactivating the CAL signal signaling the termination of the initialization mode of operation.

The previously described operation of the decrementing time-out counter 3040 occurs when a predetermined number of FLAG bits have been latched for the FLAG bit without a binary 1 being latched, as will now be described in more detail. As previously described, after the RS flip-flop 3000 is set activating the CAL signal, the NOR gate 3012 drives its output low resulting in the NOR gate 3092 driving its output high to thereby activate the $\overline{\text{GNDEN}}$ and VCCEN inputs and thereby enable the decrementing time-out counter 3040. The NOR gate 3012 maintains its output low as long as the output of the NOR gate 3014 is high. During the time-out mode of operation, the NOR gate 3014 maintains its output high until the F<0> bit equals a binary 1. This is true because when the F<0> bit equals a binary 1, the NAND gate 3024 receives two high inputs and accordingly drives its output low. When the output of the NAND gate 3024 goes low, the NAND gate 3026 applies a high input to the NOR gate 3014 which, in turn, drives its output low. As previously described, the low output from the NOR gate 3014 results in both inputs of the NOR gate 3012 going low, causing the NOR gate 3012 to drive its output high which, in turn, causes the NOR gate 3092 to drive its output low deactivating the $\overline{\text{GNDEN}}$ and VCCEN inputs and thereby disabling the decrementing time-out counter 3040.

Thus, during the time-out mode of operation, when the F<0> bit equals a binary 1, the decrementing time-out counter 3040 is disabled and accordingly stops decrementing its count CNT<0:3>. Moreover, when the decrementing time-out counter 3040 is disabled, the count CNT<0:3> is also set to the value 1111 such that the counter 3040 begins decrementing from this value the next time it is enabled.

This is true because as previously described, the set inputs $\overline{S}$ of the count circuits 3042–3048 are coupled to the VCCEN inputs, and thus when the VCCEN input goes inactive low, the set input $\overline{S}$ goes active low, setting the respective count bits CNT<0:3> to 1111.

In summary, during the time-out mode of operation, the time-out counter 3040 decrements the count CNT<0:3> starting from the value 1111 whenever the FLAG bit F<0> is a binary 0. If the count CNT<0:3> is decremented to a value of 0000, the RS flip-flop 3000 is reset deactivating the CAL signal signaling the end of the initialization mode of operation. However, if the F<0> bit equals a binary 1 before the counter 3040 decrements the count CNT<0:3> to 0000, the counter 3040 stops decrementing this count and resets the count back to a value of 1111. In this way, the initialization detector 204 detects when a predetermined, consecutive number of F<0> bits are binary zeros, which signals the end of the initialization mode of operation, and upon detecting such a condition, resets the RS flip-flop 3000 deactivating the CAL signal and thereby terminating the initialization mode of operation.

Figure 9:
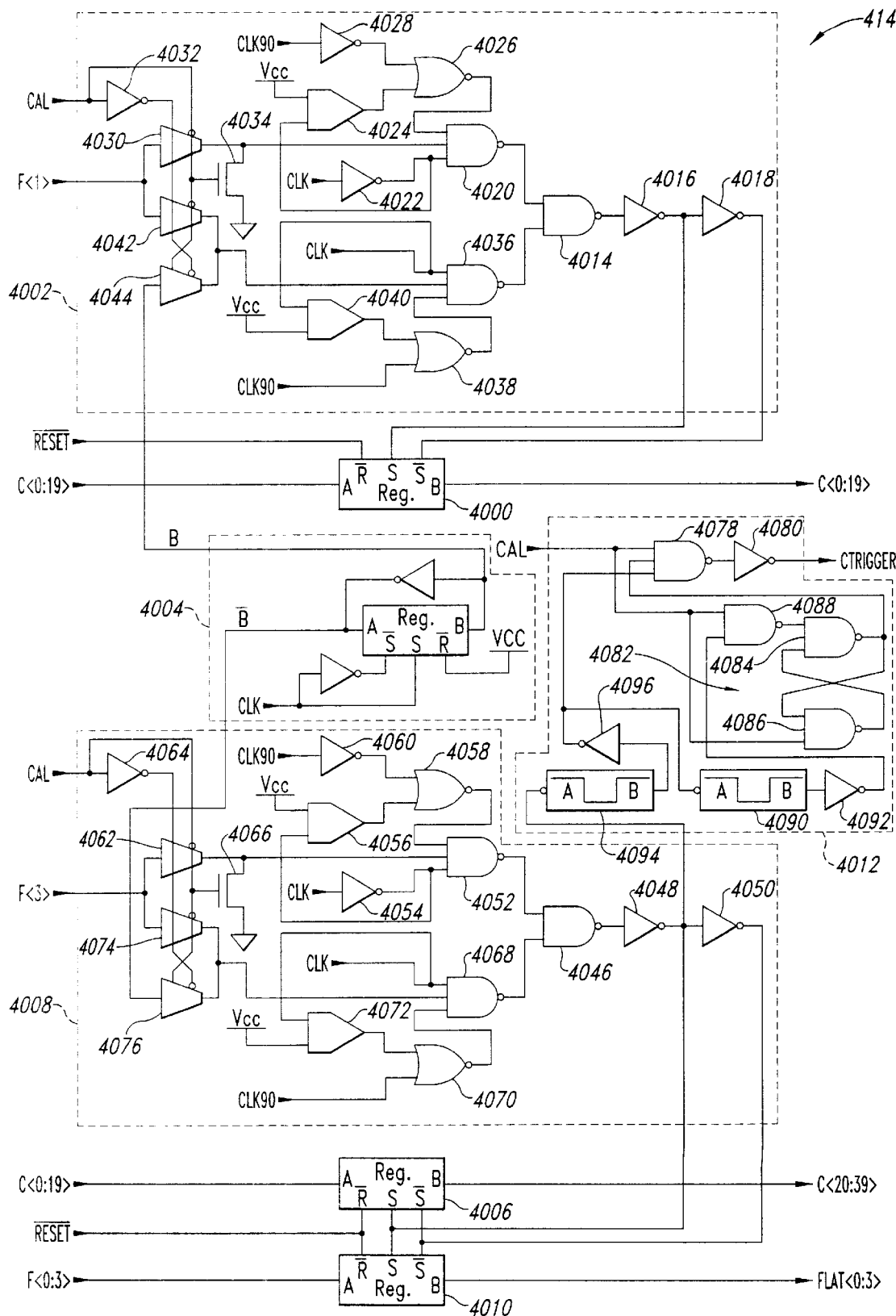
FIG. 9 is a schematic of the storage register of FIG. 5.

FIG. 9 is a logic diagram of one embodiment of the storage register 414 of FIG. 4A. The storage register 414 includes a first 20-bit register 4000 that latches the 20-bit partial command word C<0:19> output from the shift register 412 (FIG. 4A) and outputs this latched partial command word as the first half of the 40-bit command word C<0:39>. A clocking circuit 4002 generates complementary clock signals that clock the register 4000 in response to the calibration signal CAL, FLAG bit F<1>, and a clock signal B generated by a clock generator 4004, as will be described in more detail below. A second 20-bit register 4006 also latches the partial command words C<0:19> output from the shift register 412 (FIG. 4A) and outputs the latched partial command word as the second half of the 40-bit command word C<0:39>. A clocking circuit 4008 generates complementary clock signals that clock the register 4006 in response to the calibration signal CAL, FLAG bit F<3>, and a complementary clock signal $\overline{B}$ generated by the clock generator 4004, as will also be discussed in more detail below. The clocking circuit 4008 also clocks a 4-bit register 4010 which latches the four FLAG bits F<0:3> latched by the control circuit 416 (FIG. 4A) and outputs these four latched FLAG bits as the flag-latched word FLAT<0:3>. The storage register 414 further includes a pulse generation circuit 4012 that generates the CTRIGGER pulse in response to the CAL signal and one of the complementary clock signals developed by the clocking circuit 408. Recall, the CTRIGGER pulse clocks the initialization sequencer 430 (FIG. 4B) during the initialization mode of operation.

The clocking circuit 4002 includes a NAND gate 4014 that applies its output through series connected inverters 4016 and 4018 to generate the complementary clock signals for clocking the 20-bit register 4000. A NAND gate 4020 applies its output to one input of the NAND gate 4014 in response to the clock signals CLK, CLK90, and the FLAG bit F<1>, as will now be explained in more detail. The clock signal CLK is applied through an inverter 4022 to a first input of the NAND gate 4020. A positive-edged delay circuit 4024 applies a high output to one input of a NOR gate 4026, a predetermined delay time after receiving a positive-edged transition from the inverter 4022, and drives its output low without such delay in response to a falling-edge transition from the inverter 4022. The clock signal CLK90 is applied through an inverter 4028 to the second input of the NOR gate 4026, and the NOR gate drives its output high when both its inputs are low and thereby enables the NAND gate 4020. A pass gate 4030 applies the FLAG bit F<1> on a third input of the NAND gate 4020 in response to the calibration signal CAL applied directly and through an inverter 4032 on its control inputs. When the CAL signal is inactive low, the pass gate 4030 turns ON applying the F<1> bit to the NAND gate 4020 to thereby enable the NAND gate when the F<1> bit is high. In contrast, when the CAL signal is active high, signaling operation in the initialization mode, the pass gate 4030 turns OFF isolating the F<1> bit from the NAND gate 4020. In this situation, an NMOS transistor 4030 receiving the CAL signal on its gate couples the output of the pass gate 4030 to ground, thereby disabling the NAND gate 4020 which, in turn, drives its output high enabling the NAND gate 4014.

The clocking circuit 4002 further includes a NAND gate 4036 applying its output to the second input of the NAND gate 4014. The NAND gate 4036 receives the clock signal CLK on a first input and the output from a NOR gate 4038 on a second input. A positive-edge delay circuit 4040 applies a high output to the NOR gate 4038 a predetermined delay time after receiving a positive-edge transition of the CLK signal, and drives its output low without such delay in response to a falling-edge transition of the CLK signal. The NOR gate 4038 also receives the CLK90 signal on a second input and drives its output high, enabling the NAND gate 4036 when both the CLK90 signal and the output of the positive-edge delay circuit 4040 are low. A pass gate 4042 operates in parallel with the pass gate 4030 to apply the FLAG bit F<1> on a third input of the NAND gate 4036 when the CAL signal is inactive low. When the CAL signal is active high, the pass gate 4042 turns OFF, isolating the F<1> bit from the NAND gate 4036. A pass gate 4044 has its output coupled to the output of the pass gate 4042 and operates in a complementary manner to the pass gate 4042 to apply the clock signal B generated by the clock generator 4004 to the NAND gate 4036. Thus, when the CAL signal is inactive low, the pass gate 4044 turns OFF and pass gate 4042 turns ON, applying the F<1> bit to the NAND gate 4036. In contrast, when the CAL signal is active high during the initialization mode, the pass gate 4042 turns OFF and pass gate 4044 turns ON, applying the clock signal B to the NAND gate 4036.

In operation, the clocking circuit 4002 operates in one of two modes, a normal mode and an initialization mode. The normal mode is characterized by the CAL signal being inactive low, which turns OFF the pass gate 4044 and turns ON the pass gates 4030 and 4042, applying the F<1> bit to the NAND gates 4020 and 4036, respectively. As previously described, during the normal mode of operation a single high FLAG bit is applied coincident with the first packet word CA<0> of a command packet CA<0>, and this high flag bit is then shifted through stages of the control circuit 416 (FIG. 4A) and utilized to generate various control signals for controlling the memory device 16a (FIG. 3). During the normal mode of operation, the F<1> bit goes high just after the first two packet words CA<0> have been latched by the shift register 412 (FIG. 4A) and are being output by this shift register 412 as the partial command word C<19>. In this way, the clocking circuit 4002 utilizes the F<1> bit to enable the NAND gates 4020 and 4036 to cause the NAND gate 4014 to pulse its output low which, in turn, clocks the 20-bit register 4000 to thereby latch the partial command word C<0:19> output from the shift register 412 (FIG. 4A).

More specifically, when the F<1> bit is high, the NAND gate 4020 pulses its output low in response to each falling edge of the CLK signal. When the NAND gate 4020 pulses its output low, the NAND gate 4014 pulses its output high and this high pulse is applied through the inverters 4016 and 4018 to clock the register 4000. Similarly, the NAND gate 4036 pulses its output low in response to each rising edge of the CLK signal. When the NAND gate 4036 pulses its output low, the NAND gate 4014 pulses its output high and this high pulse is applied through the inverters 4016 and 4018 to clock the register 4000. During normal operation, only one of the NAND gates 4020 and 4036 will be enabled by the high F<1> bit to pulse its output low and thereby clock the register 4000. Both the NAND gates 4020 and 4036 are utilized, however, so that the register 4000 may be clocked in response to either the falling or rising edges of the CLK signal, depending upon when the F<1> bit was latched relative to the CLK signal.

During the initialization mode of operation, the CLK signal is active high turning OFF the pass gates 4030 and 4042 and turning ON the pass gate 4044. When the CAL signal is active high, the transistor 4034 turns ON coupling the corresponding input of the NAND gate 4020 to ground. When the transistor 4034 turns ON, the NAND gate 4020 drives its output high enabling the NAND gate 4014. As previously described, when the pass gate 4044 turns ON, the clock signal B generated by the clock generator 4004 is applied through the pass gate 4044 to the NAND gate 4036. The NAND gate 4036, as it did during the normal mode of operation, pulses its output low in response to the rising-edge of the CLK signal when the clock signal B is high. In response to the NAND gate 4036 pulsing its output low, the NAND gate 4014 once again generates a high pulse on its output causing the inverters 4016 and 4018 to clock the first two packet words CA<0:9> shifted into the shift register 412 (FIG. 4A) just as it does during the normal mode of operation.

It should be noted that the FLAG bit F<1> cannot be utilized as it was during the normal mode of operation during the initialization mode because the 15-bit pseudo-random bit sequence is applied on the FLAG bit. More specifically, during the normal mode of operation the FLAG bit goes high coincident with the first packet word CA<0:9> of an applied command packet CA<0:9>. In contrast, during the initialization mode the FLAG bit latched coincident with each packet word CA<0:9> may be high thereby causing the register 4000 to be latched at improper times if only the FLAG bit F<1> is utilized by the clocking circuit 4002. Thus, the clocking circuit 4002 utilizes the clock signal B generated by the clock generator 4004 during the initialization mode of operation in order to shift the first two packet words CA<0:9> of a command packet CA<0:39> into the register 4000 at the proper time.

The clocking circuit 4008 includes components 4046–4076 corresponding to the components 4014–4044, respectively, of the clocking circuit 4002. The components 4046–4076 of the clocking circuit 4008 are interconnected and operate identically to the corresponding components previously described with reference to the clocking circuit 4002, and thus, for the sake of brevity, these components will not be described in further detail. The clocking circuit 4008 also operates in either the normal mode or the initialization mode, as determined by the CAL signal. When the CAL signal is inactive low, the clocking circuit 4008 operates in the normal mode. As previously described, during the normal mode of operation, the F<1> bit goes high just after the first two packet words CA<0:9> of a command packet CA<0:39> have been shifted into the shift register 412 (FIG. 4A). One cycle or two transitions of the ICLK signal later, the high F<1> bit has been shifted to the F<3> bit, which occurs just after the third and fourth packet words CA<0:9> of a command packet CA<0:39> have been shifted into the shift register 412 (FIG. 4A). Thus, during the normal mode of operation, the F<3> bit is applied through the turned ON pass gates 4062 and 4074 to the NAND gates 4052 and 4068, respectively. When the F<3> bit goes high, one of the NAND gates 4052 and 4068 pulses its output low as previously described for the NAND gates 4020 and 4036 of the clocking circuit 4032, resulting in the NAND gate 4046 pulsing its output high causing the inverters 4048 and 4050 to clock the third and fourth packet words CA<0:9> output from the shift register 412 (FIG. 4A) as the partial command word CA<0:19> into the 20-bit register 4006. In addition, coincident with latching the partial command word C<0:19> corresponding to the second half of the command packet CA<0:39>, the clocking circuit 4008 clocks the 4-bit register 4010 to latch the four FLAG bits F<0:3> output from the control circuit 416 (FIG. 4A).

During the initialization mode of operation, the pass gates 4062 and 4074 turn OFF and pass gate 4076 turns ON applying the clock signal $\overline{B}$ generated by the clock generator 4004 to the NAND gate 4068. The circuitry in the clocking circuit 4008 thereafter operates identically to that previously described with reference to the clocking circuit 4002 to latch the third and fourth packet words CA<0:9> output from the shift register 412 (FIG. 4A) in the form of the partial command word C<0:19> and four FLAG bits F<0:3> when the clock signal $\overline{B}$ is high, and in response to a rising-edge transition of the CLK signal. In this way, the clocking circuit 4008 latches the third and fourth packet words CA<0:9> of a command packet CA<0:39> at the proper time even though the values of the FLAG bit do not correspond to those applied during the normal mode of operation.

The pulse generation circuit 4012 utilizes the clock signal output from the inverter 4048 to develop the CTRIGGER signal during the initialization mode of operation, as will now be described in more detail. A NAND gate 4078 applies its output through an inverter 4080 to develop the CTRIGGER signal. The NAND gate 4078 receives the CAL signal on a first input and is enabled when this signal is active high during the initialization mode of operation. An RS flip flop 4082 includes cross-coupled NAND gates 4084 and 4086 and applies its output from the NAND gate 4084 to a second input of the NAND gate 4078. The RS flip flop 4082 receives the CAL signal on a reset input and a set input output from a NAND gate 4088 in response to the CAL signal and the output from a pulse generator 4090 applied through an inverter 4092. When the CAL signal goes low, the RS flip flop 4082 is reset latching the output from the NAND gate 4084 low to thereby disable the NAND gate 4078. When the CAL signal is active high and the pulse generator 4090 generates a low output pulse, the NAND gate 4088 drives its output low setting the RS flip flop 4082, which latches its output from the NAND gate 4084 high thereby enabling the NAND gate 4078. A pulse generator 4094 applies its output through an inverter 4096 to the third input of the NAND gate 4078 and to the input of the pulse generator 4090. The pulse generator 4094 receives the clock signal from the inverter 4048 of the clocking circuit 4008, and generates a low pulse on its output in response to a falling-edge transition on the output of the inverter 4048, which occurs when the clocking circuit 4008 clocks the registers 4006 and 4010.

In operation, the pulse generation circuit 4012 operates in one of two modes, a normal mode and an initialization mode. When the CAL signal is inactive low during the normal mode of operation, the RS flip flop 4082 is reset latching its output from the NAND gate 4084 low. During the normal mode of operation, the pulse generation circuit 4012 generates no CTRIGGER pulses in response to the clocking circuit 4008 clocking the registers 4006 and 4010. In other words, the low CAL signal disables the NAND gates 4078 and 4088 such that although the pulse generators 4094 and 4090 generate output pulses in response to a falling-edge transition on the output of the inverter 4048, the pulse generation circuit 4012 generates no CTRIGGER pulse during the normal mode of operation.

When the CAL signal goes active high, the pulse generation circuit 4012 operates in the initialization mode of operation. The high CAL signal enables the NAND gate 4078 and NAND gate 4088. Notice that when the CAL signal first goes active high, the RS flip flop 4082 has been reset and maintains its output from the NAND gate 4084 low thereby disabling the NAND gate 4078 even though the CAL signal has gone high. The first time the clocking circuit 4008 clocks the registers 4006 and 4010 after the CAL signal goes active high, the pulse generator 4094 generates a low output pulse which is applied through the inverter 4096 to the NAND gate 4078. At this point, the output of the RS flip flop 4082 is low disabling the NAND gate 4078 such that no CTRIGGER pulse is generated in response to the output from the pulse generator 4094. When the pulse generator 4094 drives its output high terminating its generated output pulse, the inverter 4096 drives its output low causing the pulse generator 4090 to generate a low pulse on its output. The low pulse output from the pulse generator 4090 is applied as a high output pulse from the inverter 4092 to the NAND gate 4088.

At this point, the NAND gate 4088 receives two high inputs and accordingly drives its output low setting the RS flip flop 4082 which, in turn, latches its output from the NAND gate 4084 high thereby enabling the NAND gate 4078. Thus, when the clocking circuit 4008 clocks the registers 4006 and 4010 after the CAL signal goes active, the RS flip flop 4082 is set enabling the NAND gate 4078, but no CTRIGGER pulse is generated. The pulse generation circuit 4012 thereafter generates a CTRIGGER pulse each time the clocking circuit 4008 clocks the registers 4006 and 4010, which occurs each time the third and fourth packet words CA<0:9> of a command packet CA<0:39> have been latched. More specifically, during the initialization mode of operation, each time the shift register 412 (FIG. 4A) has latched the third and fourth packet words CA<0:9> of an applied command packet CA<0:39>, the clocking circuit 4008 clocks the registers 4006 and 4010, loading the latched third and fourth packet words output from the shift register 412 (FIG. 4A) along with the four latched FLAG bits F<0:3> output from the control circuit 416 (FIG. 4A). Each time the clocking circuit 4008 clocks the registers 4006 and 4010 during the initialization mode of operation, the pulse generation circuit 4012 generates the CTRIGGER pulse which clocks the initialization sequencer 430 (FIG. 4B) after each command packet CA<0:39>has been captured, as previously described.

Figure 10:
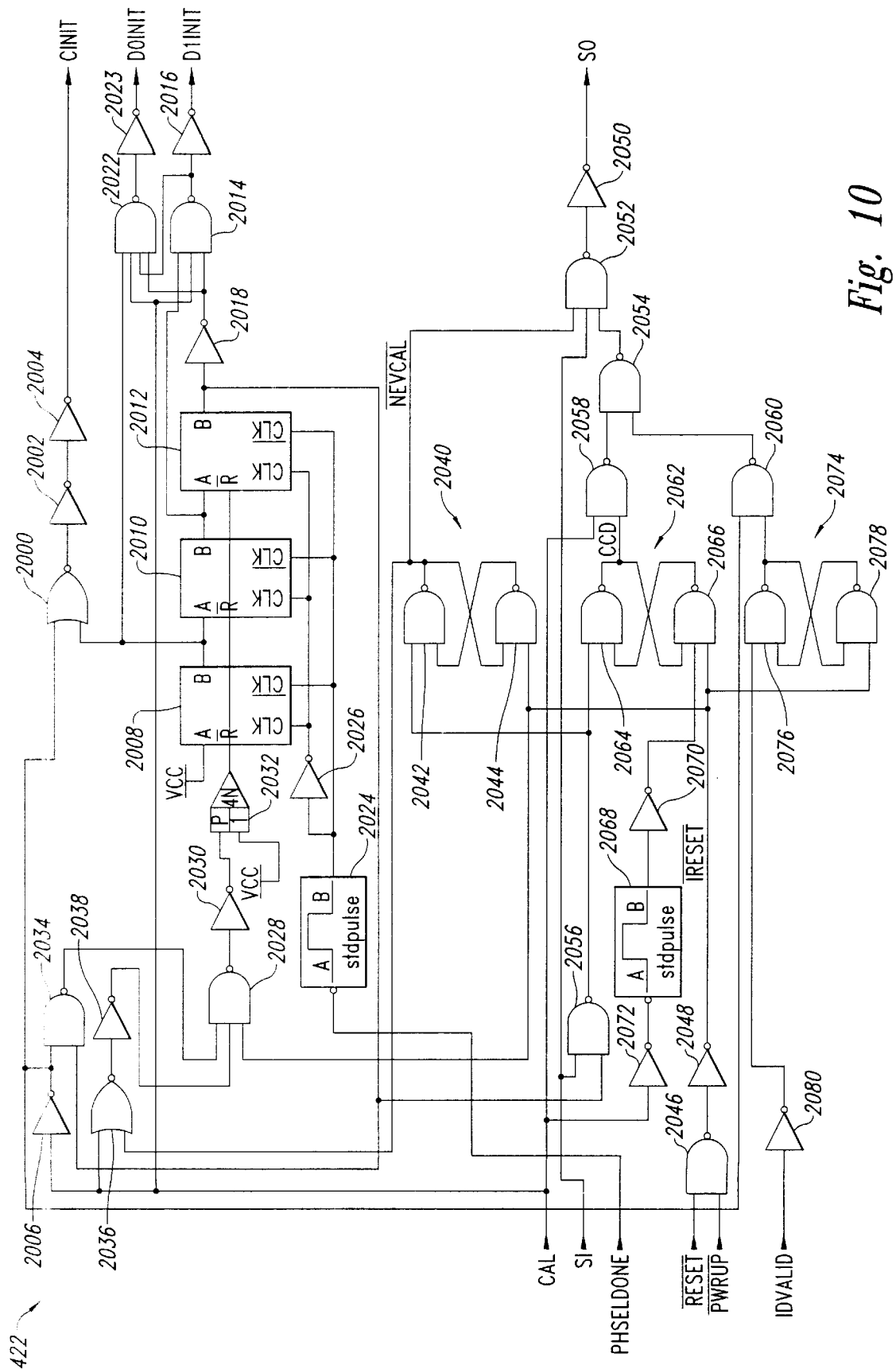
FIG. 10 is a schematic of the clock-domain control circuit of FIG. 4.

FIG. 10 is a schematic of the clock-domain control circuit 422 according to one embodiment of the present invention. As previously described, the clock-domain control circuit 422 sequentially activates the CINIT, D0INIT, and D1INIT signals in response to a number of signals to control synchronization of the three clock domains defined by the clock signals CCLK, DCLK0, and DCLK1, as will now be explained in more detail. The clock-domain control circuit 422 includes a NOR gate 2000 having its output coupled through series connected inverters 2002 and 2004 to develop the CINIT signal. The CAL signal is applied through an inverter 206 to a first input of the NOR gate 2000, and a register 2008 applies its output to a second input of the NOR gate 2000. When the CAL signal is active high and the output of the register 2008 is low, the NOR gate 2000 drives its output high which, in turn, drives the CINIT signal active high. The clock-domain control circuit 422 further includes registers 2010 and 2012, with the registers 2008–2012 having their inputs and outputs coupled in series between a supply voltage source $V_{CC}$ and an input of an inverter 2018.

A NAND gate 2022 has its output coupled through an inverter 2023 to develop the D0INIT signal. The NAND gate 2022 receives the output of the register 2008 on a first input, the CAL signal on a second input, the output of a NAND gate 2014 on a third input, and the output of the register 2012 coupled through the inverter 2018 on a fourth input. If all these inputs are high, the NAND gate 2022 drives its output low and the inverter 2023, in turn, drives the D0INIT signal active high. The NAND gate 2014 has its output coupled through an inverter 2016 to develop the D1INIT signal in response to the output of the inverter 2018, the CAL signal, and the output of the register 2010 applied on respective inputs. When all these inputs are high, the NAND gate 2014 drives its output low causing the inverter 2016 to drive the D1INIT signal active high.

A pulse generator 2024 applies its output directly and through an inverter 2026 to clock the registers 2008–2012. The pulse generator 2024 receives the PHSELDONE signal on its input and generates a positive pulse of a fixed duration on its output in response to the falling-edge transition of the PHSELDONE signal. Recall, the PHSELDONE signal is generated by the initialization phase selector 436 (FIG. 4B) whenever the phase selector has determined the optimum phase for the clock domain currently being synchronized. The registers 2008–2012 are reset in response to an output of a positive-edge delay circuit 2032. The registers 2008–2012 are conventional registers that drive their outputs low in response to the signals on their reset terminals going active low, and circuitry for implementing the function of these registers is well understood by those skilled in the art. A NAND gate 2028 applies its output through an inverter 2030 to the input of the positive-edge delay circuit 2032. The positive-edge delay circuit 2032 drives its output high a predetermined time after a positive edge transition on the output of the inverter 2030, and drives its output low without such a delay in response to a falling-edge transition on the output of the inverter 2030. The NAND gate 2028 receives three inputs and whenever one or more of these inputs goes inactive low the NAND gate 2028 drives its output high resetting the registers 2008–2012. The positive-edge delay circuit 2032 ensures that the reset signal applied to the registers 2008–2012 stays active low for at least its delay time, even if the output of the NAND gate 2028 remains high for a shorter duration.

A NAND gate 2034 applies its output to one input of the NAND gate 2028, and receives the inverted CAL signal from the inverter 2006 on a first input and the output of the register 2012 on a second input. When the CAL signal is inactive low and the output of the register 2012 is high the NAND gate 2034 applies a low output to the NAND gate 2028 which, in turn, drives its output high resetting the registers 2008–2010. A NOR gate 2036 applies its output through an inverter 2038 to a second input of the NAND gate 2028. The NOR gate 2036 receives the CAL signal on a first input and a never calibrated signal $\overline{\text{NEVCAL}}$ on a second input. The $\overline{\text{NEVCAL}}$ signal is generated by an RS flip-flop 2004 including cross-coupled NAND gates 2042 and 2044. When both the CAL and $\overline{\text{NEVCAL}}$ signals are low, the NOR gate 2036 drives its output high causing the inverter 2038 to apply a low signal to the NAND gate 2028 which, in turn, drives its output high resetting the registers 2008–2012. A NAND gate 2046 applies its output to an inverter 2048 which, in turn, applies an internal reset signal $\overline{\text{IRESET}}$ to the final input of the NAND gate 2028. The NAND gate 2046 receives a reset signal $\overline{\text{RESET}}$ and power up signal $\overline{\text{PWRUP}}$ on respective inputs, and drives its output high when either of the signals goes active low. In response to the output of the NAND gate 2046 going high, the inverter 2048 drives the $\overline{\text{IRESET}}$ signal active low causing the NAND gate 2028 to drive its output high, resetting the registers 2008–2012.

The clock-domain control circuit 422 further includes an inverter 2050 that develops the select output signal SO in response to the output from a NAND gate 2052. As mentioned above, the SO signal goes active high once all three clock domains CCLK, DCLK0, and DCLK1 have been successfully synchronized. The NAND gate 2052 receives the $\overline{\text{NEVCAL}}$ signal on a first input, a select input signal SI on a second input, and the output from a NAND gate 2054 on a third input. When all of its inputs are high, the NAND gate 2052 applies a low output to the inverter 2050 which, in turn, activates the SO signal. The RS flip-flop 2040 develops the $\overline{\text{NEVCAL}}$ signal in response to an output of a NAND gate 2056 applied on its set input and the $\overline{\text{IRESET}}$ signal from the inverter 2048 applied on its reset input. When the $\overline{\text{IRESET}}$ signal goes active low, which occurs when either or both of the $\overline{\text{RESET}}$ or $\overline{\text{PWRUP}}$ signals applied to the NAND gate 2046 go active low, the RS flip-flop 2040 latches the $\overline{\text{NEVCAL}}$ signal active low. Conversely, the RS flip-flop 2040 latches the $\overline{\text{NEVCAL}}$ signal inactive high to enable the NAND gate 2052 when the NAND gate 2056 drives its output low, which occurs when both the output of the register 2012 and the SI signal are high.

The NAND gate 2054 drives its output high, enabling the NAND gate 2052 when either of respective outputs from NAND gates 2058 and 2060 is low. The NAND gate 2058 is enabled by the CAL signal, and receives a current calibration done signal $\overline{\text{CCD}}$ from an RS flip-flop 2062 including cross-coupled NAND gates 2064 and 2066. The RS flip-flop 2062 receives a set input from the NAND gate 2056, the $\overline{\text{IRESET}}$ signal on a first reset input, and a second reset input from a pulse generator 2068 and applied through an inverter 2070. The CAL signal is applied through an inverter 2072 to the input of the pulse generator 2068, which generates a positive pulse having a fixed duration in response to a falling-edge transition on the output of the inverter 2072. In operation, the RS flip-flop 2062 is reset, latching the CCD signal inactive low when either the CAL signal goes active high or the $\overline{\text{IRESET}}$ signal goes active low. The RS flip-flop 2062 latches the CCD signal active high when the output of the NAND gate 2056 goes low.

The NAND gate 2060 receives the CAL signal applied through the inverter 2006 and the output of an RS flip-flop 2074 including cross-coupled NAND gates 2076 and 2078. An identification valid signal IDVALID is applied through an inverter 2080 to the set input of the RS flip-flop 2074, and the inverter 2048 applies the reset input to the RS flip-flop 2074. When the $\overline{\text{IRESET}}$ signal goes active low, the RS flip-flop 2074 latches its output low, and thereafter, in response to an active high IDVALID signal, the inverter 2080 outputs an active low set input causing the RS flip-flop 2074 to latch its output high. The RS flip-flop 2074 maintains its output high until reset by the $\overline{\text{INTRES}}$ signal going active low, which does not occur during normal operation of the clock-domain control circuit 422. Once the RS flip-flop 2074 has been set, this output enables the NAND gate 2060 which then drives its output low and high responsive to the CAL signal going low and high, respectively.

The overall operation of the clock-domain control circuit 422 will now be described in more detail. In operation, the clock-domain control circuit 422 operates in one of two modes, a reset mode and synchronization mode. The reset mode of operation is characterized by one or both of the $\overline{\text{RESET}}$ and $\overline{\text{PWRUP}}$ signals going active low which, in turn, drives the $\overline{\text{IRESET}}$ signal active low. In addition, it is assumed that coincident with one or both of the $\overline{\text{RESET}}$ and $\overline{\text{PWRUP}}$ signals going active low, circuitry (not shown in FIG. 20) drives the CAL and IDVALID signals inactive low. In response to the $\overline{\text{IRESET}}$ signal going low, the NAND gate 2028 drives its output high resetting the registers 2008–2012 such that each register drives its corresponding output low. In response to the respective low outputs from the registers 2008 and 2010, the NAND gates 2022 and 2014 drive their respective outputs high deactivating the D0INIT and D1INIT signals. Furthermore, in response to the low CAL signal, the NOR gate 2000 drives its output low deactivating the CINIT signal. In addition, the low $\overline{\text{IRESET}}$ signal resets the RS flip-flops 2040, 2062, and 2074 which, in turn, disable the NAND gates 2052, 2058, and 2060 respectively. At this point, the disabled NAND gate 2052 drives its output high deactivating the SO signal. In summation, during the reset mode of operation, the clock-domain control circuit 422 resets the registers 2008–2012 and the RS flip-flops 2040, 2062, 2074, and also deactivates all of the CINIT, D0INIT, D1INIT, and SO signals.

During the synchronization mode, the clock-domain control circuit 422 sequentially activates the CINIT, D0INIT, and D1INIT signals in response to the PHSELDONE signal, and thereafter activates the SO signal once all three clock domains have been synchronized, as will now be explained in more detail. The clock-domain control circuit 422 operates in two submodes during the synchronization mode, an initial synchronization submode and a partial synchronization submode. The clock-domain control circuit 422 operates in the initial synchronization submode immediately after operation in the reset mode, and thereafter operates in the partial synchronization submode. After operating in the reset mode, the clock-domain control circuit 422 enters the initial synchronization submode in response to circuitry in the SLDRAM 16*a* (FIG. 3) or another SLDRAM 16*b, c*, activating the CAL, SI and IDVALID signals. The high IDVALID signal sets the RS flip-flop 2074, enabling the NAND gate 2060. The high SI signal enables the NAND gate 2056 and also enables the NAND gate 2052 to operate responsive to the signals applied on its other two inputs. In response to the high CAL signal, the NOR gate 2000 drives its output high activating the CINIT signal. In addition, the high CAL signal enables a number of components within the clock-domain control circuit 422, and also causes the pulse generator 2068 to generate a pulse that resets the RS flip-flop 2062 if that flip-flop was previously set. During the initial synchronization submode, which by definition immediately follows the reset mode, this pulse generated by the pulse generator 2068 has no effect on the RS flip-flop 2062 since that flip-flop has just been reset during the reset mode. The generation of the pulse by the pulse generator 2068 in response to the CAL signal going high will be described in more detail below with reference to the partial synchronization submode of operation.

At this point, the clock-domain control circuit 422 applies the active high CINIT signal to a variety of components within the partial resynchronization circuit 410 (FIG. 4) and that circuit operates as previously described to synchronize the ICLK signal. As previously described with reference to FIG. 4, once the initialization phase selector 436 determines the optimum initialization phase word INITPH<0:3> to synchronize the ICLK signal, the initialization phase selector 436 pulses the PHSELDONE signal. In response to the falling edge of the PHSELDONE pulse, the pulse generator 2024 generates a pulse that clocks the registers 2008–2012, shifting the high signal applied on the input of the register 2008 to the output of that register. In response to the output of the register 2008 going high, the NOR gate 2000 drives its output low deactivating the CINIT signal. In addition, when the output of the register 2008 goes high, the NAND gate 2022, whose other three inputs were already high, drives its output low activating the D0INIT signal.

In response to the D0INIT signal going high, the partial resynchronization circuit 410 (FIG. 4) synchronizes the IDCLK0 signal as previously described. Once again, when the initialization phase selector 436 (FIG. 4) determines the optimum initialization phase word INITPH<0:3> to synchronize the IDCLK0 signal, the phase selector generates the PHSELDONE pulse. In response to the PHSELDONE pulse, the pulse generator 2024 once again clocks the registers 2008–2012, shifting the high on the input of the register 2010 to the output of that register. When the output of the register 2010 goes high, the NAND gate 2014, whose other two inputs are already high, drives its output low activating the D1INIT signal. Further in response to the output of the NAND gate 2014 going low, the NAND gate 2022 drives its output high deactivating the D0INIT signal. At this point, the partial resynchronization circuit 410 (FIG. 4) operates as previously described to synchronize the IDCLK1 signal and, once the signal has been synchronized, the initialization phase selector 436 (FIG. 4) applies the PHSELDONE pulse to the pulse generator 2024.

In response to the PHSELDONE pulse, the pulse generator 2024 once again clocks the registers 2008–2012, shifting the high on the output of the register 2010 to the output of the register 2012. In response to the output of the register 2012 going high, which indicates all three clock domains have now been synchronized, the inverter 2018 applies a low to the NAND gate 2014 which, in turn, drives its output high deactivating the D1INIT signal. Further in response to the output of the register 2012 going high, the NAND gate 2056, which now receives two high inputs, drives its output low causing the RS flip-flop 2040 to latch the $\overline{\text{NEVCAL}}$ signal high and the RS flip-flop 2062 to latch the CCD signal high. In response to the CCD signal going high, the NAND gate 2058, which now receives two high inputs, drives its output low causing the NAND gate 2054 to apply a high output to the NAND gate 2052. At this point, all three inputs of the NAND gate 2052 are high, and the NAND gate 2052 accordingly drives its output low activating the SO signal, the SO signal is also applied to the S1 input of another SLDRAM 16b, c, or a computer system, which indicates all three clock domains have now been successfully synchronized.

The high output from the register 2012 also enables the NAND gate 2034 which, while the CAL signal remains active high, maintains its output high. When the CAL signal goes inactive low, the inverter 2006 drives its output high causing the NAND gate 2034 to drive its output low. In response to the output of the NAND gate 2034 going low, the NAND gate 2028 drives its output high, resetting the registers 2008–2012, in anticipation of the next active cycle of the CAL signal.

The clock-domain control circuit 422 continues operating in the initial synchronization submode until successfully synchronizing all three clock domains during a single active cycle of the CAL signal, which may hereinafter be referred to as a synchronization cycle. During the initial synchronization submode, if the CAL signal goes inactive low before all three clock domains have been synchronized, the registers 2008–2012 are reset causing the clock-domain control circuit 422 to commence operation during the next active cycle of the CAL signal by again first activating the CINIT signal such that the partial resynchronization circuit 410 (FIG. 4) again starts by synchronizing the ICLK clock signal first. As a result, even if during a given active cycle of the CAL signal, both the ICLK and IDCLK0 have been successfully synchronized, if the CAL signal then goes inactive before synchronization of the IDCLK1 signal is complete, the clock-domain control circuit 422 nonetheless starts the next active cycle of the CAL signal by again synchronizing the ICLK signal.

This operation is understood by noting that the RS flip-flop 2040 latches the $\overline{\text{NEVCAL}}$ signal active low until reset by a low output from the NAND gate 2056, which occurs in response to a high output from the register 2012 indicating all three clock domains have been successfully synchronized. The $\overline{\text{NEVCAL}}$ signal is applied to one input of the NOR gate 2036 and the CAL signal is applied to the other input of this NOR gate. Thus, when the CAL signal is active high, the NOR gate 2036 drives this output low, causing the inverter 2038 to apply a high signal to the NAND gate 2028. When the CAL signal goes low before the RS flip-flop 2040 has set the $\overline{\text{NEVCAL}}$ signal high, the NOR gate 2036 receives two low inputs once the CAL signal does go low. In response to these two low inputs, the NOR gate 2036 drives its output high causing the inverter 2038 to apply a low signal to the NAND gate 2028 which, in turn, drives its output high resetting the registers 2008–2012 as previously described. In other words, before the RS flip-flop 2040 is set to latch the $\overline{\text{NEVCAL}}$ signal high, every time the CAL signal goes low, the NOR gate 2036 drives its output high which results in the registers 2008–2012 being reset.

Once all three clock domains ICLK, IDCLK0 and IDCLK1 have been successfully synchronized during the initial synchronization submode, the clock-domain control circuit 422 operates in the partial synchronization submode. During the partial synchronization submode, the clock-domain control circuit 422 synchronizes only those clock domains not successfully synchronized during the previous active cycle or cycles of the CAL signal. For example, during the partial synchronization submode, if the ICLK clock domain was successfully synchronized and the partial resynchronization circuit 410 (FIG. 4) was in the process of synchronizing the IDCLK0 clock domain when the CAL signal goes inactive low, during the next active cycle of the CAL signal, the clock-domain control circuit 422 does not again synchronize the ICLK clock domain but instead starts by synchronizing the IDCLK0 clock domain. In this way, the clock-domain control circuit 422 does not unnecessarily resynchronize clock domains synchronized during previous active cycles of the CAL signal.

The operation of the clock-domain control circuit 422 during the partial synchronization submode will now be described in more detail. For the following description, it is assumed that the initial synchronization submode has just synchronized the three clock signals ICLK, IDCLK0 and IDCLK1 during the previous active cycle of the CAL signal. At this point, when the CAL signal goes active, the clock-domain control circuit 422 commences operation in the partial synchronization submode. If the CAL signal does not go inactive low before all of the three clock signals ICLK, IDCLK0 and IDCLK1 have been successfully synchronized, then the operation of the clock-domain control circuit 422 is identical to that previously described during the initial synchronization submode, except that the RS flip-flop 2040 has already latched the $\overline{\text{NEVCAL}}$ signal inactive high. When the CAL signal goes low before all three clock domains have been synchronized, however, the registers 2008–2102 are not reset so that during the next active cycle of the CAL signal, the partial resynchronization circuit 410 (FIG. 4) begins synchronizing the clock domain that was in the process of being synchronized during the previous active cycle of the CAL signal but which was not successfully synchronized during that cycle. For example, assume that the CAL signal goes active, placing the clock-domain control circuit 422 in the partial synchronization submode. Further assume that the ICLK signal has been successfully synchronized and that the partial resynchronization circuit 410 is in the process of synchronizing the IDCLK0 signal. As previously described, when the IDCLK0 signal is being synchronized, the clock-domain control circuit 422 activates the D0INIT signal and deactivates the CINIT, D1INIT, and SO signals. At this point, the output of the register 2008 is high while the outputs of the registers 2010 and 2012 are low.

Now assume that while the partial resynchronization circuit 410 (FIG. 4) is synchronizing the IDCLK0 signal in response to the active high D0INIT signal, the CAL signal goes low before this synchronization is complete. In this situation, unlike the previous situations where either all three clock domains had been synchronized or the $\overline{\text{NEVCAL}}$ signal was active low, the registers 2008–2012 are not reset in response to the low CAL signal, as will now be explained in more detail. Recall that the $\overline{\text{NEVCAL}}$ signal is high, since all three clock domains were synchronized during the previous initial synchronization submode. The high $\overline{\text{NEVCAL}}$ signal disables the NOR gate 2036 so that it maintains its output low when the CAL signal goes low. As a result, the inverter 2038 maintains its output high and does not, as previously described, go low causing the NAND gate 2028 to drive its output high to reset the registers 2008–2012. In addition, the output of the register 2012 is at this point low, and this low output disables the NAND gate 2034, which maintains its output high when the CAL signal goes low. Thus, during the partial synchronization submode, when the CAL signal goes low, the registers 2008–2012 are not reset. In addition, note that the low CAL signal is also applied to the NAND gate 2022. In response to the low CAL signal, the NAND gate 2022 drives its output high deactivating the D0INIT signal which, in turn, disables synchronization of the IDCLK0 signal currently being executed by the partial resynchronization circuit 410 (FIG. 4). It should be noted that the CAL signal is applied directly to the NAND gates 2022 and 2014, and through the inverter 2006 to the NOR gate 2000, disabling all these gates when it is low. As a result, whichever one of the CINIT, D0INIT, and D1INIT signals is active when the CAL signal goes low, the associated one of these gates deactivates that signal in response to the low CAL signal.

At this point, assume the CAL signal again goes high signaling the start of another synchronization cycle. The high CAL signal enables the NAND gate 2022 which, because its three other inputs are still high as they were at the end of the previous synchronization cycle, drives its output low once again activating the D0INIT signal. In response to the D0INIT signal again going active high, the partial resynchronization circuit 410 (FIG. 4) once again begins synchronizing the IDCLK0 signal as previously described. With reference to FIG. 4, it should be noted that the initialization phase selector 436 also receives the CAL signal and resets itself in response to that signal going inactive low. Accordingly, the synchronization of the IDCLK0 starts over at the beginning and the initialization phase selector 436 must again store 16 DINITRES signals, each corresponding to a particular phase of the IDCLK0 signal, and thereafter select the optimum phase as previously described. In other words, if 8 of the required 16 samples of the DINITRES signal were stored when CAL went inactive low, these 8 values are discarded and the initialization phase selector 436 starts at the beginning and stores a new value for the first stored DINITRES signal.

The clock-domain control circuit 422 repeats this process as many times as required to synchronize all three of the clock domains ICLK, IDCLK0 and IDCLK1. Once all three clock domains have been synchronized, the registers 2008–2012 are reset as previously described so that during the next synchronization cycle, the clock-domain control circuit 422 activates the CINIT signal to again start by synchronizing the ICLK signal. Recall, that once all three clock domains have been synchronized, the register 2016 latches its output high enabling the NAND gate 2034 so that next time the CAL signal goes low, the NAND gate 2034 drives its output low causing the NAND gate 2028 to drive its output high which, in turn, resets the registers 2008–2012.

The partial synchronization submode of operation reduces the time required for the clock-domain control circuit 422 to synchronize all three clock domains when the synchronization cycle is interrupted before synchronization of all three domains is complete. Referring back to FIG. 1, this allows the memory controller 18 to synchronize the SLDRAMs 16a–16c, each containing the partial resynchronization circuit 410, while the computer system 10 is in operation. The memory controller 18 may initiate a synchronization cycle and thereafter, in response to, for example, a data request from the processor 12, may then terminate the synchronization cycle, retrieve the requested data, and transfer that data to the processor 12. Once that data transfer is complete, the memory controller 18 may once again initiate a synchronization cycle and the partial resynchronization circuits 410 in the SLDRAMs 16a–16c being synchronized thereafter synchronize only those clock domains not synchronized during the previous synchronization cycle.

Figure 11:
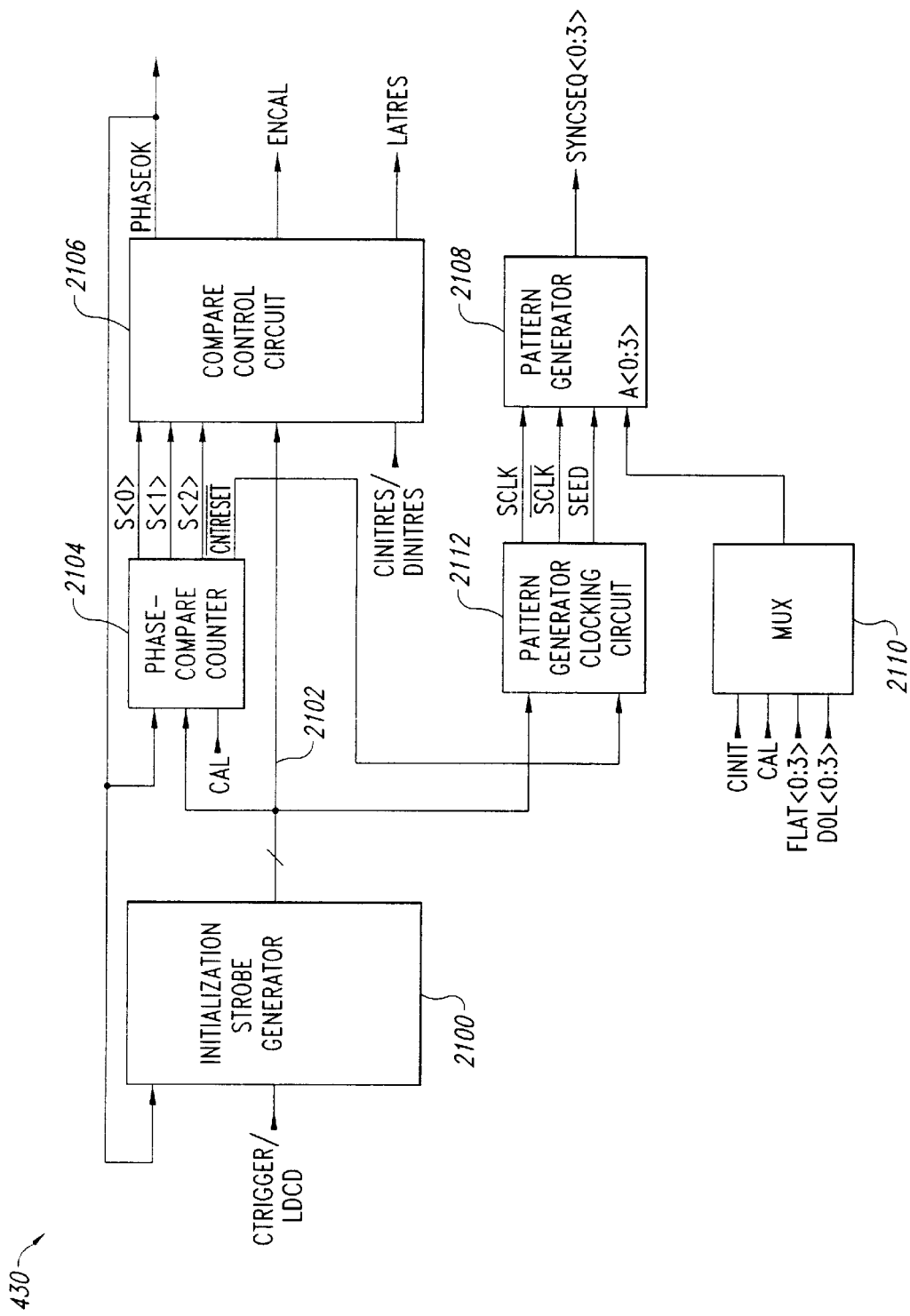
FIG. 11 is a block diagram of the initialization sequencer of FIG. 4.

The operation of the initialization sequencer 430 of FIG. 4 in controlling the partial resynchronization circuit 410 of FIG. 4 will now be described in more detail with reference to FIGS. 4 and 11. FIG. 11 is a functional block diagram of the initialization sequencer 430. The initialization sequencer 430 includes an initialization strobe generator 2100 that generates a plurality of control signals in response to either the CTRIGGER or LDCD signals output by the multiplexer 446. As previously described, the CTRIGGER pulse is generated after the four packet words CA<0:9> applied on the command-address bus CA have been latched and stored in the storage register 414 (FIG. 4), and the LDCD pulse is generated after four data packets DQ<0:15> applied on the data bus DQ have been latched. Furthermore, as previously described, the multiplexer 446 outputs the CTRIGGER signal when the ICLK signal is being synchronized and the LDCD pulse when either of the IDCLK0 or IDCLK1 signals is being synchronized.

A phase compare counter 2104 is clocked by the initialization strobe generator 2100 and develops a three bit phase compare count S<0:2> indicating the number of comparisons performed by the evaluation circuits 420, 428 (FIG. 4) at a given phase of the clock domain being synchronized. A compare control circuit 2106 receives the phase compare count S<0:2> and the one of the CINITRES or DINITRES signals corresponding to the clock domain currently being synchronized. In the following description, it is assumed to ICLK signal is being synchronized, so the CINITRES signal is applied to the compare control circuit 2106. In response to these applied signals, the compare control circuit 2106 applies the latched results pulse LATRES to the initialization phase selector 436 (FIG. 4), causing the initialization phase selector 436 to latch the value of the CINITRES signal. The compare control circuit 2106 generates the LATRES pulse when either the CINITRES signal is inactive low, or the count S<0:2> equals 111. Thus, the compare control circuit 2106 generates the LATRES pulse after eight successful comparisons at a given phase of the clock domain being synchronized, or when the CINITRES signal indicates an unsuccessful comparison. In addition, when either the count S<0:2> equals 111 or the CINITRES signal goes low, the compare control circuit 2106 deactivates the ENCAL signal applied to the evaluation circuits 420 and 428 (FIG. 4) to thereby reset these evaluation circuits in anticipation of evaluating packet words CA<0:9> captured at the next phase of the clock domain being synchronized. The compare control circuit 2106 also outputs the phase signal PHASEOK signal to the phase compare counter 2104 and initialization strobe generator 2100. The compare control circuit 2106 deactivates the PHASEOK signal when either the count S<0:2> equals 111 or the CINITRES signal goes low. In response to the PHASEOK signal going low, the phase compare counter 2104 resets the count S<0:2> to 000 and generates a count reset pulse $\overline{\text{CNTREST}}$ indicating comparisons of packet words captured at a given phase of the clock domain being synchronized are complete. In addition, the low PHASEOK signal disables the initialization strobe generator 2100 until that signal again goes active high.

The initialization sequencer 430 further includes a pattern generator 2108 receiving either the flag-latched word FLAT<0:3> or latched word D0L<0:3> from a multiplexer 2110, and utilizes the applied word to develop the synchronization sequence word SYNCSEQ<0:3>. As previously described, the SYNCSEQ<0:3> word is applied to the evaluation circuits 420 and 428 (FIG. 4) to determine the expect data for these circuits. The multiplexer 2110 applies the FLAT<0:3> word when the ICLK clock domain is being synchronized, and otherwise applies the D0L<0:3> word when either the IDCLK0 or IDCLK1 clock domains are being synchronized. A pattern generator clocking circuit 2112 clocks the pattern generator 2108 with a pair of complementary seed clock signals SCLK, $\overline{\text{SCLK}}$, and also applies a seed signal SEED to the pattern generator 2108. In response to these signals, the pattern generator 2108 utilizes the FLAT<0:3> or D0L<0:3> word output by the multiplexer 2110 to develop the synchronization sequence word SYNCSEQ<0:3> which, as previously described, is applied to the evaluation circuits 420 and 428 (FIG. 4) to determine expect data for these circuits. The pattern generator clocking circuit 2112 is controlled by the initialization strobe generator 2100 and reset in response to the $\overline{\text{CNTRESET}}$ signal generated by the phase compare counter 2104.

The pattern generator 2108 may be a conventional pattern recognition circuit which, upon receiving the FLAT<0:3> or D0L<0:3> word equal to 1111, thereafter generates the predetermined sequence of values defined by the repeating 15 bit pseudo-random bit sequence applied on FLAG, CA, and DQ lines (see Table 1). In other words, the pseudo-random bit sequences starts with 1111 applied for the FLAG bit. The next four FLAG bits that are captured, one coincident with each packet word CA<0:9>, are 0101, followed by 1001, and so on as seen in Table 1. Thus, the pattern generator 2108 merely starts generating the expected values 0101, 1001, and so on for the SYNCSEQ<0:3> word after receiving the FLAT<0:3> or D0C<0:3> word equal to 1111. One skilled in the art will understand circuitry that may be utilized to develop the predetermined sequence of SYNCSEQ<0:3> words generated by the pattern generator 2108, such as a state machine formed from appropriate logic circuitry.

Figure 12:
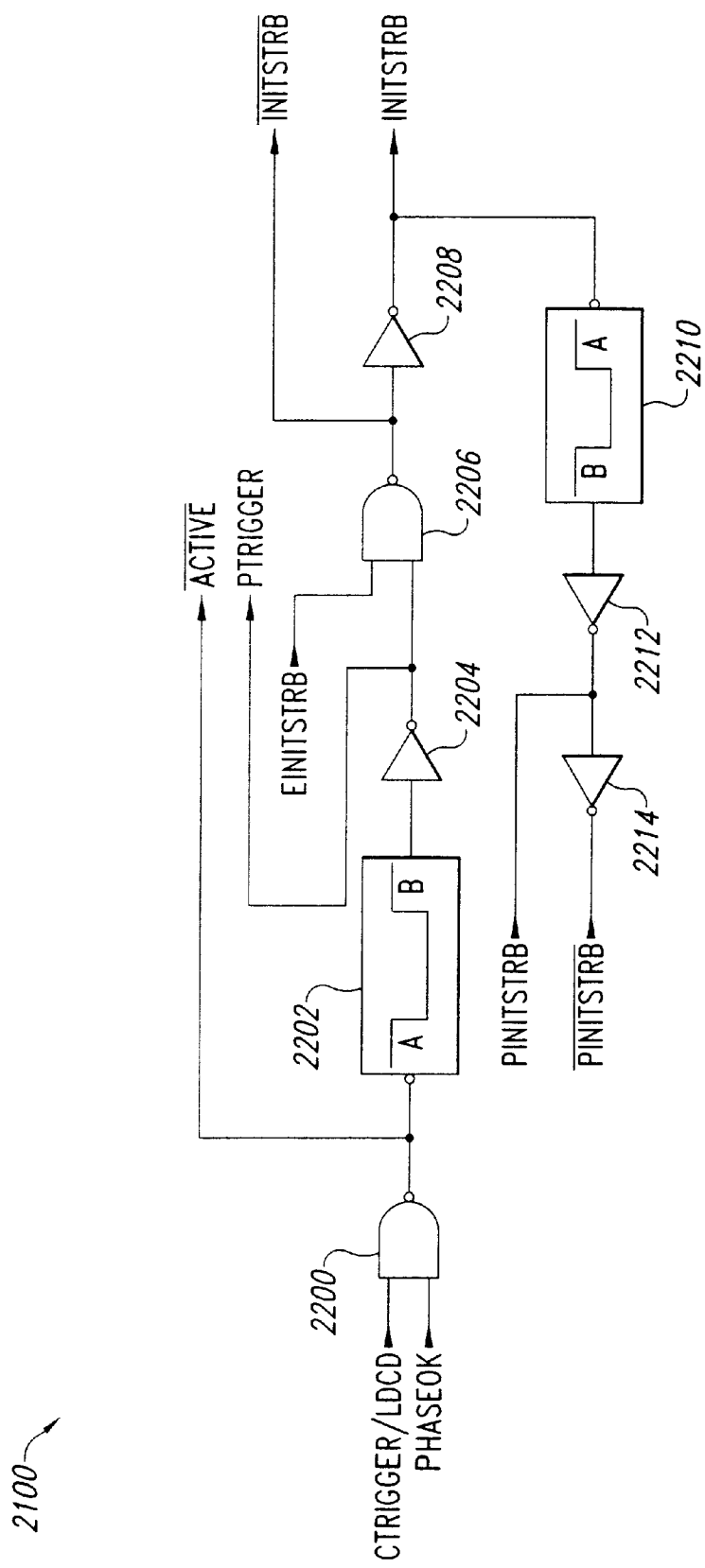
FIG. 12 is a schematic of the strobe generator of FIG. 11.

FIG. 12 is a more detailed schematic of one embodiment of the initialization strobe generator 2100 of FIG. 11. The initialization strobe generator 2100 includes a NAND gate 2200 that develops an active signal $\overline{\text{ACTIVE}}$ on its output in response to either the CTRIGGER or LDCD signal applied on a first input. The PHASEOK signal enables the NAND gate 2200 when active high. A pulse generator 2202 generates a low output pulse having a predetermined duration in response to a falling-edge of the $\overline{\text{ACTIVE}}$ signal. The output pulse of the pulse generator 2202 is applied through an inverter 2204 to develop a pulse trigger signal PTRIGGER. A NAND gate 2206 is enabled by an enable initialization strobe signal ENINITSTRB received on a first input, and receives the PTRIGGER signal on a second input. When enabled, the NAND gate 2206 outputs a complementary initialization strobe signal $\overline{\text{INITSTRB}}$, which is applied through an inverter 2208 to develop an initialization strobe signal INITSTRB. A pulse generator 2210 generates a negative pulse on its output in response to a falling-edge of the INITSTRB signal, and this output pulse is applied through a first inverter 2212 to develop a pulse initialization strobe signal PINITSRB and through a second inverter 2214 to develop a complementary pulse initialization strobe $\overline{\text{PINITSTRB}}$.

In operation, the initialization strobe generator 2100 is enabled when the PHASEOK and ENINITSTRB signals are active high. When enabled, the NAND gate 2200 drives the $\overline{\text{ACTIVE}}$ signal active low in response to the CTRIGGER signal going active high. In response to the $\overline{\text{ACTIVE}}$ signal going low, the pulse generator 2202 generates a low pulse on its output which is applied through the inverter 2204 to develop the PTRIGGER signal. In the embodiment of FIG. 12, the pulse generator 2202 generates a 2 nanosecond low pulse so the PTRIGGER signal is accordingly a 2 nanosecond high pulse. In response to the high PTRIGGER pulse, the NAND gate 2206 pulses its output low and thereby develops the INITSTRB, $\overline{\text{INITSTRB}}$ pulses. In response to the falling-edge of the INITSTRB pulse, the pulse generator 2210 generates a 1 nanosecond low pulse on its output which is applied through the inverters 2212 and 2214 to develop the PINITSTRB, $\overline{\text{PINITSTRB}}$ pulses. Note that when the PHASEOK signal is inactive low, the NAND gate 2200 is disabled, driving the $\overline{\text{ACTIVE}}$ and PTRIGGER inactive high and thereby inhibiting development of the INITSTRB, $\overline{\text{INITSTRB}}$ and PINITSTRB, $\overline{\text{PINITSTRB}}$ signals. Similarly, when the ENINITSTRB signal is inactive low, the NAND gate 2206 is disabled preventing development of the INITSTRB, $\overline{\text{INITSTRB}}$ and PINITSTRB, $\overline{\text{PINITSTRB}}$ signals.

Figure 13:
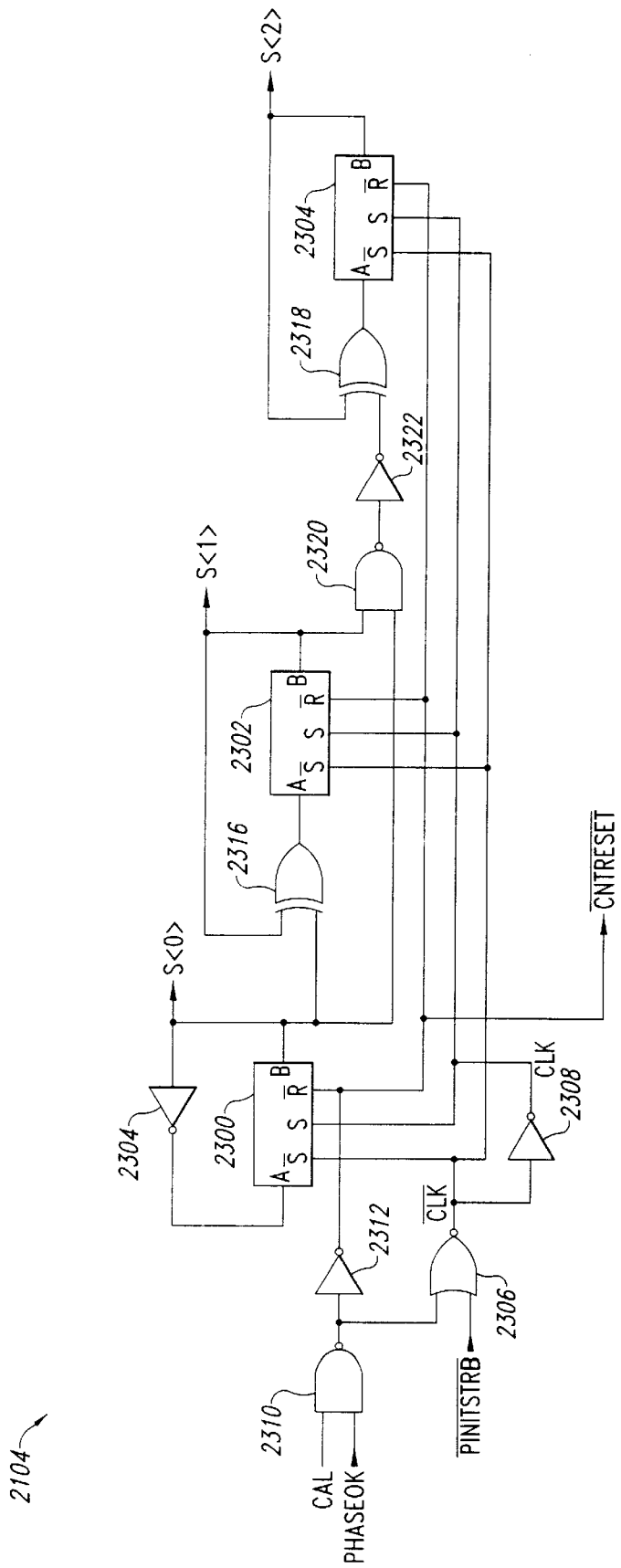
FIG. 13 is a schematic of the phase compare counter of FIG. 11.

FIG. 13 is a more detailed schematic of the phase compare counter 2104 of FIG. 11. The phase compare counter 2104 includes three registers 2300–2304 that develop the respective count bits S<0>, S<1>, and S<2>. A NOR gate 2306 has its output coupled directly and through an inverter 2308 to clock the registers 2300–2304 with complementary clock signals CLK, $\overline{\text{CLK}}$, which are generated in response to the $\overline{\text{PINITSTRB}}$ pulse received on a first input of the NOR gate 2306. The NOR gate 2306 is enabled by a NAND gate 2310 receiving the CAL and PHASEOK signals on respective inputs. The output of the NAND gate 2310 is further applied through an inverter 2312 which develops a count reset signal $\overline{\text{CNTRESET}}$ to reset the registers 2300–2304 when either or both of the CAL and PHASEOK signals go inactive low. The count bits S<0>–S<2> are fed back to the inputs of the respective registers 2300–2304 in order to cause the counter 2104 to increment its three bit binary count as it is clocked by the clock signals CLK, $\overline{\text{CLK}}$. Accordingly, the bit S<0> is fed back through an inverter 2304 to the input of the register 2300. An XOR gate 2316 receives the bits S<0> and S<1> on the respective inputs and applies its output to the input of the register 2302. An XOR gate 2318 applies its output to the input of the register 2304 in response to the S<2> bit applied on a first input and the logical AND of the S<0> and S<1> bits applied to a NAND gate 2320 an output through an inverter 2322 to the second input of the XOR gate 2318.

In operation, the phase compare counter 2104 operates in a conventional manner to increment the count S<0:2> from 000 to 111 as the registers 2300–2304 are clocked by the CLK, $\overline{\text{CLK}}$ signals. During normal operation, the CAL and PHASEOK signals are active high, causing the NAND gate 2310 to enable the NOR gate 2306 and also causing the inverter 2312 to drive the $\overline{\text{CNTRESET}}$ signal inactive high. At this point, the CLK, $\overline{\text{CLK}}$ signals are generated in response to each $\overline{\text{PINITSTRB}}$ pulse and thereby cause the registers 2300–2304 to increment the count S<0:2> from 000 to 111. If either the CAL or PHASEOK signals goes inactive low while the count S<0:2> is being developed, the NAND gate 2310 drives its output high, causing the inverter 2312 to drive the $\overline{\text{CNTRESET}}$ signal active low resetting the count S<0:2> to 000. As previously described, the PHASEOK signal goes inactive low if a particular command or data packet was not successfully captured. Thus, the phase compare counter 2104 resets its count S<0:2> to 000 whenever a command or data packet is unsuccessfully captured, in anticipation of comparing 8 command or data packets captured at the next phase of the clock domain being synchronized.

Figure 14:
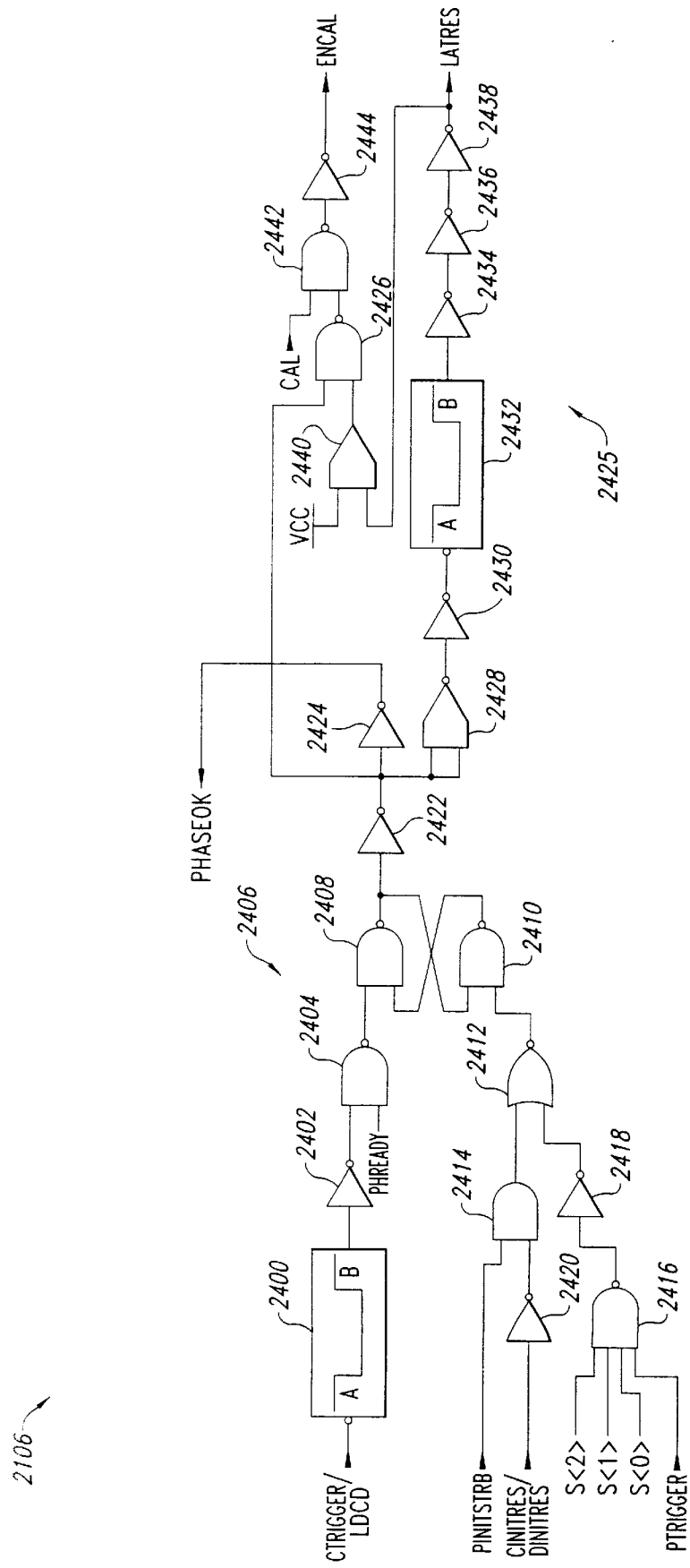
FIG. 14 is a schematic of the compare control circuit of FIG. 11.

FIG. 14 is a detailed schematic of one embodiment of the compare control circuit 2106 of FIG. 11. In the compare control circuit 2106, a pulse generator 2400 generates a low output pulse in response to a falling-edge transition of either the CTRIGGER or LDCD signal, depending upon which of the clock domains is being synchronized. The output of the pulse generator 2400 is applied through an inverter 2402 to a NAND gate 2404 which is enabled by the PHREADY signal developed by the initialization phase selector 436 (FIG. 4). The PHREADY signal is developed by the initialization phase selector 436 to allow for settling time of the clock signal being synchronized after adjusting the phase of that clock signal, as will be understood by one skilled in the art. An RS flip-flop 2406 includes cross-coupled NAND gates 2408 and 2410 and receives the output of the NAND gate 2404 on a set input.

A NOR gate 2412 applies the reset input to the RS flip-flop 2406 in response to the output of an AND gate 2414 applied on a first input and the output of a NAND gate 2416 applied through an inverter 2418 to a second input. The AND gate 2414 receives the PINITSTRB signal on a first input and either the CINITRES or DINITRES signal applied through an inverter 2420 on a second input. When the output of the AND gate 2414 is high, the NOR gate 2412 drives its output low resetting the RS flip-flop 2406, which occurs when the PINITSTRB signal is high and the applied one of the CINITRES or DINITRES signals is inactive low. As previously discussed, when the applied one of the CINITRES or DINITRES signals is inactive low, a command or data packet has been unsuccessfully captured, and thus the RS flip-flop 2406 is reset in this situation. The NOR gate 2412 also drives its output low, resetting the RS flip-flop 2406, when the inverter 2418 drives its output high, which occurs when the NAND gate 2416 drives its output low. The NAND gate 2416 receives the PTRIGGER signal on one input and the count S<0:2> output by the phase compare counter 2104 (FIG. 13) on their respective inputs. When the count S<0:2> equals 111, and the PTRIGGER signal is high, the NAND gate 2416 drives its output low causing the inverter 2418 to drive its output high and the NOR gate 2412, in turn, to drive its output low resetting the RS flip-flop 2406.

The output of the RS flip-flop 2406 is applied through series connected inverters 2422, 2424 to generate the PHASEOK signal. The output of the inverter 2422 is further applied directly to one input of a NAND gate 2426 and indirectly through the delay and pulse generation circuitry 2425 to a second input of the NAND gate 2426. More specifically, the output of the inverter 2422 is input to a positive-edge delay circuit 2428 that develops a positive-edge transition on its output a predetermined time after receiving a positive-edge transition on its input. In response to a negative-edge transition on its input, the positive-edge delay circuit 2428 develops a negative-edge transition on its output without any such delay. The output of the positive-edge delay circuit 2428 is applied through an inverter 2430 to an input of a pulse generator 2432. The pulse generator 2432 operates as do previously described pulse generators, developing a low pulse on its output in response to a falling-edge transition on its input.

The output of the pulse generator 2432 is applied through three series connected inverters 2434–2438 to develop the latched results pulse LATRES. As explained above, the initialization phase selector 436 latches the value of either the CINITRES or DINITRES signal present on its input in response to the LATRES pulse. The LATRES pulse is also applied to one input of a positive-edge delay circuit 2440 having its other input coupled to the supply voltage $V_{CC}$. The positive-edge delay circuit 2440 develops a positive-edge transition on its output a predetermined time after receiving a positive-edge transition of the LATRES pulse, and develops a negative-edge transition on its output without such delay in response to a negative-edge transition of the LATRES pulse. A NAND gate 2442 is enabled by the CAL signal on a first input and receives the output of a NAND gate 2426 on a second input. The output of a NAND gate 2442 is coupled through an inverter 2444 to develop the ENCAL signal which, as described above with reference to FIG. 4, enables the evaluation circuits 420 and 428 (FIG. 4) when active high, and resets these circuits when inactive low. When the CAL signal is active high, the NAND gate 2442 drives its output low, in response to the output of the NAND gate 2426 going high, and drives its output high in response to the output of the NAND gate 2426 going low.

The overall operation of the compare control circuit 2106 will now be described in more detail. In the following description, it will be assumed the compare control circuit 2106 receives the CTRIGGER and CINITRES signals, corresponding to the situation when the ICLK clock domain is being synchronized, as previously described above. When the PHREADY signal is active high, the falling edge of the CTRIGGER pulse generates a low output pulse causing the NAND gate 2404 to drive its output low which, in turn, resets the RS flip-flop 2406, thereby driving the output of the NAND gate 2408 high. In response to the high output of the NAND gate 2408, the PHASEOK signal goes active high, and the inverter 2422 applies a low output to the NAND gate 2426 which, in turn, drives its output high. At this point, the NAND gate 2442 receives two high inputs and drives its output low causing the inverter 2444 to activate the ENCAL signal. In addition, note that the low output of the inverter 2422 does not cause the pulse generator 2432 to generate a low pulse, but instead the pulse generator 2432 drives its output high resulting in the inverter 2438 driving the LATRES signal inactive low. The low LATRES signal is applied through the positive-edge delay circuit 2440 to the NAND gate 2426 which, at this point, receives two low inputs.

After the RS flip-flop 2406 has been set in response to the falling-edge of the CTRIGGER signal, the compare control circuit 2106 maintains the PHASEOK and ENCAL signals active high, and the LATRES signal inactive low. The compare control circuit 2106 maintains these signal values until one of two events resets the RS flip-flop 2406. The RS flip-flop 2406 is reset when the NOR gate 2412 drives its output low, which occurs when either the AND gate 2414 drives its output high or the NAND gate 2416 drives its output low. The AND gate 2414 drives its output high when the PINITSTRB signal is high and the CINITRES signal is low. As previously described, the CINITRES signal is low when the evaluation circuit 420 (FIG. 4) determines the bits in the captured command packet do not match their expected data, meaning the command packet was unsuccessfully captured. Thus, when a command packet is unsuccessfully captured, the resulting low CINITRES signal causes the AND gate 2414 to drive its output high, and the NOR gate 2412, in turn, to drive its output low resetting the RS flip-flop 2406.

When the RS flip-flop 2406 is reset, the NAND gate 2408 drives its output low causing the inverter 2424 to drive the PHASEOK signal inactive low. In response to the low, output from the NAND gate 2408, the inverter 2422 applies a high input to the NAND gate 2426. At this point, the other input of the NAND gate 2426 remains low and thus the NAND gate 2422 maintains its output low causing the inverter 2444 to maintain the ENCAL signal active high. When the output of the inverter 2422 goes high, the positive-edge delay circuit 2428 drives its output high after the predetermined delay time, which in one embodiment of a compare control circuit 2106 is 2 nanoseconds. In response to the output of the positive-edge delay circuit 2428 going high, the inverter 2430 drives its output low causing the pulse generator 2432 to output a low pulse, which has a duration of 3 nanoseconds in one embodiment of the compare control circuit 2106. In response to the low pulse generated by the pulse generator 2432, the inverter 2438 drives the LATRES signal active high causing the initialization phase selector 436 (FIG. 4) to latch the value of the CINITRES signal applied on its input, as previously described. When the LATRES signal goes active high, the positive-edge delay circuit 2440 drives its output high the predetermined time later, which is 0.5 nanoseconds in one embodiment of the compare control circuit 2106. At this point, the NAND gate 2426 receives two high inputs and drives its output low causing the NAND gate 2442 to drive its output high and the inverter 2444, in turn, to drive the ENCAL signal inactive low. As described above, when the ENCAL signal goes inactive low, the evaluation circuit 420 is reset in anticipation of comparing the next captured command packet to the associated expect data.

The second condition that resets the RS flip-flop 2406 occurs when the output of the NAND gate 2416 goes low causing the inverter 2418 to drive its output high and the NOR gate 2412, in turn, to drive its output low, resetting the RS flip-flop 2406. The NAND gate 2416 drives its output low when the PTRIGGER signal is active high, and the compare count S<0:2> developed by the phase compare counter (FIG. 13) equals 111. When this occurs, all inputs to the NAND gate 2416 are high, causing it to drive its output low and thereby reset the RS flip-flop 2406. Once reset, the compare control circuit 2106 operates as previously described to deactivate the PHASEOK and ENCAL signals and activate the LATRES signal. In sum, the PHASEOK and ENCAL signals are deactivated and the LATRES signal activated when either the compare count S<0:2> equals 111, or the CINITRES signal goes low.

Figure 15:
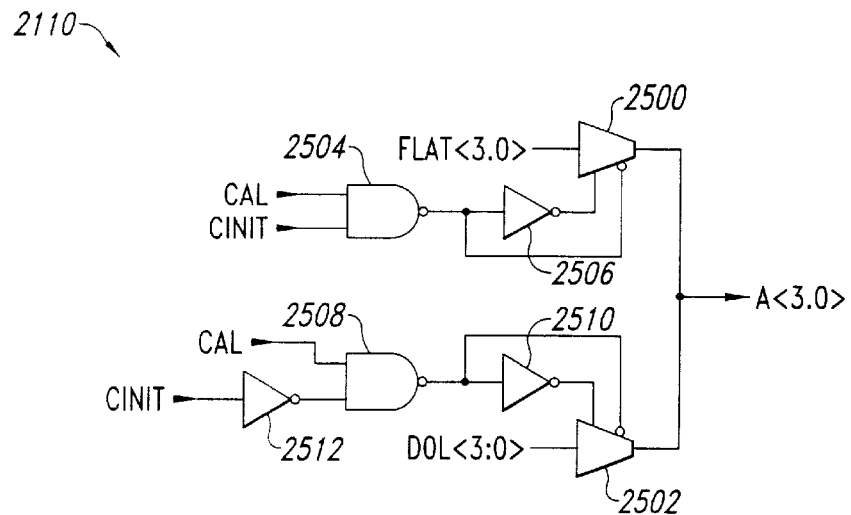
FIG. 15 is a schematic of the multiplexer of FIG. 11.

FIG. 15 is a more detailed schematic of one embodiment of the multiplexer 2110 of FIG. 11. The multiplexer 2110 includes first and second pass gates 2500 and 2502 that operate in a complementary manner to apply either the latched FLAT<0:3> or D0L<3:0> word as a seed word A<0:3> to the pattern generator 2108 (FIG. 11). A NAND gate 2504 has its output applied directly and through an inverter 2506 to control the pass gate 2500, and a NAND gate 2508 has its output applied directly and through an inverter 2510 to control the pass gate 2502. The CINIT signal is applied directly to a first input of the NAND gate 2504, and is applied through an inverter 2512 to a first input of the NAND gate 2508. The NAND gates 2504 and 2508 are enabled by the CAL signal applied on respective second inputs.

In operation, when the CAL signal is inactive low, both NAND gates 2504 and 2508 drive their respective outputs high turning off pass gates 2500 and 2502 so that neither the FLAT<0:3> or D0L<3:0> words are output. When the CAL signal is active high, which of the FLAT<0:3> D0L<3 :0> words are output as the seed word A<0:3> depends upon the state of the CINIT signal. When the CINIT signal is active high, the NAND gate 2504 drives its output low turning ON the pass gate 2500 which, in turn, outputs the FLAT<0:3> word as the seed word A<0:3>. In response to the high CINIT signal, the inverter 2512 drives its output low causing the NAND gate 2508 to drive its output high which, in turn, turns OFF the pass gate 2502.

When the CINIT signal is low, the NAND gate 2504 drives its output high turning OFF the pass gate 2500 and the NAND gate 2508 drives its output low turning ON the pass gate 2502 and thereby coupling the D0L<3:0> word to its output as the seed word A<0:3>. From the above description, recall that when the CINIT signal is active high, the ICLK clock domain is being synchronized, and when the CINIT signal is inactive low, either the IDCLK0 IDCLK1 clock domains are being synchronized. Thus, when the CINIT signal is active high during synchronization of the ICLK clock domain, the multiplexer 2110 outputs the FLAT<0:3> word as the seed word A<0:3> to the pattern generator 2108 (FIG. 11). If either the IDCLK0 or IDCLK1 clock domains are being synchronized, the multiplexer 2110 applies the D0L<3:0> word as the seed word A<0:3> to the pattern generator 2108.

Figure 16:
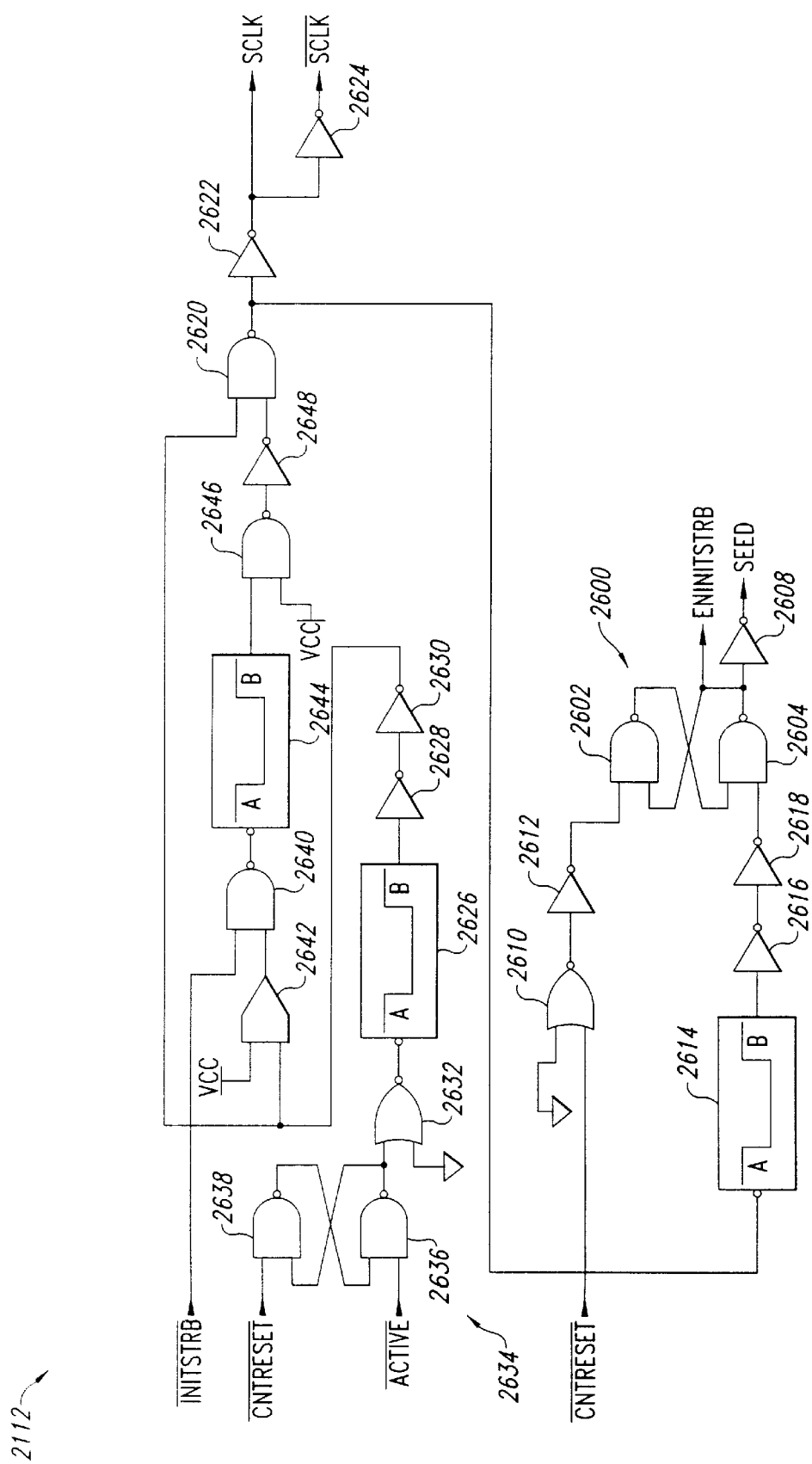
FIG. 16 is a schematic of the pattern generator clocking circuit of FIG. 11.

FIG. 16 is a detailed schematic of one embodiment of the pattern generator clocking circuit 2112 of FIG. 11. The pattern generator clocking circuit 2112 includes an RS flip-flop 2600 comprising cross-coupled NAND gates 2602 and 2604 and having its output coupled through an inverter 2608 to develop the SEED signal. As previously explained, the SEED signal enables the pattern generator 2108 (FIG. 11) to store either the FLAT<0:3> or D0L<3:0> word output by the multiplexer 2110. A NOR gate 2610 has its output coupled through an inverter 2612 to apply a set input to the RS flip-flop 2600. The NOR gate 2610 has one input coupled to ground and receives the $\overline{\text{CNTRESET}}$ signal on a second input. When the $\overline{\text{CNTRESET}}$ signal goes active low, the NOR gate 2610 drives its output high and the inverter 2612 drives its output low, resetting the RS flip-flop 2600 which causes the NAND gate 2604 to drive its output low and the inverter 2608 to drive the SEED signal active high. A pulse generator 2614 generates a low output pulse that is applied through series connected inverters 2616 and 2618 to the reset input of the RS flip-flop 2600. The pulse generator 2614 receives its input from a NAND gate 2620 and generates the low pulse on its output in response to a falling-edge transition on the output of the NAND gate 2620. In response to the low pulse output by the pulse generator 2614, the inverter 2618 drives the reset input low, resetting the RS flip-flop 2600 and thereby causing the NAND gate 2604 to drive its output high and the inverter 2608 to drive the SEED signal inactive low. In addition, note that the output of the NAND gate 2602 develops the enable initialization strobe signal ENINITSTRB which, when high, enables circuitry in the initialization strobe generator 2100 (FIG. 11).

The pattern generator clocking circuit 2112 couples the output of the NAND gate 2620 through inverters 2622 and 2624 to develop the pair of complementary seed clock signals SCLK, $\overline{\text{SCLK}}$ which, as previously described above, clock the pattern generator 2108 (FIG. 6) to generate sequential SYNCSEQ<0:3> words as it is clocked, each of the SYNCSEQ<0:3> words representing expect data corresponding to a particular captured command or data packet. A pulse generator 2626 applies a low output pulse through series connected inverters 2628 and 2630 to a first input of the NAND gate 2620. The pulse generator 2626 generates the low output pulse in response to a falling-edge transition from a NOR gate 2632. The NOR gate 2632 has one input coupled to ground and a second input coupled to the output of an RS flip-flop 2634 including cross-coupled NAND gates 2636 and 2638. The RS flip-flop 2634 receives the $\overline{\text{ACTIVE}}$ signal on a set input and the $\overline{\text{CNTREST}}$ signal on a reset input. In response to the $\overline{\text{CNTREST}}$ signal going low, the RS flip-flop 2634 is reset, driving the output of the NAND gate 2636 low which, in turn, causes the NOR gate 2632 to drive its output high. Once reset, the RS flip-flop 2634 is set in response to the $\overline{\text{ACTIVE}}$ signal going active low, causing the NAND gate 2636 to drive its output high which, in turn, causes the NOR gate 2632 to drive its output low.

The pattern generator clocking circuit 2112 further includes a NAND gate 2640 receiving the $\overline{\text{INITSTRB}}$ signal on a first input and an output from a positive-edge delay circuit 2642 on a second input. The positive-edge delay circuit 2642 has its input coupled to the output of the inverter 2630 and develops a positive-edge transition on its output a predetermined time after receiving a positive-edge transition on its input, and develops a falling-edge transition on its output in response to a falling-edge transition on its input without such delay. The output of the NAND gate 2640 is applied to an input of a pulse generator 2644 which develops a low output pulse in response to a falling-edge transition on its input. A NAND gate 2646 has one input coupled to the supply voltage $V_{CC}$ and a second input coupled to the output of the pulse generator 2644. When the pulse generator 2644 develops the low pulse on its output, the NAND gate 2646 drives its output high, causing an inverter 2648 to apply a low signal on a second input of the NAND gate 2620. In contrast, when the output of the pulse generator 2644 is high, the NAND gate 2646 drives its output low, causing the inverter 2648 to apply a high output to the NAND gate 2620.

In operation, the pattern generator clocking circuit 2112 operates in two modes, a seed mode and an expect data generation mode. For the following description, assume the $\overline{\text{CNTREST}}$ signal has just pulsed active low, resetting the RS flip-flop 2634 and RS flip-flop 2600. When the RS flip-flop 2600 is reset, the NAND gate 2604 drives its output low, causing the inverter 2608 to drive the SEED signal active high. When the RS flip-flop 2634 is reset, the NAND gate 2636 drives its output low, causing the NOR gate 2632 to drive its output high. At this point, the pulse generator 2626 maintains its output high and this high output is applied through the inverters 2628 and 2630 to the NAND gate 2620. In addition, the positive-edge delay circuit 2642 applies a high output to the NAND gate 2640 in response to the high output from the inverter 2630. At this point, the NAND gate 2640 receives two high inputs so its output is low, but it is assumed the pulse generator 2644 has already generated its low output pulse in response to the falling-edge transition from the NAND gate 2640. Thus, the pulse generator 2644 maintains its output high and the NAND gate 2646, in turn, drives its output low, causing the inverter 2648 to apply a high output to the NAND gate 2620. The NAND gate 2620 likewise also receives two high inputs at this point and accordingly drives its output low, causing the inverters 2622 and 2624 to drive the SCLK signal high and $\overline{\text{SCLK}}$ signal low, respectively.

The initialization strobe generator 2100 (FIG. 11) then drives the $\overline{\text{ACTIVE}}$ and $\overline{\text{INITSTRB}}$ signals active low. In response to the $\overline{\text{INITSTRB}}$ signal going active low, the NAND gate 2640 drives its output high and the pulse generator 2644 maintains its output high in response to this positive-edge transition on its input. In response to the $\overline{\text{ACTIVE}}$ signal going active low, the RS flip-flop 2634 is set, causing the NAND gate 2636 to drive its output high. In response to the high output from the NAND gate 2636, the NOR gate 2632 drives its output low, causing the pulse generator 2626 to generate a low pulse on its output. This low pulse output by the pulse generator 2626 is applied through the inverters 2628 and 2630 to the NAND gate 2620. In response to the low pulse from the inverter 2630, the NAND gate 2620 drives its output high, causing the inverters 2622 and 2624 to clock the SCLK signal low and $\overline{\text{SCLK}}$ high, respectively. Notice that also in response to the output of the inverter 2630 going low, the positive-edge delay circuit 2642 outputs a low to the NAND gate 2640, which already has a high output in response to the low $\overline{\text{INITSTRB}}$ signal. At this point, when the low pulse output by the pulse generator 2626 terminates, the pulse generator again drives its output high and this high output is applied through the inverters 2628 and 2630 to the input of the NAND gate 2620. In response to the output from the inverter 2630 going high, the NAND gate 2620 again drives its output low, causing the inverters 2622 and 2624 to clock the SCLK signal high and $\overline{\text{SCLK}}$ low, respectively. At this point, the pattern generator clocking circuit 2112 has generated a single SCLK, $\overline{\text{SCLK}}$ clock pulse in response to the $\overline{\text{ACTIVE}}$ signal setting the RS flip-flop 2634.

After the RS flip-flop 2634 has been set, the initialization strobe generator 2100 (FIG. 11) drives the $\overline{\text{INITSTRB}}$ signal inactive high. In response to the INITSTRB signal going active high, the NAND gate 2640, which now receives two high inputs, drives its output low. When the output of the NAND gate 2640 goes low, the pulse generator 2644 generates a low output pulse. In response to the low output pulse from the pulse generator 2644, the NAND gate 2646 drives its output high, causing the inverter 2648 to drive its output low. At this point, the NAND gate 2620 receives a high from the inverter 2630 and a low pulse from the inverter 2648 and accordingly drives its output high in response to the low output pulse from the inverter 2648. When the NAND gate 2620 drives its output high, the inverters 2622 and 2624 again drive the SCLK signal low and $\overline{\text{SCLK}}$ high, respectively. Upon termination of the pulse generated by the pulse generator 2644, the NAND gate 2646 again drives its output low, causing the inverter 2648 to again apply a high output to the NAND gate 2620 which, in turn, now receives two high inputs and accordingly drives its output low. In response to the low output from the NAND gate 2620, the inverters 2622 and 2624 clock the SCLK signal high and the $\overline{\text{SCLK}}$ low, respectively.

The pattern generator clocking circuit 2112 thereafter clocks the SCLK, $\overline{\text{SCLK}}$ signals in response to pulses of the $\overline{\text{INITSTRB}}$ signal. This is true because once the RS flip-flop 2634 is set by the $\overline{\text{ACTIVE}}$ signal going active low, the pulse generator 2626 does not generate another pulse until the RS flip-flop 2634 is first reset by the $\overline{\text{CNTREST}}$ signal and then again set by the $\overline{\text{ACTIVE}}$ signal. Thus, the pulse generator 2626 generates a single pulse in response to the RS flip-flop 2634 being set. Thereafter, the NAND gate 2620 is enabled by the high output from the inverter 2630 and clocks the SCLK, $\overline{\text{SCLK}}$ signals in response to each pulse generated by the pulse generator 2644. The pulse generator 2644 generates a pulse in response to each low transition output by the NAND gate 2640, which occurs when the low $\overline{\text{INITSTRB}}$ terminates (i.e., when the $\overline{\text{INITSTRB}}$ signal goes high).

Figure 17:
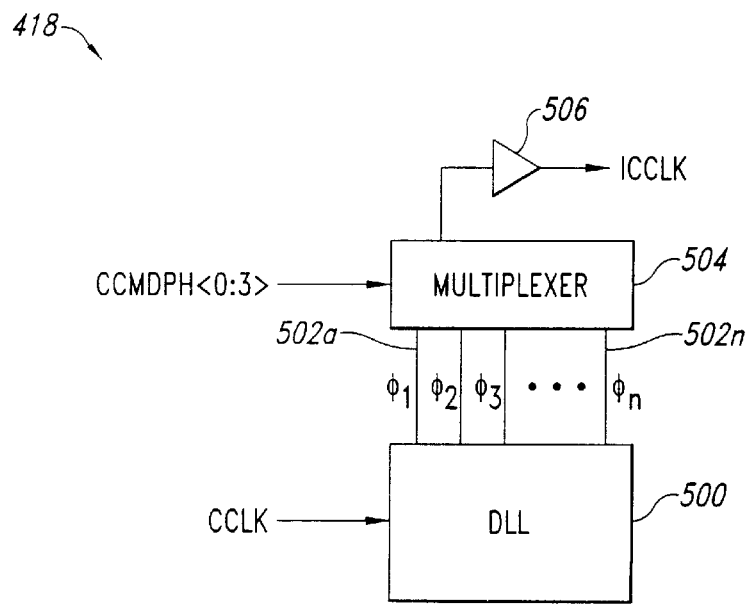
FIG. 17 is a more detailed block diagram of a variable-phase clock generation circuit of FIG. 4.

FIG. 17 is a functional block diagram of one embodiment of the variable-phase clock generation circuit 418 of FIG. 4. Typically, the variable-phase clock generation circuits 418, 419, and 423 (FIG. 4) are identical, and thus, for the sake of brevity, only the clock generation circuit 418 will be described in more detail with reference to FIG. 17. The variable-phase clock generation circuit 418 includes a delay-locked loop 500 that develops a plurality of clock signals 502a–n in response to the CCLK signal. The clock signals 502a–n have phase shifts, designated $\phi_1$–$\phi_N$, respectively, relative to the CCLK signal. In the embodiment of FIG. 17, the delay-locked loop 500 develops 16 clock signals 502a–n and maintains a phase shift of 180° between the clock signals 502a and 502n. Thus, in this embodiment, the phases of the clock signals 502a–n increase in increments of 11.25° from the phase $\phi_1$ to $\phi_{16}$. In other words, the clock signal 502a has a phase $\phi_1$ relative to the CCLK signal, and each of the clock signals 502b–n has a phase 11.25° greater than the preceding phase such that the clock signal 502n has the phase $\phi_{16}$ that is 180° greater than the phase $\phi_1$.

The clock signals 502a–n are applied to respective inputs of a multiplexer 504 that also receives the phase command word CCMDPH<0:3>. In response to the phase command word CCMDPH<0:3>, the multiplexer 504 couples one of the clock signals 502a–n to an output and through a buffer 506 to generate the ICCLK signal. The value of the phase command word CCMDPH<0:3> determines which of the clock signals 502a–n is used to generate the ICCLK signal and thereby determines the phase of the ICCLK signal relative to the CCLK signal. A more detailed description of one embodiment of the variable-phase clock generation circuit 418 is described in U.S. patent application Ser. No. 08/811,918 to Manning, which is incorporated herein by reference.

Figure 18:
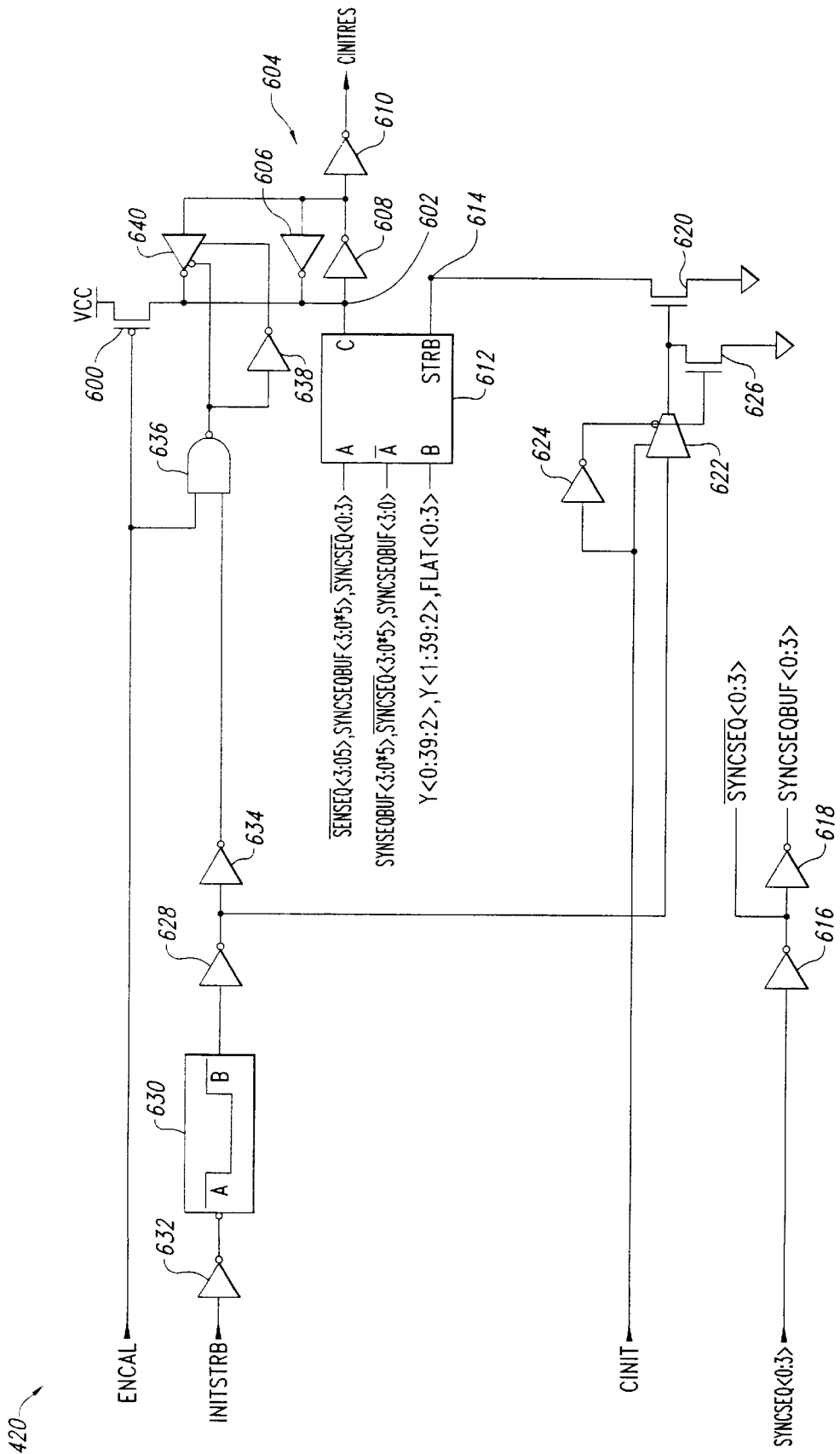
FIG. 18 is a more detailed schematic and block diagram of one of the evaluation circuits of FIG. 4.

FIG. 18 illustrates one embodiment of the evaluation circuit 420 of FIG. 4, which, as previously described, compares the command word C<0:39> and flag-latched word FLAT<0:3> to expected values determined by the SYNCSEQ<0:3> word, and generates the CINITRES signal having a value indicating the result of this comparison. The evaluation circuit 420 includes a PMOS reset transistor 600 coupled between a supply voltage source $V_{CC}$ and a sensing node 602 and receiving an enable calibration signal ENCAL on its gate. A latch 604 including two cross-coupled inverters 606, 608 has its input coupled to the sensing node 602 and its output coupled to an input of an inverter 610 which develops the CINITRES signal on its output in response to the output of the latch 604.

The evaluation circuit 420 further includes a compare circuit 612 coupled between the sensing node 602 and an enable node 614. The compare circuit 612 receives the latched command word C<0:39> and flag-latched word FLAT<0:3> corresponding to the captured command packet received on the command-address bus CA and latched FLAG bits received on the flag line 52, as previously described. In addition, the compare circuit 612 further receives a plurality of signals derived from the synchronization sequence word SYNCSEQ<0:3> generated by the initialization sequencer 430. More specifically, each bit of the synchronization sequence word SYNCSEQ<0:3> is coupled through an inverter 616 to generate a complementary synchronization sequence word $\overline{\text{SYNCSEQ}}$ <0:3> which, in turn, is further coupled through an inverter 618 to generate a buffered synchronization sequence word SYNCSEQBUF<0:3>. The $\overline{\text{SYNCHSEQ}}$ <0:3> and SYNCHSEQBUF<0:3> words are utilized by the compare circuit 612 in determining whether each of the bits in the command word C<0:39> and latched FLAG word FLAT<0:3> has its expected value, as will be explained in more detail below.

The evaluation circuit 420 further includes an enable transistor 620 coupled between the enable node 614 and ground. An inverter 628 has its output applied through a transmission gate 622 to the gate of the enable transistor 620. The CINIT signal is applied directly and through an inverter 624 to the control terminals of the transmission gate 622. The output of the inverter 624 is further applied to a gate of a transistor 626 coupled between the gate of the enable transistor 620 and ground. When the CINIT signal goes active high, the inverter 624 drives its output low turning OFF the transistor 626 and turning ON the transmission gate 622 and thereby coupling the output of the inverter 628 to the gate of the enable transistor 620. Thus, when the CINIT signal is active high, the level at the output of the inverter 628 determines whether the enable transistor 620 turns ON or OFF. A pulse generator 630 provides a pulse signal to the input of the inverter 628 in response to the INITSTRB signal applied through an inverter 632 to its input. When the INITSTRB signal goes active high, the inverter 632 drives its output low causing the pulse generator 630 to apply a low pulse signal on the input of the inverter 628, which, in turn, drives its output high for the duration of this pulse. This high output from the inverter 628 is coupled through the transmission gate 622, when activated, turning ON the enable transistor 622.

The output of the inverter 628 is further coupled through an inverter 634 to one input of a NAND gate 636 receiving the ENCAL signal on a second input. The output of the NAND gate 636 is applied directly and through an inverter 638 to enable terminals of a buffer 640 coupled between the output of the latch 604 and the sensing node 602 as shown. When the output of the NAND gate 636 goes low, the buffer 640 is enabled and applies the inverse of the signal on the output of the latch 604 on the sensing node 602. If the output of the NAND gate 636 is high, the buffer 640 is disabled, placing its output in a high impedance state.

Figure 19:
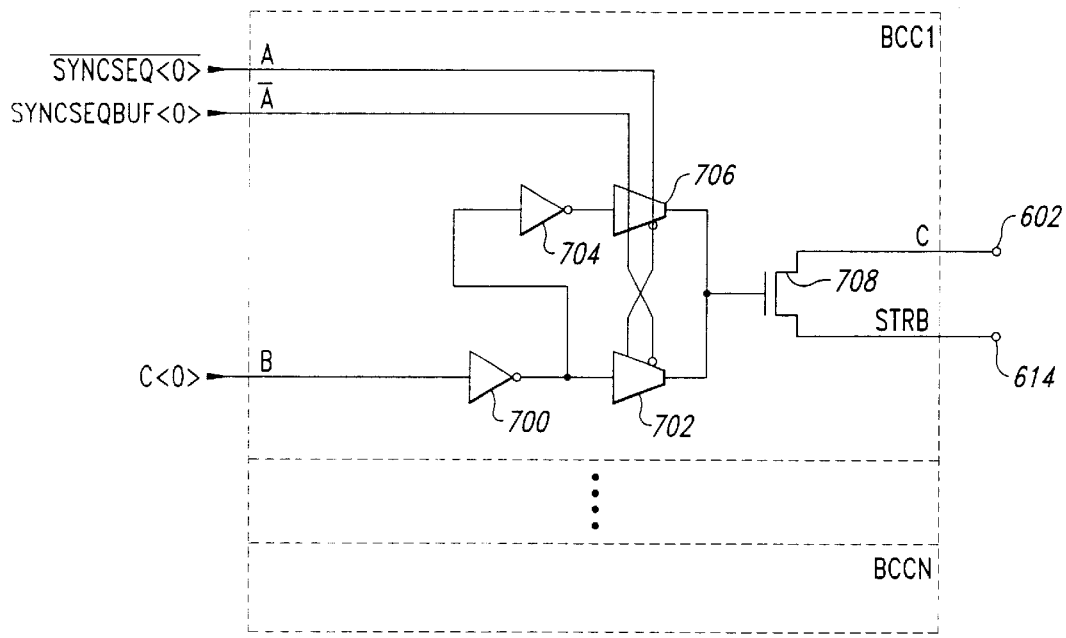
FIG. 19 is a more detailed block diagram of the compare circuit of FIG. 18.

FIG. 19 is a more detailed schematic of the compare circuit 612 of FIG. 18 including a plurality of bit compare circuits BCC1–BCCN. There is one bit compare circuit BCC1–BCCN for each bit compared by the compare circuit 612. In the embodiment of FIG. 19, the compare circuit 612 includes 44 bit compare circuit BCC1–BCC44, one for each bit of the command word C<0:39> and flag-latched word FLAT<0:3>. All the bit compare circuits BCC1–BCCN are identical, and thus, for the sake of brevity, only the bit compare circuit BCC1 will be described in more detail. The bit compare circuit BCC1 receives the bit C<O> of the command word C<0:39>, and applies this bit through a first inverter 700 to an input of a first transmission gate 702, an through the first inverter 700 and a second inverter 704 to the input of a second transmission gate 706. The transmission gates 702 and 706 receive the $\overline{\text{SYNCSEQ}}$ <0> and SYNC-SEQBUF<0> signals on their respective control terminals as shown, and are activated in a complementary manner in response to the values of these signals. When the $\overline{\text{SYNCSEQ}}$ <0> signal is high and SYNCSEQBUF<0> signal is low, the transmission gate 702 turns ON and transmission gate 706 turns OFF, and when the signals $\overline{\text{SYNCSEQ}}$ <0> and SYNCSEQBUF<0> are low and high, respectively, the transmission gate 706 turns ON and transmission gate 702 turns OFF. The outputs of the transmission gates 702 and 706 are applied to a gate of a comparison transistor 708 coupled between the sensing node 602 and the enable node 614.

In operation, the bit compare circuit BCC1 compares the value of the bit C<0> to its expected value determined by the values of the bits $\overline{\text{SYNCSEQ}}$ <0> and SYNCSEQBUF<0> and activates the compare transistor 708 when the bit C<0> does not have its expected value, as will now be explained in more detail. The initialization sequencer 430 (FIGS. 4 and 11) determines an expected value for the command bit C<0> from the latched FLAG word FLAT<0:3> as previously mentioned, and as will be discussed in more detail below. When the expected value of the command bit C<0> is high, the $\overline{\text{SYNCSEQ}}$ <0> and SYNCSEQBUF<0> bits are driven high and low, respectively, turning ON transmission gate 702 and turning OFF transmission gate 706. The command bit C<0> is then applied through the inverter 700 and through the turned ON transmission gate 702 to the gate of the compare transistor 708. If the command bit C<0> is high as expected, the inverter 700 applies a low signal through the transmission gate 702 to the gate of the compare transistor 708, turning OFF this transistor. In contrast, if the command bit C<0> is a binary 0 instead of a binary 1 as expected, the inverter 700 drives its output high and this high output is applied through the transmission gate 702 to the gate of the transistor 708. In response to the high signal on its gate, the transistor 708 turns ON, coupling the sensing node 602 to the enable node 614.

When the expected value of the command bit C<0> is a binary 0, the $\overline{\text{SYNCSEQ}}$ <0> and SYNCSEQBUF<0> are driven low and high, respectively, turning ON the transmission gate 706 and turning OFF the transmission gate 702. The command bit C<0> is then applied through the inverters 700 and 704 and through the turned ON transmission gate 706 to the gate of the compare transistor 708. If the command bit C<0> is a binary 0 as expected, the inverter 704 drives its output low, turning OFF the transistor 708 and isolating the sensing node 602 from the enable node 614. In contrast, if the command bit C<0> is not a binary 0 as expected but is instead a binary 1, the inverter 704 drives its output high, turning ON the transistor 708 which couples the sensing node 602 to the enable node 614.

Returning now to FIG. 18, the overall operation of the evaluation circuit 420 in comparing the value of each bit in the command word C<0:39>and flag-latched word FLAT<0:3> to its expected value will now be described in more detail. When the CINIT signal is inactive low, the transmission gate 622 turns OFF and the transistor 626 turns ON. The turned ON transistor 626 couples the gate of the enable transistor to ground, turning OFF the enable transistor 620 which isolates the enable node 614 from ground. In this situation, the evaluation circuit 420 is deactivated and does not evaluate the command word C<0:39> and flag-latched word FLAT<0:3>.

In operation, the evaluation circuit 420 is enabled when the CINIT signal is active high turning ON the transmission gate 622 and enable transistor 620, which couples the enable node 614 to approximately ground. The ENCAL signal goes inactive low before evaluation of a particular command word C<0:39> and flag-latched word FLAT<0:3>. In response to the low ENCAL signal, the transistor 600 turns ON, coupling the sensing node 602 to approximately the supply voltage $V_{CC}$. In response to the high on the sensing node 602, the latch 604 drives its output low and the inverter 610, in turn, drives the CINITRES signal on its output high. At this point, the INITSTRB signal is inactive low and the pulse generator 630 drives its output high causing the inverter 628 to drive its output low. The low output from the inverter 628 is applied through the turned ON transmission gate 622 to the gate of the enable transistor 620, turning OFF this transistor and thereby isolating the enable node 614 from ground.

In operation, before the evaluation circuit begins comparing latched command words C<0:39> and flag-latched words FLAT<0:3>, the ENCAL signal goes inactive low to reset the evaluation circuit 420 by turning ON the transistor 600 to drive the sensing node 602 to approximately the supply voltage $V_{CC}$. In response to the high voltage on the sensing node 602, the latch 604 drives its output low causing the inverter 610, in turn, to drive the CINITRES signal active high. It should be noted that when the ENCAL signal goes inactive low, the NAND gate 636 deactivates the buffer 640 enabling the transistor 600 to more easily drive the sensing node 602 high. The ENCAL signal thereafter goes active high, enabling the evaluation circuit 420 to begin comparing latched command words C<0:39> and flag-latched words FLAT<0:3>. At this point, the synchronization sequence word SYNCSEQ<0:3> is applied to the evaluation circuit 420 and the corresponding $\overline{\text{SYNCSEQ}}$ <0:3> and SYNCSEQBUF<0:3> words are, in turn, applied to the compare circuit 612, indicating the expected value for each of the bits in the latched C<0:39> and FLAT<0:3> words. At this point, the expected data in the form of the $\overline{\text{SYNCSEQ}}$ <0:3> and SYNCSEQBUF<0:3> words and the latched data in the form of the C<0:39> and FLAT<0:3> words are applied to the compare circuit 612, but the compare circuit 612 is not yet enabled since the transistor 620 is turned OFF. The INITSTRB signal then goes active high and the pulse generator 630, in turn, generates the low pulse on its output, causing the inverter 628 to pulse its output high and thereby turn ON the enable transistor 620 so that the compare circuit 612 compares the latched command word C<0:39> and flag-latched word FLAT<0:3> to the expected data.

As previously described with reference to FIG. 19, when each bit of the command word C<0:39> and flag-latched word FLAT<0:3> has its expected value, the corresponding compare transistor 708 coupled between the sensing node 602 and enable node 614 does not turn ON. Thus, when the latched command words C<0:39> and FLAT<0:3> have their expected values, none of the transistors 708 in the compare circuit 612 turns ON and the sensing node 602 remains at approximately the supply voltage $V_{CC}$. Thus, when the words C<0:39> and FLAT<0:3> have their expected values, the voltage on the sensing node 602 remains high such that the latch 604 maintains its output low and the inverter 610 continues driving the CINITRES signal active high indicating the latched words C<0:39> and FLAT<0:3> were successfully captured. If any of the bits in the words C<0:39> and FLAT<0:3> does not have its expected value, the corresponding compare transistor 708 turns ON, coupling the sensing node 602 to approximately ground. When the sensing node 602 goes low, the latch 604 drives its output high causing the inverter 610 to drive the CINITRES signal low, indicating the C<0:39> and FLAT<0:3> words were not successfully captured.

It should be noted that the low pulse on the output of the pulse generator 630 results in the inverter 634 also pulsing its output low, which causes the NAND gate 636 to drive its output high for the duration of this pulse. As previously described, when the output of the NAND gate 636 goes high, the buffer 640 is disabled to enable the sensing node 602 to be more easily driven low if any of the bits were not successfully captured. After the end of the pulse generated by the pulse generator 630, the NAND gate 636 again drives its output low enabling the buffer 640 to drive the sensing node 602 to its desired value. As will be understood by one skilled in the art, the sensing node 602 may present a rather large capacitance due to all the components coupled in parallel to this node, and the buffer 640 includes transistors sized such that the buffer may drive this relatively large capacitance to its desired voltage and in this way assists the inverter 606 which typically has smaller sized transistors.

Figure 20:
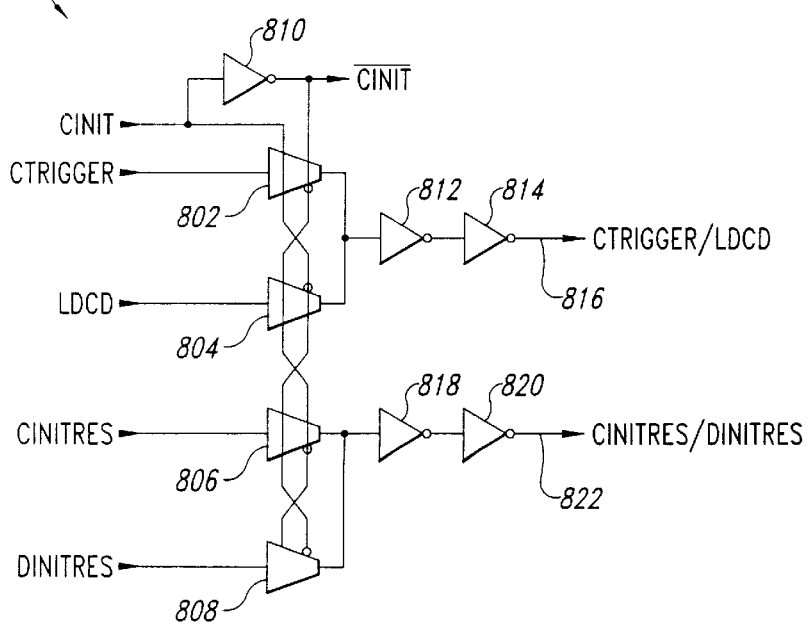
FIG. 20 is more detailed block diagram of the multiplexers shown in FIG. 4.

One embodiment of the multiplexer circuit 446 of FIG. 4 is illustrated in FIG. 20. The multiplexer 446 includes four transmission gates 802–808 receiving the CTRIGGER, LDCD, CINITRES, and DINITRES signals on their inputs, respectively. The CINIT signal is applied directly and through an inverter 810 to the control terminals of the transmission gates 802–808 as shown. In response to the CINIT signal, the transmission gates 802 and 804 operate in a complementary manner to couple either the CTRIGGER or LDCD signal through a pair of series connected inverters 812 and 814 to an output terminal 816. Similarly, the transmission gates 806 and 808 operate in a complementary manner in response to the CINIT signal, coupling either the CINITRES or DINITRES signal through series connected inverters 818 and 820 to an output terminal 822. In operation, when the CINIT signal is active high, the multiplexer 446 outputs the CTRIGGER and CINITRES signals on the output terminals 816 and 822, respectively. When the CINIT signal is inactive low, the multiplexer 446 outputs the LDCD and DINITRES signals on the terminals 816 and 822, respectively. In this way, the multiplexer 446 applies the CTRIGGER pulse to clock the initialization sequencer 430 (FIG. 4) and the CINITRES signal to the phase selector 436 (FIG. 4) when the command clock signal CCLK is being synchronized (i.e., CINIT signal is high). In contrast, the multiplexer 446 applies the LDCD and DINITRES signals to the sequencer 430 and selector 436, respectively, when either of the data clocks DCLK0 or DCLK1 is being synchronized (i.e., CINIT signal is low).

Figure 21:
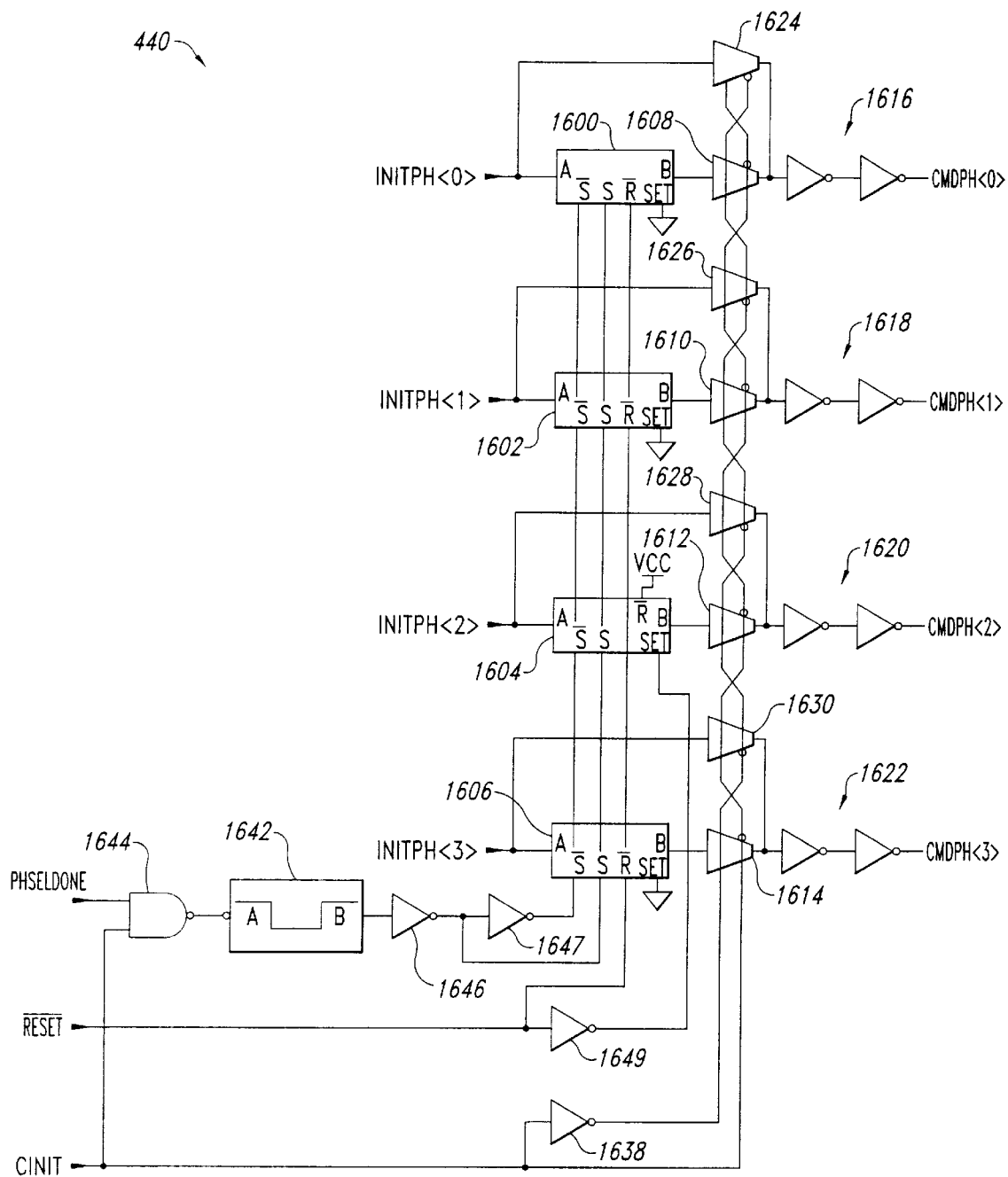
FIG. 21 is a detailed schematic of a phase select latch of FIG. 4.

FIG. 21 is a schematic of the phase select latch 440 of FIG. 4. All the phase select latches 440–444 are identical, and thus, for the sake of brevity, only the latch 440 will be described in more detail with reference to FIG. 21. The INITPH<0:3> signals are applied to respective latch circuits 1600–1606. The outputs of the latch circuits 1600–1606 are applied to respective pass gates 1608–1614 which are coupled to respective inverter pairs 1616–1622. The latch circuits 1600–1606 may be selectively bypassed by respective pass gates 1624–1630. The pass gates 1608–1614 and the pass gates 1624–1630 are connected to each other so that the pass gates 1608–1614 are enabled alternately with the pass gates 1624–1630 in response to the CINIT signal applied directly and through an inverter 1638 to the control terminals of these pass gates.

As explained earlier, in the storage mode during synchronization of the ICLK signal, the CINIT signal high, thereby enabling the pass gates 1624–1630 directly. As a result, the latches 1600–1606 are bypassed in the storage mode so that the phase command INITPH<0:3> is applied to the variable-phase clock generation circuit 418 (FIG. 4) to determine the phase of the ICLK signal relative to the CCLK signal. However, once the analysis mode has determined the optimum value for the phase command INITPH<0:3>, the PHSELDONE signal goes active high. The PHSELDONE signal is applied to one input of a NAND gate 1644, which is enabled by the CINIT signal. In response to the active high PHSELDONE signal, the NAND gate 1644 drive its output low, thereby triggering a pulse generator 1642. The pulse generated by the pulse generator 1642 is applied through an inverter 1646 to S inputs of the latch circuits 1600–1606, and an inverter 1647 applies the complement of this signal to the $\overline{\text{S}}$ input of the latch circuits 1600–1606. The latch circuits 1600–1606 then store the INITPH<0:3> signals that correspond to the optimum phase for the ICLK signal. When the CINIT signal goes low, which occurs a short time after the PHSELDONE signal goes active high, the INITPH<0:3> signals stored in the latch circuits 1600–1606 are then coupled through the inverter pairs 1616–1622 by the pass gates 1608–1614 and output as the phase command CCMDPH<0:3>. The latch circuits 1600–1606 store the CCMDPH<0:3> signals until either new CCMDPH<0:3> signals are stored in the latch circuits 1600–1606 during a synchronization cycle, or they are reset by the $\overline{\text{RESET}}$ signal applied to reset inputs of the latches 1600,1602, and 1606, and through an inverter 1649 to the set input of the latch 1604. By coupling the $\overline{\text{RESET}}$ signal in this way, the latches reset the stored INITPH<0:3> signals to 1101 when the $\overline{\text{RESET}}$ signal goes active low. As previously described, the stored CCMDPH<0:3> is applied to the clock generator 418 (FIG. 4) to thereby set the phase of the ICLK signal to an optimum value for use in capturing command packets applied on the command-address bus CA. A variety of different circuits may be utilized to perform the functions of the latches 1600–1606, and such circuits are understood by one skilled in the art.

It is to be understood that even though various embodiments and advantages of the present invention have been set forth in the foregoing description, the above disclosure is illustrative only, and changes may be made in detail, and yet remain within the broad principles of the invention. For example, many of the components have been described by way of exemplary embodiments, and numerous other embodiments may be utilized within various aspects of the present invention. Moreover, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A method of storing a packet of digital signals applied sequentially as a plurality of packet words to a packetized memory device during normal and synchronization modes of operation of the memory device, the method comprising:

storing a plurality of packet words sequentially applied to the memory device responsive to an internal clock signal;

storing a plurality of digital control signals sequentially applied coincident with each packet word in response to the internal clock signal by serially shifting the stored digital control signals through a plurality of storage locations, the applied digital control signal being shifted into a first storage location while shifting each previously stored digital control signal to the next higher storage location;

detecting a first predetermined condition of the stored values of the digital control signal;

placing the packetized memory device in the normal mode of operation upon detection of the first predetermined condition;

shifting the stored packet words to a new storage location responsive to the values of the digital control signal stored in predetermined ones of the storage locations to thereby store a packet in the new storage location;

detecting a second predetermined condition of the stored values of the digital control signal;

placing the packetized memory device in a synchronization mode of operation upon detection of the second predetermined condition;

generating a synchronization clocking signal in response to the internal clock signal during the synchronization mode of operation; and shifting the stored packet words to the new storage location responsive to the synchronization clocking signal to thereby store a packet in the new storage location during the synchronization mode of operation.

2. The method of claim 1 wherein each packet comprises four packet word, each packet word comprising 10 bits.

3. The method of claim 1 wherein detecting the first predetermined condition of the stored values of the digital control signal comprises detecting whether two consecutive stored values of the digital control signal have a first binary value.

4. The method of claim 3 wherein the first predetermined condition is detected as long as first and second consecutive stored values of the digital control signal are not both binary ones when the packetized memory device is already in the normal mode of operation, and comprises detecting when the digital control signal does not have a predetermined binary value for a predetermined number of consecutive stored values of the digital control signal.

5. The method of claim 1 wherein shifting the stored packet words to a new storage location responsive to the values of the digital control signal stored in predetermined ones of the storage locations to thereby store a packet in the new storage location comprises shifting first and second packet words to the new storage location when the value of the digital control signal in the second storage location equals a binary one and shifting second and third packet words to the new storage location when the value of the digital control signal in the fourth storage location equals a binary one.

6. The method of claim 1 wherein detecting the second predetermined condition of the stored values of the digital control signal comprises determining the second predetermined condition exists when the first and second stored values of the digital control signal are binary ones.

7. The method of claim 1 wherein generating a synchronization clocking signal comprises generating true and complement synchronization clocking signals having half the frequency of the internal clock signal.

8. The method of claim 7 wherein shifting the stored packet words to the new storage location responsive to the synchronization clocking signal comprises shifting first and second packet words to the new storage location responsive to the true synchronization clocking signal and shifting second and third packet words to the new storage location responsive to the complement synchronization clocking signal.

9. The method of claim 1 wherein the digital control signal includes the FLAG signal of an SLDRAM and the packet words correspond to digital signals applied on a command-address bus of the SLDRAM.

10. A method of detecting a synchronization mode of a packetized memory device and synchronizing a plurality of internal clock signals developed in response to respective external clock signals applied to the packetized memory device during the synchronization mode, the method comprising:

latching a plurality of digital signals applied to the memory device responsive to respective internal clock signals including a plurality of digital control signals responsive to a first one of the clock signals;

detecting a first predetermined condition of the latched values of the digital control signal;

placing the packetized memory device in a synchronization mode of operation upon detection of the first predetermined condition;

generating a synchronization clocking signal derived from the one of the clock signals being synchronized during the synchronization mode of operation;

shifting digital signals latched responsive to the clock signal being synchronized to a corresponding storage register in response to the synchronization clocking signal;

generating a trigger signal in response to the synchronization clocking signal when a packet of digital signals has been shifted into the storage register;

synchronizing a portion of the clock signals sequentially in response to the trigger signal during the first synchronization mode of the packetized memory device;

detecting a second predetermined condition of the external digital control signal responsive to the latched values during the synchronization mode;

placing the memory device in a normal mode of operation upon detection of the second predetermined condition;

terminating generation of the synchronization clocking signal and trigger signal during the normal mode of operation;

placing the memory device in the synchronization mode of operation upon detecting the first predetermined condition;

synchronizing only those of the clock signals not synchronized during the prior synchronization mode;

repeating the acts of placing the memory device in a normal mode of operation through synchronizing only those of the clock signals not synchronized during the prior synchronization mode until all clock signals have been synchronized; and activating a select output signal once all clock signals have been synchronized.

11. The method of claim 10 wherein detecting a first predetermined condition of the latched values of the digital control signal comprises capturing a FLAG signal and activating a calibration signal indicating the synchronization mode of operation when the FLAG signal has a predetermined binary value for two consecutive captures.

12. The method of claim 10 wherein detecting the second predetermined condition of the external digital control signal responsive to the latched values during the synchronization mode comprises capturing a FLAG signal and deactivating a calibration signal indicating the normal mode of operation when the FLAG signal has a same predetermined binary value for a predetermined number of consecutive captures of the FLAG signal.

13. The method of claim 12 wherein the calibration signal is deactivated responsive to the FLAG signal being a binary 0 for sixteen consecutive captures of the FLAG signal.

14. The method of claim 10 wherein detecting the second predetermined condition of the external digital control signal responsive to the latched values during the synchronization mode comprises capturing a FLAG signal and deactivating a calibration signal indicating the normal mode of operation when the FLAG signal does not have a predetermined binary value for a predetermined time.

15. The method of claim 14 wherein the predetermined time is determined by clocking a counter with a signal derived from the clock signal being synchronized.

16. The method of claim 10 wherein synchronizing each of the clock signals comprises:

repetitively applying digital signals having expected values to a latch;

storing the digital signals in the latch responsive to different respective phases of the clock signal being synchronized;

evaluating the digital signals stored in the latch to determine if the stored digital signals have the expected values;

identifying each phase of the clock signal being synchronized that caused the latch to store a digital signal having the expected value;

selecting a phase of the clock signal being synchronized that caused the latch to store digital signals having the expected values; and adjusting the phase of the clock signal being synchronized to the selected phase.

17. The method of claim 10 wherein a command clock signal CCLK, first data clock DCLKO, and second data clock DCLK1 signal are synchronized before the select output signal is generated.

18. A system for synchronizing a plurality of internal clock signals generated in response to corresponding external clock signals, comprising:

a plurality of clock control circuits, each clock control circuit controlling the phase of a respective internal clock signal relative to a corresponding external clock signal responsive to a respective phase command signal;

a plurality of shift registers, each shift register latching digital signals applied on respective external terminals and shifting the latched digital signals through successive stages responsive to a corresponding internal clock signal;

a synchronization control circuit coupled to a digital control signal terminal, the synchronization control circuit latching a plurality of digital control signals sequentially applied on the external control terminal responsive to a corresponding internal clock signal and providing the latched digital control signals on respective outputs, the synchronization control circuit also activating a calibration signal when the latched digital control signals have a predetermined characteristic;

a plurality of storage registers, each storage register coupled to an associated shift register and sequentially storing digital signals from the shift register, and one storage register coupled to the synchronization control circuit operable in a normal mode when the calibration signal is inactive to sequentially store digital signals responsive to respective digital control signals from predetermined stages of the synchronization control circuit, and operable in a synchronization mode when the calibration signal is active to sequentially store digital signals from the shift register responsive to a signal derived from the internal clock signal applied to the shift register and to generate a trigger signal during the synchronization mode after the storage circuit has latched a packet of digital signals;

a plurality of evaluation circuits coupled to respective storage registers, each evaluation circuit receiving a plurality of digital signals sequentially stored in the corresponding storage register and generating a results signal indicating whether each of the digital signals has an expected value when a corresponding clock domain signal is active;

a phase selector circuit operable in a storage mode to sequentially develop a plurality of phase command signals on an output and store corresponding results signals sequentially received on an input, and operable in an analysis mode to develop on the output a final phase command signal from the stored results signals; a plurality of storage latches coupled to the output of the phase selector circuit and storing the final phase command signal responsive to a corresponding clock domain signal;

a clock-domain control circuit developing a plurality of clock domain signals to determine which of the internal clock signals is being synchronized, and operable when the calibration signal goes inactive before all internal clock signals have been synchronized to retain existing final phase command signals in the corresponding storage latches, and to thereafter, when the calibration signal again goes active, develop clock domain signals to synchronize only those clock domains not synchronized during the previous active cycle of the calibration signal; and an initialization sequencer that applies a plurality of control signals to the synchronization control circuit, storage registers, and evaluation circuits to control synchronization of the internal the internal clock signals when the calibration signal is active and in response to the trigger signal, latched digital control signals, and results signals.

19. The system of claim 18 wherein shift register associated with the synchronization control circuit comprises a plurality of respective shift register circuits, each shift register circuit having an input coupled to a corresponding line of the command-address bus and applying in m×n outputs to the corresponding storage register where in equals the number of shift register circuits and n equals the number of stages of each shift register circuit.

20. The system of claim 19 wherein m equals 10 and n equals 2.

21. The system of claim 18 wherein the synchronization control circuit comprises:
- a memory circuit including set and reset inputs, and activating the calibration signal on an output responsive to the set input going active, and deactivating the calibration signal responsive to the reset input going active;
- a first detector circuit having first and second inputs coupled to receive respective first and second latched flag signals from corresponding outputs of the synchronization control circuit, and a third input, the first detector circuit activating an output when either the flag signals both have the same binary value or a signal applied on the third input goes active;
- a second detector circuit having a first input coupled to receive the first latched flag signal, a second input coupled to receive the calibration signal, and an output coupled to the third input of the first detector circuit, the second detector circuit activating a signal on its output when the calibration is active and the first latched flag signal has a predetermined binary value;
- a counter circuit having a reset input and a clock terminal adapted to receive a clock signal derived from the internal command clock signal, the counter circuit outputting a count developed in responsive to the clock signal and resetting the count to an initial value when the reset signal goes active; and
- a reset circuit coupled to the counter circuit and having an output coupled to the reset input of the memory circuit, the reset circuit activating the reset input when the count has a predetermined value.

22. The system of claim 21 wherein the counter circuit decrements a four bit count responsive to the internal command clock signal and the reset circuit activates the reset input when the four bit count equals its minimum value.

23. The system of claim 18 wherein the one storage register coupled to the shift register associated with the synchronization control circuit comprises:
- a first storage register latching a first group of digital signals output from the command shift register responsive to a first clock signal;
- a first clocking circuit coupled to the first storage register, the first clocking circuit developing the first clock signal in response to a first latched flag signal from the synchronization control circuit and a clock signal derived from the internal command clock signal when the calibration signal is inactive, and developing the first clock signal in response to a synchronization clock signal and the clock signal derived from the internal command clock signal when the calibration signal is active;
- a second storage register latching a second group of digital signals output from the command shift register responsive to a second clock signal;
- a third storage register latching a group of latched flag signals output from the synchronization control circuit responsive to the second clock signal;
- a second clocking circuit coupled to the second and third storage registers, the second clocking circuit developing the second clock signal in response to a second latched flag signal from the synchronization control circuit and a clock signal derived from the internal command clock signal when the calibration signal is inactive, and developing the second clock signal in response to the synchronization clock signal and the clock signal derived from the internal command clock signal when the calibration signal is active;
- a synchronization clock generation circuit coupled to the first and second clocking circuits that generates the synchronization clock signal responsive to a clock signal derived from the internal command clock signal; and
- a pulse generation circuit coupled to the second clocking circuit, the pulse generation circuit generating a trigger pulse on an output in response to the second clock signal.

24. The system of claim 18 wherein the initialization sequencer comprises:
- an initialization strobe generator having a clocking terminal adapted to receive either the trigger signal or a load signal and a terminal adapted to receive a phase signal, and generating a plurality of control signals responsive to the applied one of the trigger and load signals when the phase signal is active;
- a phase compare counter including terminals adapted to receive the calibration signal and coupled to the initialization strobe generator, the phase compare counter developing a phase select count responsive to the control signals when the phase signal and calibration signals are active, and resetting the phase select count when either the phase or calibration signal goes inactive, and activating a count reset signal when the phase select count has a predetermined value;
- a pattern generator clocking circuit coupled to the phase compare counter and the initialization strobe generator, the pattern generator clocking circuit developing a data clock signal responsive to the control signals and activating a seed signal responsive to the count reset signal going active and deactivating the seed signal responsive to the seed clock signal;
- a multiplexer coupling one of two latched data patterns to an output responsive to one of the clock domain signals when the calibration signal is active;
- a pattern generator coupled to the pattern generator clocking circuit and the output of the multiplexer, the pattern generator loading the latched data pattern from the multiplexer when the seed signal is active and thereafter when the seed signal is inactive generating a predetermined sequence of expect digital signals responsive to the data clock signal when the loaded pattern has a predetermined value; and
- a compare control circuit coupled to the phase compare counter and initialization strobe generator and adapted to receive results signals from the evaluation circuits, the compare control circuit activating a latch results signal, deactivating the phase signal, and deactivating an enable calibration signal applied to reset the active one of the evaluation circuits when either the count has a predetermined value or the applied results signal from the active evaluation circuit goes inactive.

25. The system of claim 18 wherein the synchronization control circuit activates the calibration signal upon detecting two successive high values of the digital control signal.

26. The system of claim 18 wherein the clock-domain control circuit further operates after the occurrence of a predetermined condition of the system to first determine final phase command signals for all internal clock signals during an active cycle of the synchronization signal until all clock signals are synchronized during a given cycle, and thereafter operates to determine final phase command signals only for those internal clock signals not synchronized during the previous active of the synchronization signal.

27. The system of claim 26 wherein the predetermined condition includes a reset signal going active.

28. The system of claim 18 wherein the clock-domain control circuit comprises:

a pulse terminal adapted to receive a pulse signal;

a first reset circuit having inputs adapted to receive at least one external reset signal and developing on an output an active clock-domain reset signal when any of the at least one external reset signal goes active;

a shift register having an input coupled to a first voltage, N outputs, a clock terminal coupled to the pulse terminal, and a reset terminal, the shift register developing shift signals on respective outputs responsive to the pulse signal and resetting all shift signals responsive to the reset signal;

a logic circuit including an enable terminal adapted to receive the synchronization signal, and coupled to receive the N outputs from the shift register, the logic circuit sequentially generating N clock-domain signals on respective outputs responsive to active shift signals from the shift register when the synchronization signal is active, and driving all clock-domain signals inactive when the synchronization signal is inactive;

a first storage circuit having a reset input coupled to the output of the first reset circuit and set input coupled to the Nth output of the shift register, and developing an active never-calibrated signal on an output when the first reset signal goes active and an inactive never-calibrated signal when the Nth output goes active; and a second reset circuit having an output coupled to the reset terminal of the shift register circuit and developing on the output an active second reset signal when the clock-domain reset signal goes active, or the synchronization signal goes inactive and the Nth output of the shift register is active, or the synchronization signal goes inactive and the never-calibrated signal is active.

29. The system of claim 18 wherein the plurality of clock control circuits includes three clock control circuits developing respective command, first data clock, and second data clock signals responsive to external command clock, first data clock, and second data clock signals, respectively.

30. The system of claim 18 wherein each of the evaluation circuits compares each of the received digital signals to a predetermined value, and the results signal indicates whether each of the digital signals has the corresponding predetermined value.

31. A synchronization circuit for synchronizing a command clock signal applied to a packetized memory device, comprising:

a clock control circuit controlling the phase of an internal command clock signal relative to an external command clock signal responsive to a respective phase command signal;

a command shift register latching command-address signals applied on a command-address bus of the packetized memory device and shifting the latched signals through successive stages responsive to the internal command clock signal;

a synchronization control circuit coupled to a flag signal line of the command-address bus and sequentially latching a plurality of flag signals responsive to the internal command clock signal and providing the latched flag signals on respective outputs, the synchronization control circuit also activating a calibration signal when the latched flag signals have a predetermined characteristic;

a command packet storage register coupled to the command shift register and synchronization control circuit and operable in a normal mode when the calibration signal is inactive to store command-address signals responsive to respective flag signals from predetermined outputs of the synchronization control circuit, and operable in a synchronization mode when the calibration signal is active to store command-address signals responsive to a signal derived from the internal clock signal applied to the command shift register and to generate a trigger signal during the synchronization mode after the command storage register has latched a command packet of digital signals;

an evaluation circuit receiving a plurality of command-address signals stored in the command storage register and generating a results signal indicating whether each of the signals has an expected value;

a phase selector circuit operable in a storage mode to sequentially develop a plurality of phase command signals on an output and store corresponding results signals sequentially received on an input, and operable in an analysis mode to develop on the output a final phase command signal from the stored results signals; and a control circuit coupled to the synchronization control circuit, command packet storage register, evaluation circuit, and phase selector circuit operable when the calibration signal is active to develop a plurality of control signals to control synchronization of the internal command clock signal responsive to the trigger, latched flag, and results signals.

32. The synchronization circuit of claim 31 wherein the command shift register comprises a plurality of respective shift register circuits, each shift register circuit having an input coupled to a corresponding line of the command-address bus and applying m×n outputs to the storage register where m equals the number of shift register circuits and n equals the number of stages of each shift register circuit.

33. The synchronization circuit of claim 32 wherein m equals 10 and n equals 2.

34. The synchronization circuit of claim 31 wherein the synchronization control circuit comprises:

a memory circuit including set and reset inputs, and activating the calibration signal on an output responsive to the set input going active, and deactivating the calibration signal responsive to the reset input going active;

a first detector circuit having first and second inputs coupled to receive respective first and second latched flag signals from corresponding outputs of the synchronization control circuit, and a third input, the first detector circuit activating an output when either the flag signals both have the same binary value or a signal applied on the third input goes active;

a second detector circuit having a first input coupled to receive the first latched flag signal, a second input coupled to receive the calibration signal, and an output coupled to the third input of the first detector circuit, the second detector circuit activating a signal on its output when the calibration is active and the first latched flag signal has a predetermined binary value;

a counter circuit having a reset input and a clock terminal adapted to receive a clock signal derived from the internal command clock signal, the counter circuit outputting a count developed in responsive to the clock signal and resetting the count to an initial value when the reset signal goes active; and a reset circuit coupled to the counter circuit and having an output coupled to the reset input of the memory circuit, the reset circuit activating the reset input when the count has a predetermined value.

35. The synchronization circuit of claim 34 wherein the counter circuit decrements a four bit count responsive to the internal command clock signal and the reset circuit activates the reset input when the four bit count equals its minimum value.

36. The synchronization circuit of claim 31 wherein the command packet storage register comprises:

a first storage register latching a first group of digital signals output from the command shift register responsive to a first clock signal;

a first clocking circuit coupled to the first storage register, the first clocking circuit developing the first clock signal in response to a first latched flag signal from the synchronization control circuit and a clock signal derived from the internal command clock signal when the calibration signal is inactive, and developing the first clock signal in response to a synchronization clock signal and the clock signal derived from the internal command clock signal when the calibration signal is active;

a second storage register latching a second group of digital signals output from the command shift register responsive to a second clock signal;

a third storage register latching a group of latched flag signals output from the synchronization control circuit responsive to the second clock signal;

a second clocking circuit coupled to the second and third storage registers, the second clocking circuit developing the second clock signal in response to a second latched flag signal from the synchronization control circuit and a clock signal derived from the internal command clock signal when the calibration signal is inactive, and developing the second clock signal in response to the synchronization clock signal and the clock signal derived from the internal command clock signal when the calibration signal is active;

a synchronization clock generation circuit coupled to the first and second clocking circuits that generates the synchronization clock signal responsive to a clock signal derived from the internal command clock signal; and a pulse generation circuit coupled to the second clocking circuit, the pulse generation circuit generating a trigger pulse on an output in response to the second clock signal.

37. A packetized dynamic random access memory, comprising:

a plurality of clock generator circuits, each clock generator circuit controlling the phase of a respective internal clock signal relative to a corresponding external clock signal responsive to a respective phase command signal;

at least one array of memory cells adapted to store data at a location determined by a row address and a column address;

a row address circuit adapted to receive and decode the row address, and select a row of memory cells corresponding to the row address responsive to a first set of command signals;

a column address circuit adapted to receive or apply data to one of the memory cells in the selected row corresponding to the column address responsive to a second set of command signals;

a data path circuit adapted to couple data between an external terminal and the column address circuit responsive to a third set of command signals, and having a latch adapted to receive a selected one of the internal clock signals from corresponding clock generators, and latching data packets applied on the data bus responsive to the selected clock signal;

a command buffer receiving command packets and initialization packets having a predetermined value, the command buffer including a latch storing each of the received packets, responsive to a transition of the internal clock signal, the command buffer further generating a respective command words and initialization words corresponding to each received command packet and initialization packet, respectively; and a synchronization circuit that adaptively adjusts the phases of the internal clock signals, comprising, a plurality of clock control circuits, each clock control circuit controlling the phase of a respective internal clock signal relative to a corresponding external clock signal responsive to a respective phase command signal;

a plurality of shift registers, each shift register latching digital signals applied on respective external terminals and shifting the latched digital signals through successive stages responsive to a corresponding internal clock signal;

a synchronization control circuit coupled to an associated shift register and to a digital control signal terminal, the synchronization control circuit latching a plurality of digital control signals sequentially applied on the external control terminal responsive to the internal clock signal applied to the associated shift register and providing the latched digital control signals on respective outputs, the synchronization control circuit also activating a calibration signal when the latched digital control signals have a predetermined characteristic;

a plurality of storage registers, each storage register coupled to an associated shift register and sequentially storing digital signals from the shift register, and the one storage register coupled to the shift register associated with the synchronization control circuit operable in a normal mode when the calibration signal is inactive to sequentially store digital signals responsive to respective digital control signals from predetermined stages of the synchronization control circuit, and operable in a synchronization mode when the calibration signal is active to sequentially store digital signals from the shift register responsive to a signal derived from the internal clock signal applied to the shift register and to generate a trigger signal during the synchronization mode after the storage circuit has latched a packet of digital signals;

a plurality of evaluation circuits coupled to respective storage registers, each evaluation circuit receiving a plurality of digital signals sequentially stored in the corresponding storage register and generating a results signal indicating whether each of the digital signals has an expected value when a corresponding clock domain signal is active;

a phase selector circuit operable in a storage mode to sequentially develop a plurality of phase command signals on an output and store corresponding results signals sequentially received on an input, and operable in an analysis mode to develop on the output a final phase command signal from the stored results signals;

a plurality of storage latches coupled to the output of the phase selector circuit and storing the final phase command signal responsive to a corresponding clock domain signal;

a clock-domain control circuit developing a plurality of clock domain signals to determine which of the internal clock signals is being synchronized, and operable when the calibration signal goes inactive before all internal clock signals have been synchronized to retain existing final phase command signals in the corresponding storage latches, and to thereafter, when the calibration signal again goes active, develop clock domain signals to synchronize only those clock domains not synchronized during the previous active cycle of the calibration signal; and an initialization sequencer that applies a plurality of control signals to the synchronization control circuit, storage registers, and evaluation circuits to control synchronization of the internal the internal clock signals when the calibration signal is active and in response to the trigger signal, latched digital control signals, and results signals.

38. The memory device of claim 37 wherein the synchronization control circuit comprises:

a memory circuit including set and reset inputs, and activating the calibration signal on an output responsive to the set input going active, and deactivating the calibration signal responsive to the reset input going active;

a first detector circuit having first and second inputs coupled to receive respective first and second latched flag signals from corresponding outputs of the synchronization control circuit, and a third input, the first detector circuit activating an output when either the flag signals both have the same binary value or a signal applied on the third input goes active;

a second detector circuit having a first input coupled to receive the first latched flag signal, a second input coupled to receive the calibration signal, and an output coupled to the third input of the first detector circuit, the second detector circuit activating a signal on its output when the calibration is active and the first latched flag signal has a predetermined binary value;

a counter circuit having a reset input and a clock terminal adapted to receive a clock signal derived from the internal command clock signal, the counter circuit outputting a count developed in responsive to the clock signal and resetting the count to an initial value when the reset signal goes active; and a reset circuit coupled to the counter circuit and having an output coupled to the reset input of the memory circuit, the reset circuit activating the reset input when the count has a predetermined value.

39. The memory device of claim 38 wherein the counter circuit decrements a four bit count responsive to the internal command clock signal and the reset circuit activates the reset input when the four bit count equals its minimum value.

40. The memory device of claim 38 wherein the synchronization control circuit activates the calibration signal upon detecting two successive high values of the digital control signal.

41. The memory device of claim 38 wherein the plurality of clock control circuits includes three clock control circuits developing respective command, first data clock, and second data clock signals responsive to external command clock, first data clock, and second data clock signals, respectively.

42. The memory device of claim 38 wherein each of the evaluation circuits compares each of the received digital signals to a predetermined value, and the results signal indicates whether each of the digital signals has the corresponding predetermined value.

43. The memory device of claim 37 wherein the one storage register coupled to the shift register associated with the synchronization control circuit comprises:

a first storage register latching a first group of digital signals output from the command shift register responsive to a first clock signal;

a first clocking circuit coupled to the first storage register, the first clocking circuit developing the first clock signal in response to a first latched flag signal from the synchronization control circuit and a clock signal derived from the internal command clock signal when the calibration signal is inactive, and developing the first clock signal in response to a synchronization clock signal and the clock signal derived from the internal command clock signal when the calibration signal is active;

a second storage register latching a second group of digital signals output from the command shift register responsive to a second clock signal;

a third storage register latching a group of latched flag signals output from the synchronization control circuit responsive to the second clock signal;

a second clocking circuit coupled to the second and third storage registers, the second clocking circuit developing the second clock signal in response to a second latched flag signal from the synchronization control circuit and a clock signal derived from the internal command clock signal when the calibration signal is inactive, and developing the second clock signal in response to the synchronization clock signal and the clock signal derived from the internal command clock signal when the calibration signal is active;

a synchronization clock generation circuit coupled to the first and second clocking circuits that generates the synchronization clock signal responsive to a clock signal derived from the internal command clock signal; and a pulse generation circuit coupled to the second clocking circuit, the pulse generation circuit generating a trigger pulse on an output in response to the second clock signal.

44. The memory device of claim 37 wherein the initialization sequencer comprises:

an initialization strobe generator having a clocking terminal adapted to receive either the trigger signal or a load signal and a terminal adapted to receive a phase signal, and generating a plurality of control signals responsive to the applied one of the trigger and load signals when the phase signal is active;

a phase compare counter including terminals adapted to receive the calibration signal and coupled to the initialization strobe generator, the phase compare counter developing a phase select count responsive to the control signals when the phase signal and calibration signals are active, and resetting the phase select count when either the phase or calibration signal goes inactive, and activating a count reset signal when the phase select count has a predetermined value;

a pattern generator clocking circuit coupled to the phase compare counter and the initialization strobe generator, the pattern generator clocking circuit developing a data clock signal responsive to the control signals and activating a seed signal responsive to the count reset signal going active and deactivating the seed signal responsive to the seed clock signal;

a multiplexer coupling one of two latched data patterns to an output responsive to one of the clock domain signals when the calibration signal is active;

a pattern generator coupled to the pattern generator clocking circuit and the output of the multiplexer, the pattern generator loading the latched data pattern from the multiplexer when the seed signal is active and thereafter when the seed signal is inactive generating a predetermined sequence of expect digital signals responsive to the data clock signal when the loaded pattern has a predetermined value; and a compare control circuit coupled to the phase compare counter and initialization strobe generator and adapted to receive results signals from the evaluation circuits, the compare control circuit activating a latch results signal, deactivating the phase signal, and deactivating an enable calibration signal applied to reset the active one of the evaluation circuits when either the count has a predetermined value or the applied results signal from the active evaluation circuit goes inactive.

45. An integrated circuit adapted to receive a plurality of input signals and generate a plurality of output signals on respective, externally accessible terminals, comprising:

a plurality of clock generator circuits, each clock generator circuit controlling the phase of a respective internal clock signal relative to a corresponding external clock signal responsive to a respective phase command signal;

a circuit adapted to receive a plurality of input signals applied to respective other of the terminals and to generate a plurality of output signals on respective other of the terminals;

a plurality of shift registers, each shift register latching digital signals applied on respective external terminals and shifting the latched digital signals through successive stages responsive to a corresponding internal clock signal; and a synchronization circuit that adaptively adjusts the phases of the internal clock signals, comprising, a synchronization control circuit coupled to an associated shift register and to a digital control signal terminal, the synchronization control circuit latching a plurality of digital control signals sequentially applied on the external control terminal responsive to the internal clock signal applied to the associated shift register and providing the latched digital control signals on respective outputs, the synchronization control circuit also activating a calibration signal when the latched digital control signals have a predetermined characteristic;

a plurality of storage registers, each storage register coupled to an associated shift register and sequentially storing digital signals from the shift register, and the one storage register coupled to the shift register associated with the synchronization control circuit operable in a normal mode when the calibration signal is inactive to sequentially store digital signals responsive to respective digital control signals from predetermined stages of the synchronization control circuit, and operable in a synchronization mode when the calibration signal is active to sequentially store digital signals from the shift register responsive to a signal derived from the internal clock signal applied to the shift register and to generate a trigger signal during the synchronization mode after the storage circuit has latched a packet of digital signals;

a plurality of evaluation circuits coupled to respective storage registers, each evaluation circuit receiving a plurality of digital signals sequentially stored in the corresponding storage register and generating a results signal indicating whether each of the digital signals has an expected value when a corresponding clock domain signal is active;

a phase selector circuit operable in a storage mode to sequentially develop a plurality of phase command signals on an output and store corresponding results signals sequentially received on an input, and operable in an analysis mode to develop on the output a final phase command signal from the stored results signals;

a plurality of storage latches coupled to the output of the phase selector circuit and storing the final phase command signal responsive to a corresponding clock domain signal;

a clock-domain control circuit developing a plurality of clock domain signals to determine which of the internal clock signals is being synchronized, and operable when the calibration signal goes inactive before all internal clock signals have been synchronized to retain existing final phase command signals in the corresponding storage latches, and to thereafter, when the calibration signal again goes active, develop clock domain signals to synchronize only those clock domains not synchronized during the previous active cycle of the calibration signal; and an initialization sequencer that applies a plurality of control signals to the synchronization control circuit, storage registers, and evaluation circuits to control synchronization of the internal the internal clock signals when the calibration signal is active and in response to the trigger signal, latched digital control signals, and results signals.

46. The memory device of claim 45 wherein the synchronization control circuit comprises:

a memory circuit including set and reset inputs, and activating the calibration signal on an output responsive to the set input going active, and deactivating the calibration signal responsive to the reset input going active;

a first detector circuit having first and second inputs coupled to receive respective first and second latched flag signals from corresponding outputs of the synchronization control circuit, and a third input, the first detector circuit activating an output when either the flag signals both have the same binary value or a signal applied on the third input goes active;

a second detector circuit having a first input coupled to receive the first latched flag signal, a second input coupled to receive the calibration signal, and an output coupled to the third input of the first detector circuit, the second detector circuit activating a signal on its output when the calibration is active and the first latched flag signal has a predetermined binary value;

a counter circuit having a reset input and a clock terminal adapted to receive a clock signal derived from the internal command clock signal, the counter circuit outputting a count developed in responsive to the clock signal and resetting the count to an initial value when the reset signal goes active; and a reset circuit coupled to the counter circuit and having an output coupled to the reset input of the memory circuit, the reset circuit activating the reset input when the count has a predetermined value.

47. The memory device of claim 46 wherein the counter circuit decrements a four bit count responsive to the internal command clock signal and the reset circuit activates the reset input when the four bit count equals its minimum value.

48. The integrated circuit of claim 45 wherein the one storage register coupled to the shift register associated with the synchronization control circuit comprises:

a first storage register latching a first group of digital signals output from the command shift register responsive to a first clock signal;

a first clocking circuit coupled to the first storage register, the first clocking circuit developing the first clock signal in response to a first latched flag signal from the synchronization control circuit and a clock signal derived from the internal command clock signal when the calibration signal is inactive, and developing the first clock signal in response to a synchronization clock signal and the clock signal derived from the internal command clock signal when the calibration signal is active;

a second storage register latching a second group of digital signals, output from the command shift register responsive to a second clock signal;

a third storage register latching a group of latched flag signals output from the synchronization control circuit responsive to the second clock signal;

a second clocking circuit coupled to the second and third storage registers, the second clocking circuit developing the second clock signal in response to a second latched flag signal from the synchronization control circuit and a clock signal derived from the internal command clock signal when the calibration signal is inactive, and developing the second clock signal in response to the synchronization clock signal and the clock signal derived from the internal command clock signal when the calibration signal is active;

a synchronization clock generation circuit coupled to the first and second clocking circuits that generates the synchronization clock signal responsive to a clock signal derived from the internal command clock signal; and a pulse generation circuit coupled to the second clocking circuit, the pulse generation circuit generating a trigger pulse on an output in response to the second clock signal.

49. The integrated circuit of claim 45 wherein the initialization sequencer comprises:

an initialization strobe generator having a clocking terminal adapted to receive either the trigger signal or a load signal and a terminal adapted to receive a phase signal, and generating a plurality of control signals responsive to the applied one of the trigger and load signals when the phase signal is active;

a phase compare counter including terminals adapted to receive the calibration signal and coupled to the initialization strobe generator, the phase compare counter developing a phase select count responsive to the control signals when the phase signal and calibration signals are active, and resetting the phase select count when either the phase or calibration signal goes inactive, and activating a count reset signal when the phase select count has a predetermined value;

a pattern generator clocking circuit coupled to the phase compare counter and the initialization strobe generator, the pattern generator clocking circuit developing a data clock signal responsive to the control signals and activating a seed signal responsive to the count reset signal going active and deactivating the seed signal responsive to the seed clock signal;

a multiplexer coupling one of two latched data patterns to an output responsive to one of the clock domain signals when the calibration signal is active;

a pattern generator coupled to the pattern generator clocking circuit and the output of the multiplexer, the pattern generator loading the latched data pattern from the multiplexer when the seed signal is active and thereafter when the seed signal is inactive generating a predetermined sequence of expect digital signals responsive to the data clock signal when the loaded pattern has a predetermined value; and a compare control circuit coupled to the phase compare counter and initialization strobe generator and adapted to receive results signals from the evaluation circuits, the compare control circuit activating a latch results signal, deactivating the phase signal, and deactivating an enable calibration signal applied to reset the active one of the evaluation circuits when either the count has a predetermined value or the applied results signal from the active evaluation circuit goes inactive.

50. The integrated circuit of claim 45 wherein the synchronization control circuit activates the calibration signal upon detecting two successive high values of the digital control signal.

51. A computer system, comprising:

a processor having a processor bus;

an input device coupled to the processor through the processor bus adapted to allow data to be entered into the computer system;

an output device coupled to the processor through the processor bus adapted-to allow data to be output from the computer system; and a dynamic random access memory coupled to the processor bus adapted to allow data to be stored, adapted to receive a plurality of input signals and generate a plurality of output signals on respective, externally accessible terminals, the dynamic random access memory, comprising, a plurality of clock generator circuits, each clock generator circuit controlling the phase of a respective internal clock signal relative to a corresponding external clock signal responsive to a respective phase command signal;

at least one array of memory cells adapted to store data at a location determined by a row address and a column address;

a row address circuit adapted to receive and decode the row address, and select a row of memory cells corresponding to the row address responsive to a first set of command signals;

a column address circuit adapted to receive or apply data to one of the memory cells in the selected row corresponding to the column address responsive to a second set of command signals;

a data path circuit adapted to couple data between an external terminal and the column address circuit responsive to a third set of command signals, and having a latch adapted to receive a selected one of the internal clock signals from corresponding clock generators, and latching data packets applied on the data bus responsive to the selected clock signal;

a command buffer receiving command packets and initialization packets having a predetermined value, the command buffer including a latch storing each of the received packets responsive to a transition of the internal clock signal, the command buffer further generating a respective command words and initialization words corresponding to each received command packet and initialization packet, respectively; and a synchronization circuit that adaptively adjusts the phases of the internal clock signals, comprising, a plurality of clock control circuits, each clock control circuit controlling the phase of a respective internal clock signal relative to a corresponding external clock signal responsive to a respective phase command signal;

a plurality of shift registers, each shift register latching digital signals applied on respective external terminals and shifting the latched digital signals through successive stages responsive to a corresponding internal clock signal;

a synchronization control circuit coupled to an associated shift register and to a digital control signal terminal, the synchronization control circuit latching, a plurality of digital control signals sequentially applied on the external control terminal responsive to the internal clock signal applied to the associated shift register and providing the latched digital control signals on respective outputs, the synchronization control circuit also activating a calibration signal when the latched digital control signals have a predetermined characteristic;

a plurality of storage registers, each storage register coupled to an associated shift register and sequentially storing digital signals from the shift register, and the one storage register coupled to the shift register associated with the synchronization control circuit operable in a normal mode when the calibration signal is inactive to sequentially store digital signals responsive to respective digital control signals from predetermined stages of the synchronization control circuit, and operable in a synchronization mode when the calibration signal is active to sequentially store digital signals from the shift register responsive to a signal derived from the internal clock signal applied to the shift register and to generate a trigger signal during the synchronization mode after the storage circuit has latched a packet of digital signals;

a plurality of evaluation circuits coupled to respective storage registers, each evaluation circuit receiving a plurality of digital signals sequentially stored in the corresponding storage register and generating a results signal indicating whether each of the digital signals has an expected value when a corresponding clock domain signal is active;

a phase selector circuit operable in a storage mode to sequentially develop a plurality of phase command signals on an output and store corresponding results signals sequentially received on an input, and operable in an analysis mode to develop on the output a final phase command signal from the stored results signals;

a plurality of storage latches coupled to the output of the phase selector circuit and storing the final phase command signal responsive to a corresponding clock domain signal;

a clock-domain control circuit developing a plurality of clock domain signals to determine which of the internal clock signals is being synchronized, and operable when the calibration signal goes inactive before all internal clock signals have been synchronized to retain existing final phase command signals in the corresponding storage latches, and to thereafter, when the calibration signal again goes active, develop clock domain signals to synchronize only those clock domains not synchronized during the previous active cycle of the calibration signal; and an initialization sequencer that applies a plurality of control signals to the synchronization control circuit, storage registers, and evaluation circuits to control synchronization of the internal the internal clock signals when the calibration signal is active and in response to the trigger signal, latched digital control signals, and results signals.

52. The computer system of claim 51 wherein the synchronization control circuit comprises:

a memory circuit including set and reset inputs, and activating the calibration signal on an output responsive to the set input going active, and deactivating the calibration signal responsive to the reset input going active;

a first detector circuit having first and second inputs coupled to receive respective first and second latched flag signals from corresponding outputs of the synchronization control circuit, and a third input, the first detector circuit activating an output when either the flag signals both have the same binary value or a signal applied on the third input goes active;

a second detector circuit having a first input coupled to receive the first latched flag signal, a second input coupled to receive the calibration signal, and an output coupled to the third input of the first detector circuit, the second detector circuit activating a signal on its output when the calibration is active and the first latched flag signal has a predetermined binary value;

a counter circuit having a reset input and a clock terminal adapted to receive a clock signal derived from the internal command clock signal, the counter circuit outputting a count developed in responsive to the clock signal and resetting the count to an initial value when the reset signal goes active; and a reset circuit coupled to the counter circuit and having an output coupled to the reset input of the memory circuit, the reset circuit activating the reset input when the count has a predetermined value.

53. The computer system of claim 52 wherein the counter circuit decrements a four bit count responsive to the internal command clock signal and the reset circuit activates the reset input when the four bit count equals its minimum value.

54. The computer system of claim 51 wherein the one storage register coupled to the shift register associated with the synchronization control circuit comprises:

- a first storage register latching a first group of digital signals output from the command shift register responsive to a first clock signal;
- a first clocking circuit coupled to the first storage register, the first clocking circuit developing the first clock signal in response to a first latched flag signal from the synchronization control circuit and a clock signal derived from the internal command clock signal when the calibration signal is inactive, and developing the first clock signal in response to a synchronization clock signal and the clock signal derived from the internal command clock signal when the calibration signal is active;
- a second storage register latching a second group of digital signals output from the command shift register responsive to a second clock signal;
- a third storage register latching a group of latched flag signals output from the synchronization control circuit responsive to the second clock signal;
- a second clocking circuit coupled to the second and third storage registers, the second clocking circuit developing the second clock signal in response to a second latched flag signal from the synchronization control circuit and a clock signal derived from the internal command clock signal when the calibration signal is inactive, and developing the second clock signal in response to the synchronization clock signal and the clock signal derived from the internal command clock signal when the calibration signal is active;
- a synchronization clock generation circuit coupled to the first and second clocking circuits that generates the synchronization clock signal responsive to a clock signal derived from the internal command clock signal; and
- a pulse generation circuit coupled to the second clocking circuit, the pulse generation circuit generating a trigger pulse on an output in response to the second clock signal.

55. The computer system of claim 51 wherein the initialization sequencer comprises:

- an initialization strobe generator having a clocking terminal adapted to receive either the trigger signal or a load signal and a terminal adapted to receive a phase signal, and generating a plurality of control signals responsive to the applied one of the trigger and load signals when the phase signal is active;
- a phase compare counter including terminals adapted to receive the calibration signal and coupled to the initialization strobe generator, the phase compare counter developing a phase select count responsive to the control signals when the phase signal and calibration signals are active, and resetting the phase select count when either the phase or calibration signal goes inactive, and activating a count reset signal when the phase select count has a predetermined value;
- a pattern generator clocking circuit coupled to the phase compare counter and the initialization strobe generator, the pattern generator clocking circuit developing a data clock signal responsive to the control signals and activating a seed signal responsive to the count reset signal going active and deactivating the seed signal responsive to the seed clock signal;
- a multiplexer coupling one of two latched data patterns to an output responsive to one of the clock domain signals when the calibration signal is active;
- a pattern generator coupled to the pattern generator clocking circuit and the output of the multiplexer, the pattern generator loading the latched data pattern from the multiplexer when the seed signal is active and thereafter when the seed signal is inactive generating a predetermined sequence of expect digital signals responsive to the data clock signal when the loaded pattern has a predetermined value; and
- a compare control circuit coupled to the phase compare counter and initialization strobe generator and adapted to receive results signals from the evaluation circuits, the Compare control circuit activating a latch results signal, deactivating the phase signal, and deactivating an enable calibration signal applied to reset the active one of the evaluation circuits when either the count has a predetermined value or the applied results signal from the active evaluation circuit goes inactive.

\* \* \* \* \*

UNITED STATES PATENT AND TRADEMARK OFFICE
CERTIFICATE OF CORRECTION

PATENT NO. : 6,279,090 B1
DATED : August 21, 2001
INVENTOR(S) : Troy A. Manning

Page 1 of 1

It is certified that error appears in the above-identified patent and that said Letters Patent is hereby corrected as shown below:

Column 1,
Page 2, reads "5,125,560 6/1992" should read -- 5,128,560 7/1992 --
Page 4, line 4, reads "615" should read -- 625 --

Column 2,
Page 3, lines 29, 46, 50 and 54, reads "β" should read -- μ --

Column 68,
Line 27, reads "previous.active" should read -- previous active --

Signed and Sealed this

Fifth Day of March, 2002

Attest:

JAMES E. ROGAN
*Attesting Officer*   *Director of the United States Patent and Trademark Office*